United States Patent [19]
Taguchi et al.

[11] Patent Number: 5,650,647
[45] Date of Patent: Jul. 22, 1997

[54] DYNAMIC RANDOM ACCESS MEMORY DEVICE AND METHOD OF PRODUCING SAME

[75] Inventors: Masao Taguchi, Sagamihara; Taiji Ema, Kawasaki, both of Japan

[73] Assignee: Fujitsu Limited, Kanagawa, Japan

[21] Appl. No.: 329,056

[22] Filed: Oct. 26, 1994

Related U.S. Application Data

[63] Continuation of Ser. No. 951,362, Sep. 25, 1992, which is a continuation of Ser. No. 672,801, Mar. 21, 1991, which is a division of Ser. No. 561,424, Aug. 1, 1990, Pat. No. 5,021,357, which is a division of Ser. No. 376,470, Jul. 5, 1989, Pat. No. 5,071,783, which is a division of Ser. No. 206,791, Jun. 15, 1988.

[30] Foreign Application Priority Data

| Jun. 17, 1987 | [JP] | Japan | 62-149143 |
| Dec. 3, 1987 | [JP] | Japan | 62-306416 |
| Dec. 10, 1987 | [JP] | Japan | 62-314764 |

[51] Int. Cl.$^6$ .............................. H01L 29/68; H01L 29/78
[52] U.S. Cl. ........................................ 257/308; 257/311
[58] Field of Search ..................... 357/23.6 R; 257/308, 257/309, 306, 307, 311

[56] References Cited

U.S. PATENT DOCUMENTS

| 4,475,118 | 10/1984 | Klein et al. | 257/306 |
| 4,649,406 | 3/1987 | Takemae et al. | 357/23.6 R |
| 4,700,457 | 10/1987 | Matsukawa | 357/23.6 R |
| 4,742,018 | 5/1988 | Kimura et al. | 357/23.6 R |
| 4,855,801 | 8/1989 | Kuesters | 257/306 |

FOREIGN PATENT DOCUMENTS

| 317 199 A2 | 5/1989 | European Pat. Off. |  |
| 55-154762 | 12/1980 | Japan | 257/306 |
| 56-8871 | 1/1981 | Japan | 257/306 |
| 56-58255 | 5/1981 | Japan . |  |
| 56-058254 | 5/1981 | Japan | 257/306 |
| 59-61072 | 4/1984 | Japan | 257/306 |
| 59-104156 | 6/1984 | Japan | 357/23.6 R |
| 59-104161 | 6/1984 | Japan . |  |
| 59-231851 | 12/1984 | Japan | 257/306 |
| 60-9154 | 1/1985 | Japan . |  |
| 60-74470 | 4/1985 | Japan | 257/306 |
| 61-95563 | 5/1986 | Japan . |  |
| 62-48062 | 3/1987 | Japan . |  |
| 62-128168 | 6/1987 | Japan . |  |
| 62-179759 | 8/1987 | Japan . |  |
| 62-286269 | 12/1987 | Japan . |  |
| 64-10948 | 2/1989 | Japan . |  |

OTHER PUBLICATIONS

International Electronic Devices Meeting "Stacked Capacitor Cells for High–density dynamic RAMs", Dec. 11–14, 1988.

Article published in Nikkei Microdevices—Aug. 1994, pp. 30–39 (foreign article).

*Primary Examiner*—Donald Monin
*Attorney, Agent, or Firm*—Nikaido Marmelstein Murray & Oram LLP

[57] ABSTRACT

A dynamic random access memory device includes a storage capacitor having a plurality of stacked conductive films which form a storage electrode. A gap is formed between elevationally adjacent conductive films so as to surround the storage electrode. A gap is also formed between an insulating film which covers a gate electrode for insulation and a lowermost film of the storage electrode. Connection between the adjacent films may be established so that an uppermost film elevationally extends so as to make contact with a drain region. Also, connection can be established so that an upper film is mounted directly on an lower film. An end portion of the film may be thicker than the other portion thereof. The stacked film structure may be produced by alternatively forming a film made of a material different from the insulating film covering the gate electrode, and a conductive film.

10 Claims, 58 Drawing Sheets

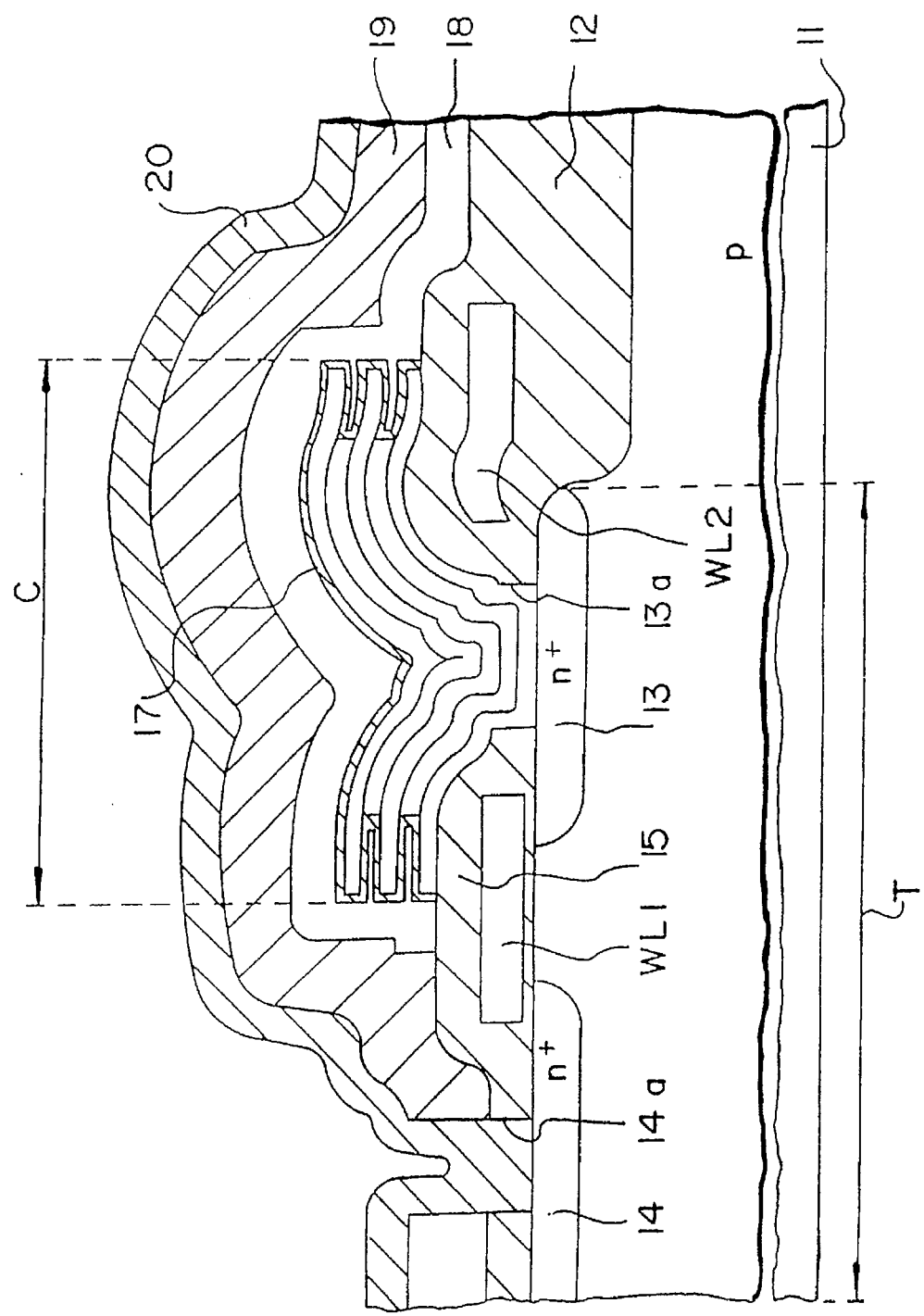

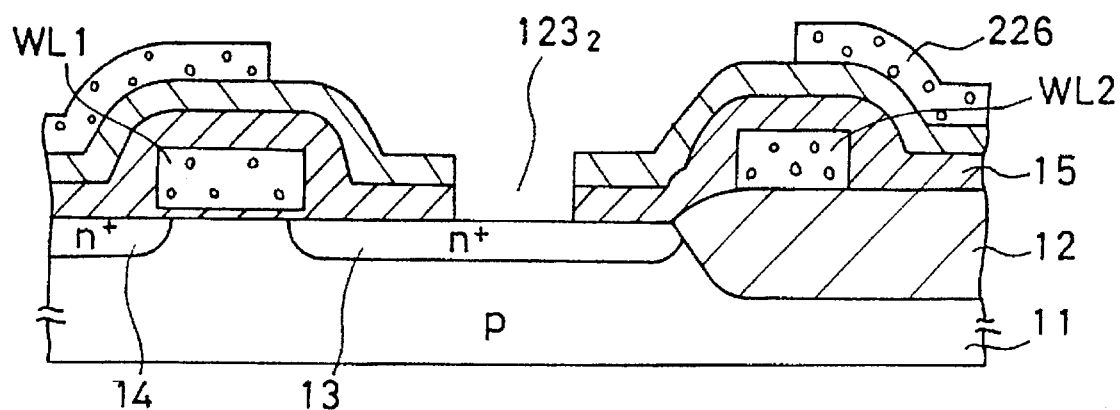

DYNAMIC RANDOM ACCESS MEMORY DEVICE AND METHOD OF PRODUCING SAME

This application is a continuation application Ser. No. 07/951,362, filed on Sep. 25, 1992 which is a continuation application Ser. No. 672,801 filed on Mar. 21, 1991 which is a divisional application of prior application Ser. No. 561,424 filed on Aug. 1, 1990 now U.S. Pat. No. 5,021,357 which is a divisional of application Ser. No. 376,470 filed on Jul. 5, 1989 now U.S. Pat. No. 5,071,783 which is a divisional of Ser. No. 206,791 filed on Jun. 15, 1988.

BACKGROUND OF THE INVENTION

The present invention generally relates to a dynamic random access memory and a method of producing the same, and in particular to a structure of a cell composed of a transfer transistor and a charge storage capacitor and a method of forming the cell structure.

Currently, samples of dynamic random access memory devices (hereafter simply referred to as DRAM device) of 16 Mbits are available. As the integration density is increased, a size of the cell on a plane must be reduced. Generally, a reduction in the size of the cell leads to a reduction in capacitance of the charge storage capacity. Additionally, as the capacitance is reduced, a soft error arising from the incidence of an α-ray is increased. For this reason, it is desired to decrease the size of the charge storage capacitor on the plane without reducing the capacitance thereof.

For this requirement, stacked capacitor type DRAM devices have been proposed and realized. In a conventional stacked capacitor type DRAM device, one of a pair of electrodes of the storage capacitor is formed so as to have a three dimensional structure. The three dimensional structure of the electrode results in a 30–40% increase in the capacitance of the storage capacitor, compared with a storage capacitor of two dimensional structure having the same size on the plane. However, an increase in the capacitance provided by the conventional three-dimensional electrode is not enough to fabricate a highly integrated DRAM device having a integration density of 16 Mbits or more.

It is also known that in order to increase the capacitance of the capacitor, a dielectric film included in the storage capacitor is made of a material of a high dielectric constant such as tantalum oxide ($Ta_2O_5$). However, the use of $Ta_2O_5$ causes an increased leak current passing through the insulating film, compared to a dielectric film made of silicon dioxide ($SiO_2$) or silicon nitride ($Si_3N_4$).

Trench type DRAM devices have also been proposed and realized in which a number of trenches are formed on a surface of a semiconductor substrate, and storage capacitors are formed into the trenches. For a 16 Mbit-class DRAM device, it is difficult to separate neighboring storage capacitors from each other by a distance of less than approximately 0.5 [μm]. Such an arrangement of the neighboring storage capacitors may cause an interference which occurs. In the interference, a charge stored in one of the neighboring storage capacitors is transferred to the other capacitor when a voltage is applied to the other capacitor, and therefore information is destroyed.

Yet another conventional DRAM device has been proposed in tile Japanese Laid-Open Patent Publication No.9154/1985. The publication discloses a storage capacitor having a multilayer structure, the elevational cross section of which has a comb shape.

However, the prior art disclosed in the above publication has the following disadvantages. Firstly, the transfer transistor and the charge storage capacitor are arranged side by side on the substrate. Therefore, a high integration density cannot be obtained. Secondly, a considerably increased capacitance of the storage capacitor of the publication cannot be obtained, because the storage capacitor has the comb-shaped cross section, that is, the storage electrode does not have the projections formed on all-the side surfaces thereof.

SUMMARY OF THE INVENTION

Accordingly, a general object of the present invention is to provide a dynamic random access memory device and a method of producing the same in which the disadvantages of the conventional arts have been eliminated.

A more specific object of the present invention is to provide a dynamic random access memory device and a method of the producing the same in which a further increased integration density can be obtained.

Another object of the present invention is to provide a dynamic random access memory device and a method of producing the same in which an extremely increased capacitance of a charge storage capacitor can be obtained without decreasing the integration density.

Yet another object of the present invention is to provide a dynamic random access memory device is which a dynamic random access memory device can be produced by a simplified process.

According to one aspect of the present invention, the DRAM device has the following essential structural elements. A storage electrode which is formed by a conductive material is connected to either one of the impurity diffused regions through an opening formed in the insulating film, and extends above the field insulating film and the gate electrode. The storage electrode is separated from the insulating film by a gap. A dielectric film is formed so as to surround an exposed surface of the storage capacitor. An opposed electrode made of a conductive material is formed so as to surround the storage capacitor around which the dielectric film is formed. The gap is filled with the opposed electrode. It is to be noted that the opposed electrode is formed so as to surround the storage electrode around which the dielectric film is formed.

According to another aspect of the present invention, the DRAM device has the following essential structural elements. A storage electrode made of a conductive material is connected to either one of the impurity diffused regions through an opening formed in the insulating film, and has a plurality of films which are elevationally stacked so that a first gap is formed between adjacent films and which extend has a portion which above the field insulating film and the gate electrode. A lowermost film out of the stacked films is separated from the insulating film by a second gap. An uppermost film out of the stacked films is integrally formed and extends elevationally so as to be connected directly to said one impurity diffused region. The films other than the uppermost film are connected to the elevationally extending portion of the uppermost film. A dielectric film is formed so as to surround an exposed surface of the storage electrode. An opposed electrode made of a conductive material is formed so as to surround the storage electrode around which the dielectric film is formed. The first and second gaps are filled with the opposed electrode. With the above structure, the capacitance of the storage capacitor can be increased. The lowermost film may be formed directly on the insulating film.

According to still another aspect of the present invention, the DRAM device comprises the following essential structural elements. A storage electrode made of a conductive material is connected to either one of the impurity diffused regions through an opening formed in the insulating film, and has a plurality of films which are elevationally stacked so that a first gap is formed between adjacent films and which extend above the field insulating film and the gate electrode. A lowermost film out of the stacked films is separated from the insulating film by a second gap. An upper film out of elevationally adjacent films in the stacked films is mounted directly on the lower film out of the adjacent films above said one impurity diffused region. A dielectric film is formed so as to surround an exposed surface of the storage electrode. An opposed electrode made of a conductive material is formed so as to surround the storage electrode around which the dielectric film is formed. The first and second gaps are filled with the opposed electrode. The lowermost film may be formed directly on the insulating film.

According to a still further aspect of the present invention, the lowermost or lower film used in each of the above structures may be formed so as to be thicker than other portion thereof to thereby obtain a further increased capacitance. Thereby, each of the stacked films has convex portions and recess portions which have a function of increasing the capacitance.

According to still further aspect of the present invention, the storage capacitor is produced by alternately forming a first conductive film and a second conductive film on a substrate. Preferably, this step is carried out by plasma-assisted chemical vapor deposition. The first conductive film is made of a material different from that of the second conductive material. Then the stacked first and second conductive films are subjected to a patterning process, and are then subjected to selective etching. Thereafter a dielectric film is formed around the patterned first and second conductive films. Then a third conductive film is deposited so as to surround the first and second conductive films.

According to still another object of the present invention, the storage capacitor is produced by forming a second insulating film on a first film which covers a gate electrode for insulation, and then forming a conductive film on the second film. It is to be noted that the second film is made of a material different from the first film. Then, an opening is formed in the first and second films. After subjecting the conductive film to a patterning process, the second film is selectively removed by isotropic etching. Then a dielectric film and an opposed electrode are formed. The formation of the second film and the conductive film may be repetitively performed. In this case, a lowermost conductive film of a stacked films may be deposited directly on the first film. The connection between elevationally adjacent conductive films can be formed by forming an opening in the second film every time the conductive film and the second film are formed. Alternatively, an opening may be formed in the stacked conductive films which are obtained by repetitively performing deposition of the second film and the conductive film.

Other objects, features and advantages of the present invention will become apparent from the following detailed description when read in conjunction with the accompanying drawings.

BRIEF DESCRIPTION THE DRAWINGS

FIG. 4A through 4E are elevational cross sectional views for showing steps of a process for producing a first embodiment of the present invention;

FIGS. 17A through 17I are elevational cross sectional views showing steps of a process for producing the fifth embodiment of FIG. 16A;

Figure 21A:
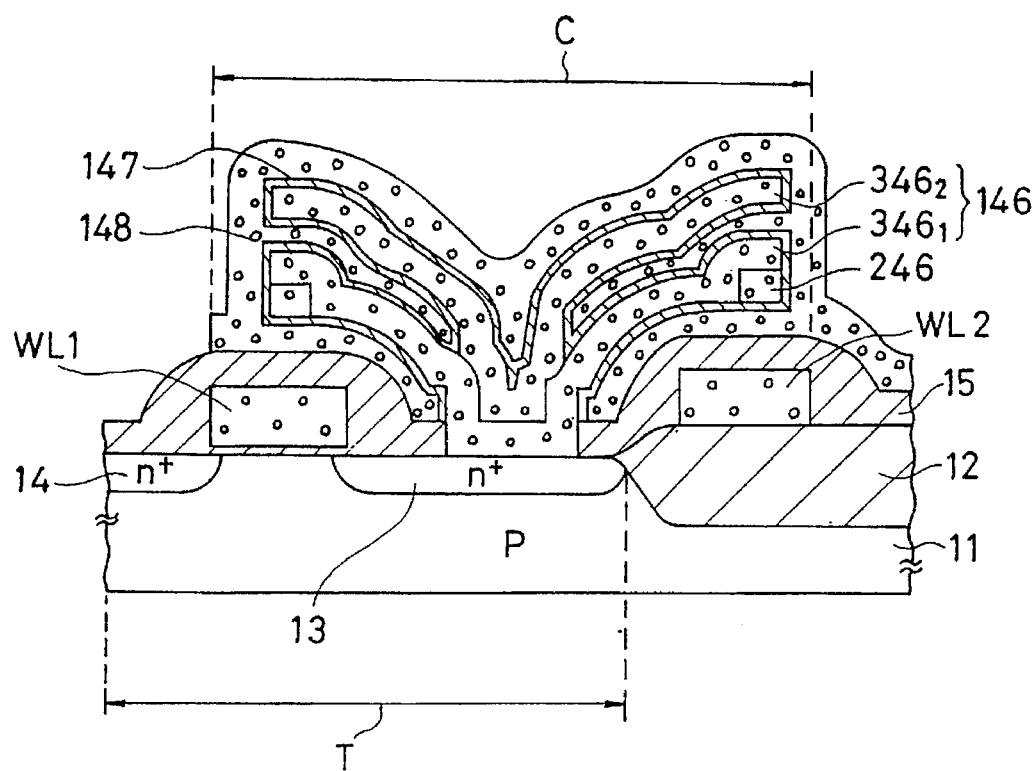
FIG. 21A is an elevational cross sectional view of a seventh embodiment of the present invention.
Figure 21B:
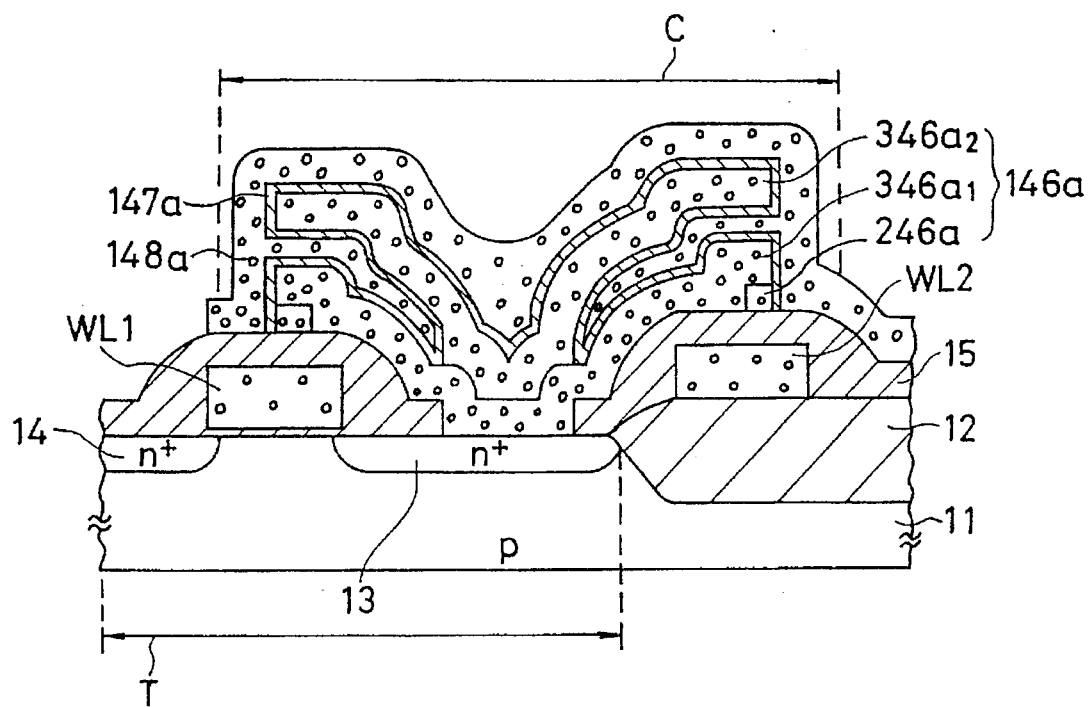
Figure 24:
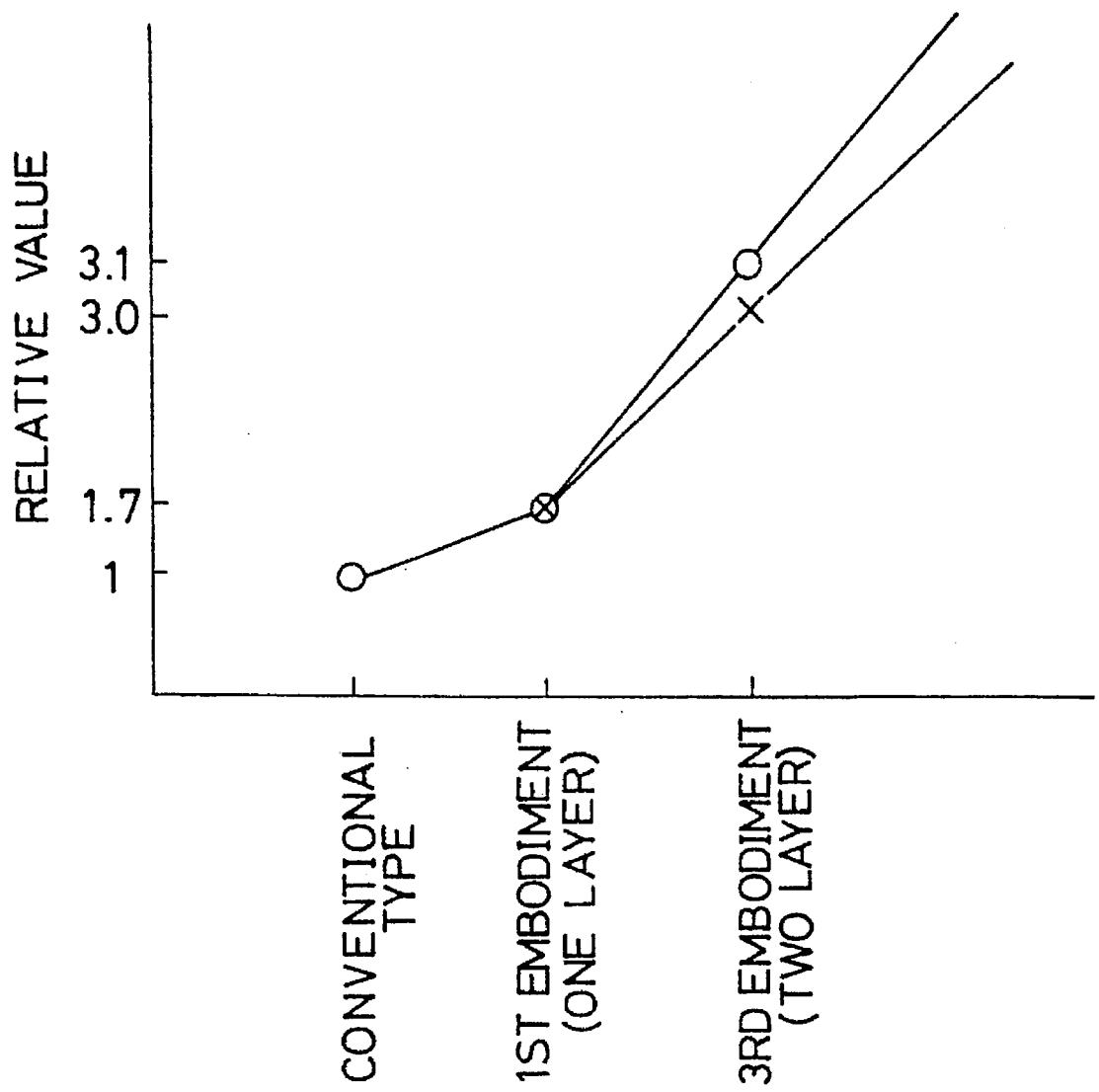
Figure 25A:
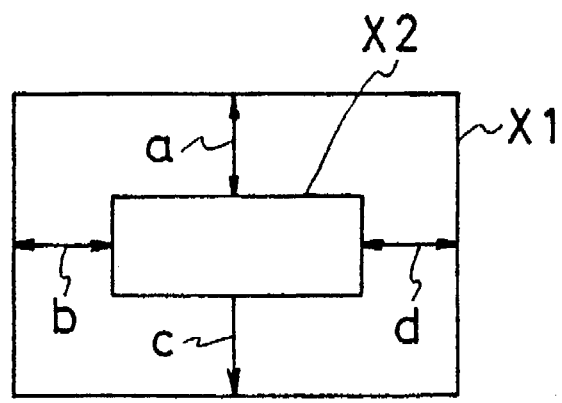
Figure 25B:
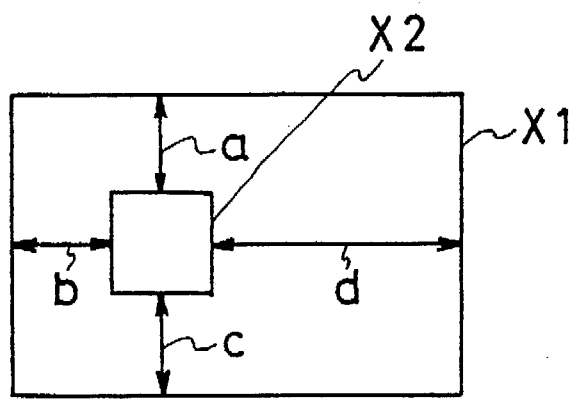
Figure 26:
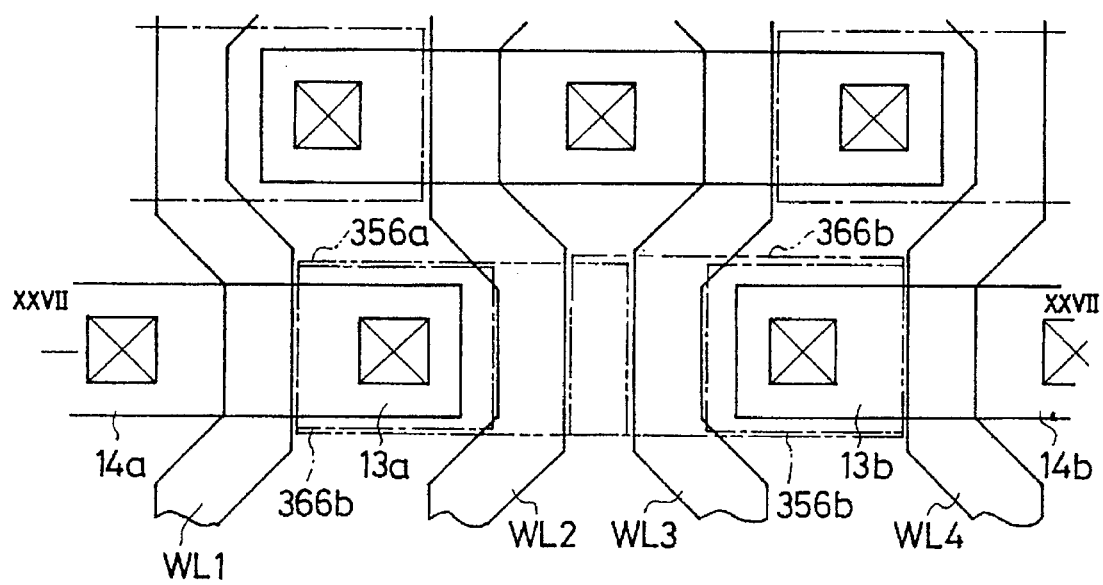
Figure 27:
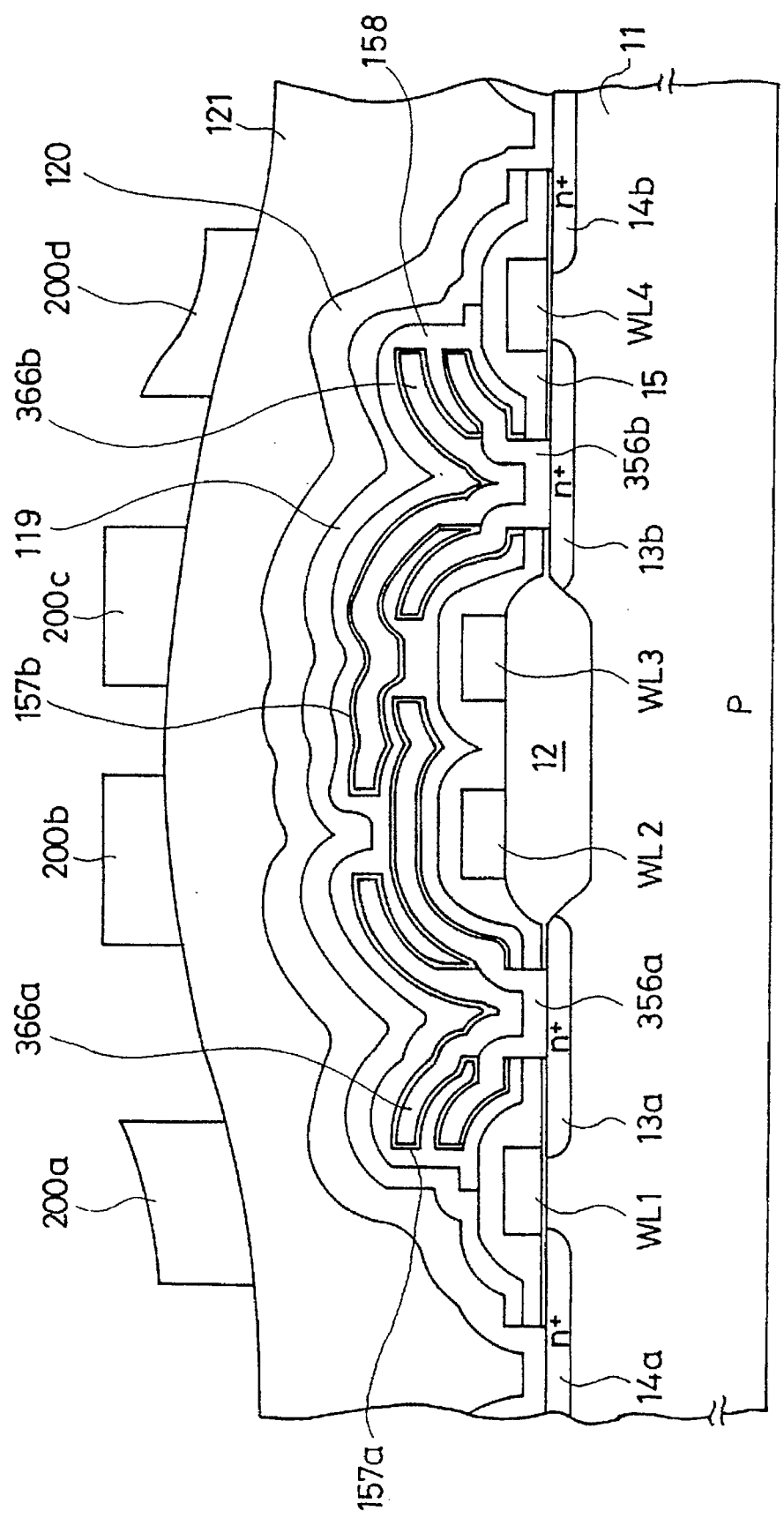

FIG. 21B an elevational cross sectional view of a variation shown in FIG. 21A;

FIGS. 22A through 22J are elevational cross sectional views showing steps of a process for producing the seventh embodiment of FIG. 21A;

FIGS. 23A through 23I are elevational cross sectional views showing steps of a process for producing the variation of the seventh embodiment;

FIG. 24 is a graph for explaining advantageous effects of the present invention, compared with the conventional DRAM device;

FIG. 25A and 25B are views for explaining specific advantages of the embodiment other than the first embodiment;

FIG. 26 is a plan view of an eighth embodiment of the present invention;

FIG. 27 is an elevational cross sectional view of the eighth embodiment; and

FIGS. 28A through 28G are elevational cross sectional views showing steps of a process for producing the eighth embodiment shown in FIGS. 26 and 27.

DETAILED DESCRIPTION

Figure 1:
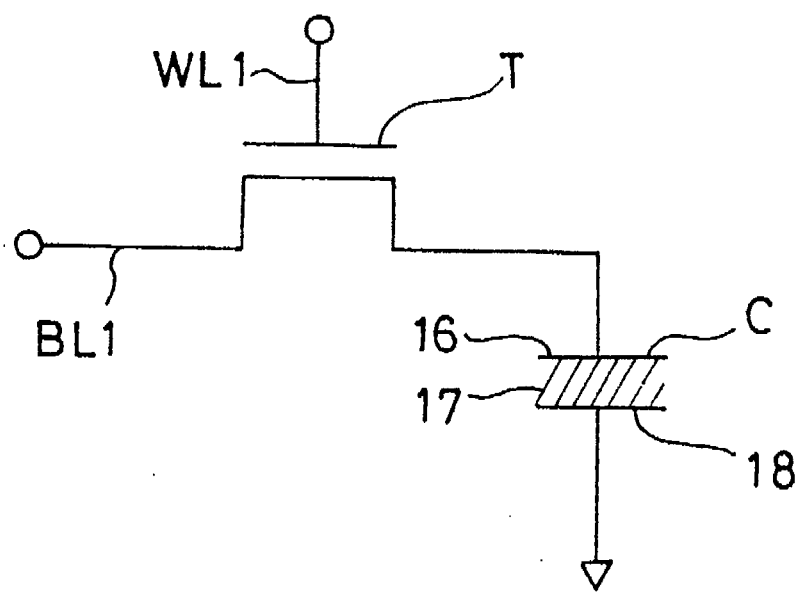
FIG. 1 is a circuit diagram of a DRAM cell.

Referring to FIG. 1, a DRAM cell includes a transfer transistor T and a charge (information) storage capacitor C. The transfer transistor T is used for transferring a charge (information). The transfer transistor T is constituted by an $n^+$-type metal insulator semiconductor transistor FET (field effect transistor) or a metal oxide semiconductor transistor. The storage capacitor C is used for storing a charge which can be transferred by the transfer transistor T. A storage electrode 16 of the storage capacitor C is connected to a drain or source of the transfer transistor T. There is provided a dielectric film interposed between the storage electrode 16 and an opposed electrode 18. A bit line BL1 and a word line WL1 is connected to a source and a gate of the transfer transistor T, respectively.

Figure 2:
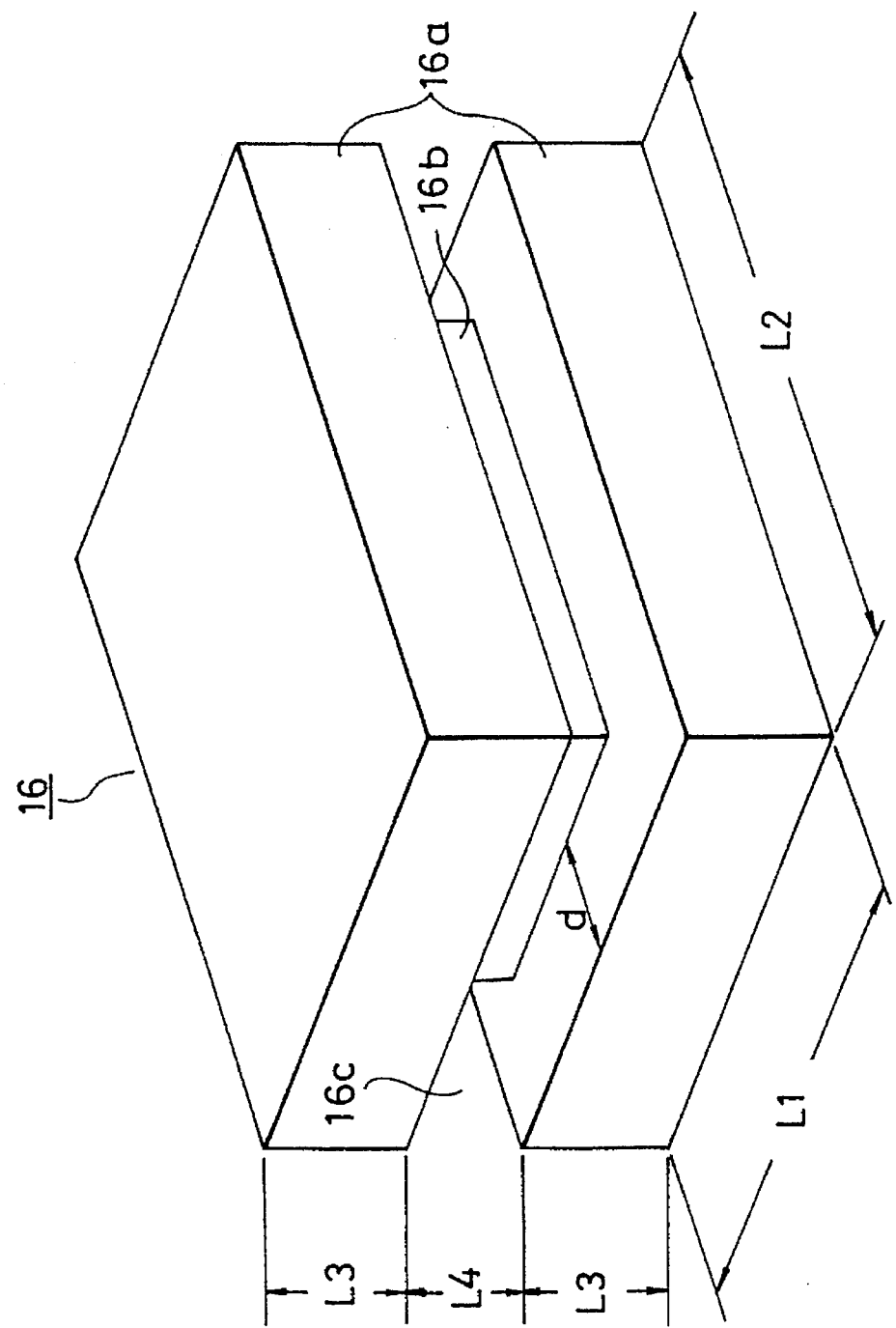
FIG. 2 is a perspective view for explaining the principle of the present invention.

FIG. 2 is a perspective view, which is used for explaining the principle of the present invention. The charge storage electrode 16, which is one of a pair of electrodes of one DRAM cell, includes two $n^+$-type polysilicon (polycrystalline silicon) films 16a and an $n^+$-type polysilicon film 16b which is interposed between the opposing the polysilicon films 16a. As illustrated, there is formed a groove 16b around the side surfaces of the storage electrode 16. Symbols L1 and L2 denote lengths of each of the storage electrodes 16a. A Symbol L3 denotes a thickness of each of the polysilicon films 16a, and a symbol L4 denotes a thickness of the polysilicon film 16b. A letter $\underline{d}$ denotes a depth of the groove 16c.

It is now assumed in the illustrated structure that L1=1.2 [μm], L2=2.0 [μm] and (L3×2)+L4=0.5 [μm], and that the presence of the groove 16c is neglected (that is, the storage electrode has no groove). In this case, the storage electrode 16 is a three-dimensional body of 1.2 [μm]×2.0 [μm]×0.5 [μm]. Also, a surface area S of five surfaces which contribute to storing a charge is calculated as follows:

$$S=1.2\times 2+(1.2\times 0.5+2\times 0.5)=5.6\ [\mu m^2]$$

In the case where an insulating film (dielectric film) which has a thickness of 75 [Å] and a dielectric constant of 3.8, is used with respect to the above storage electrode having the above size, a capacitance of the storage capacitor is 25.1 [fF].

It is further assumed that the above storage electrode 16 is provided with one groove having a length L4 of 0.15 [μm] and a depth $\underline{d}$ to form the storage capacitor illustrated in FIG. 2.

Figure 3:
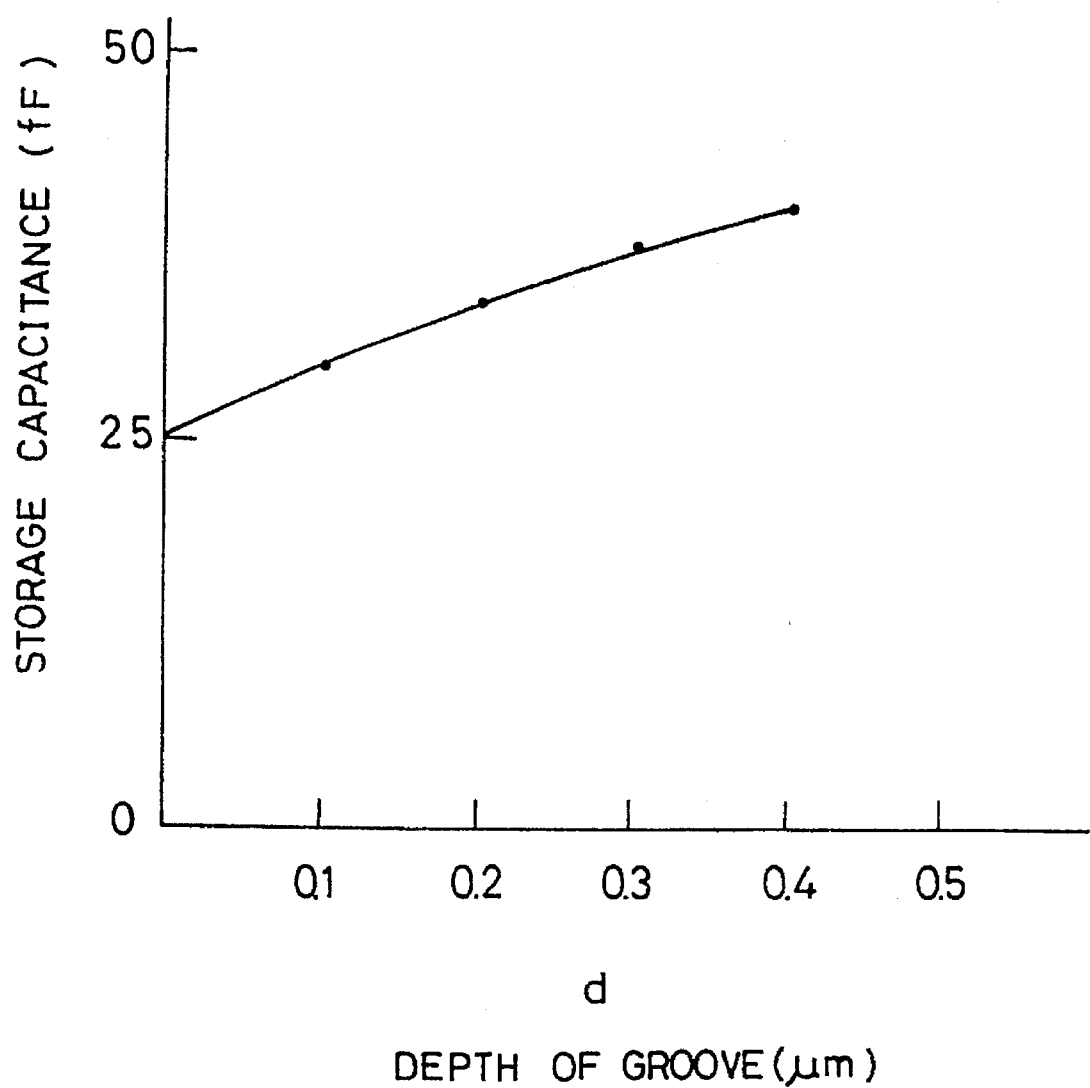
FIG. 3 is a graph showing a relationship between a of a groove formed in a storage electrode and a storage capacitance.

FIG. 3 is a graph showing a relationship between a storage capacitance and a depth of the groove 16b. The horizontal axis of the graph represents a depth of the groove 16b and the vertical axis represents a capacitance of the storage capacitor. As will be seen from FIG. 3, when d=0, that is, there is no groove, the storage capacitance has a value of 25.1 [fF]. When the groove 16b of having a depth of 0.3 [μm] is formed around all the side surfaces of the storage capacitor 16, the storage capacitance having a value of 37.5 [fF] is obtained. That is, the latter storage capacitor has an increase by 49.4 [%] in the storage capacitance, compared with the former storage capacitor. The storage capacitor shown in FIG. 2 has only one groove 16c. However, it will be obviously seen that an increased number of grooves increases the capacitance of the storage capacitor.

From the above consideration, one preferred embodiment of the present invention employs a storage electrode having at least one groove which is formed around the side surfaces thereof.

A description is given of a preferred embodiment of a DRAM device and a method of producing the same, by referring to FIGS. 4A through 4E and 5.

Figure 4A:
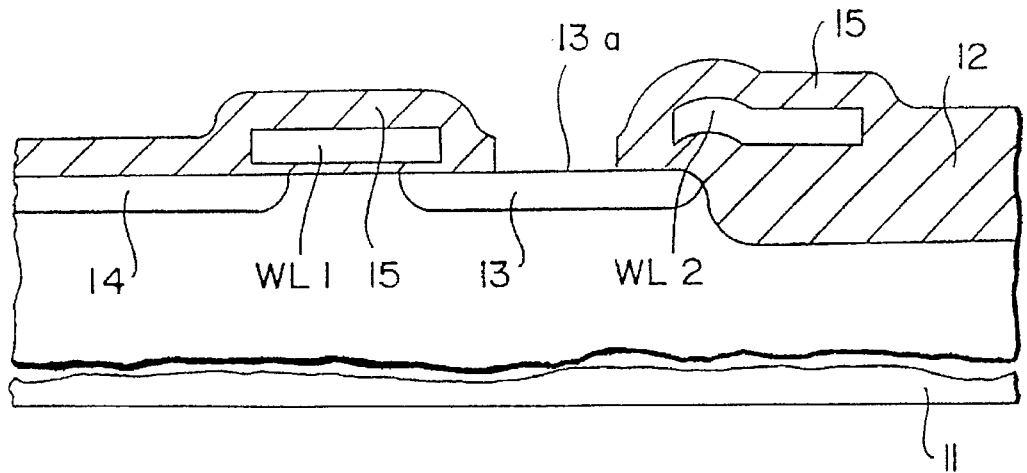

Referring now to FIG. 4A, a surface of a silicon (Si) substrate 11 is subjected to heat oxidation by a local oxidation technique. Thereby, a field oxidation film 12 having a thickness of approximately 5,000 [Å] is formed on the surface of the Si substrate 11. Next, a gate oxidation film (not shown) made of silicon dioxide ($SiO_2$) having a thickness of approximately 200 [Å] is formed by subjecting the Si substrate 11 to the thermal oxidation process. Then a polysilicon film having a thickness of approximately 3,000 [Å] is grown on the entire surface of the Si substrate 11 by chemical vapor deposition (hereafter simply referred to as CVD). In order to obtain low resistance of the deposited polysilicon film, phosphorus is diffused therein. Alternatively, an impurity-doped polysilicon film may be deposited by CVD or low-pressure CVD (LPCVD). Thereafter, the polysilicon film of low resistance is subjected to a patterning process, and thereby gate electrodes (word lines) WL1 and WL2 are formed as shown in FIG. 4A. The gate electrodes WL1 is a word line of the cell shown in FIG. 1, and the gate electrode WL2 is a word line adjacent to the word line of the gate electrode WL1. Subsequently, a desired impurity ion such as an arsinic ($As^+$) ion is injected into the Si substrate 11 with an impurity concentration of approximately $1\times 10^{15}$ [$cm^{-2}$] and an energy of 70 [keV], for example. In this step, the word lines WL1 and WL2 are used as mask films. Thereby, n+yp impurity diffused regions 13 and 14 are formed. The $n^+$-type impurity diffused regions 13 and 14 act as drain and source of the transfer transistor T shown in FIG. 1, respectively. Thereafter, an insulating film 15 is formed on the entire surface of the Si substrate 11 by CVD or LPCVD. The insulating film 15 has a thickness of 1,000 [Å], for example, and is made of silicon nitride ($Si_3N_4$), silicon dioxide ($SiO_2$) or the like. Thereafter, a resist film is formed on the insulating film 15 except for a surface portion at which an opening 13a is to be formed. Then, the Si substrate 11 is subjected to anisotropic etching such as relative ion etching (RIE) and thereby the opening 13a is formed in the insulating film 15 as illustrated in FIG. 4A.

Figure 4B:
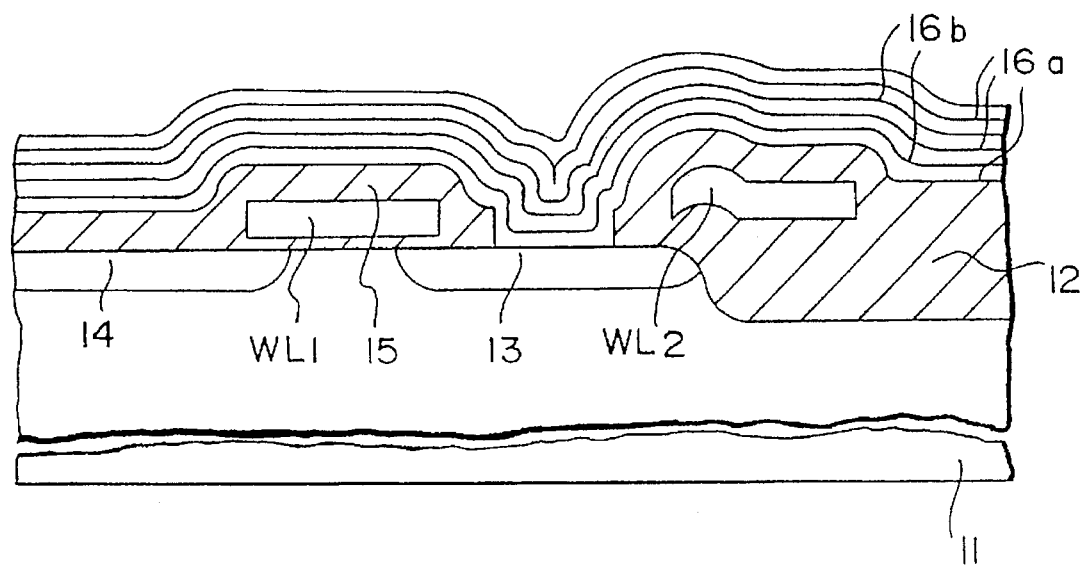

Next, an undoped polysilicon film 16a having a thickness of approximately 1,000 [Å] is grown on the entire surface of the Si substrate 11 shown in FIG. 4B by plasma-assisted chemical vapor deposition (hereafter simply referred to as PCVD). Subsequently, an $n^+$-type polysilicon film 16b into which arsenic (As) is highly doped, is grown on the undoped polysilicon film 16a by PCVD. Thereafter, the formation of the undoped polysilicon film 16a and the $n^+$-type polysilicon film 16b is repetitively carried out. In the illustrated example, five stacked polysilicon film layers are formed. Therefore, a polysilicon film placed at top of the stacked film structure is one undoped polysilicon film 16a.

The PCVD technique makes it possible to grow a polysilicon film at a low-temperature equal to or lower than 800° C. Preferably, the temperature is set in a range of 500 to 600° C. This is because the arsenic (As) atoms can be prevented from being diffused from the n$^+$-type polysilicon films 16b into the undoped polysilicon films 16a during the steps of growth of the polysilicon films. As necessary, boron (B) may be doped into the undoped polysilicon films 16b with a very low concentration so that the films can be changed to p$^{31}$-type polysilicon films. In place of PCVD, so-called photon assisted CVD may be used, in which the deposition of polysilicon films is performed while projecting ultra violet (UV) light onto the Si substrate 11. The projection of the UV light may facilitate resolution of monosilan gas (SiH$_4$) due to the energy of the UV light, and thereby the CVD at low-temperatures can be obtained.

Figure 4C:
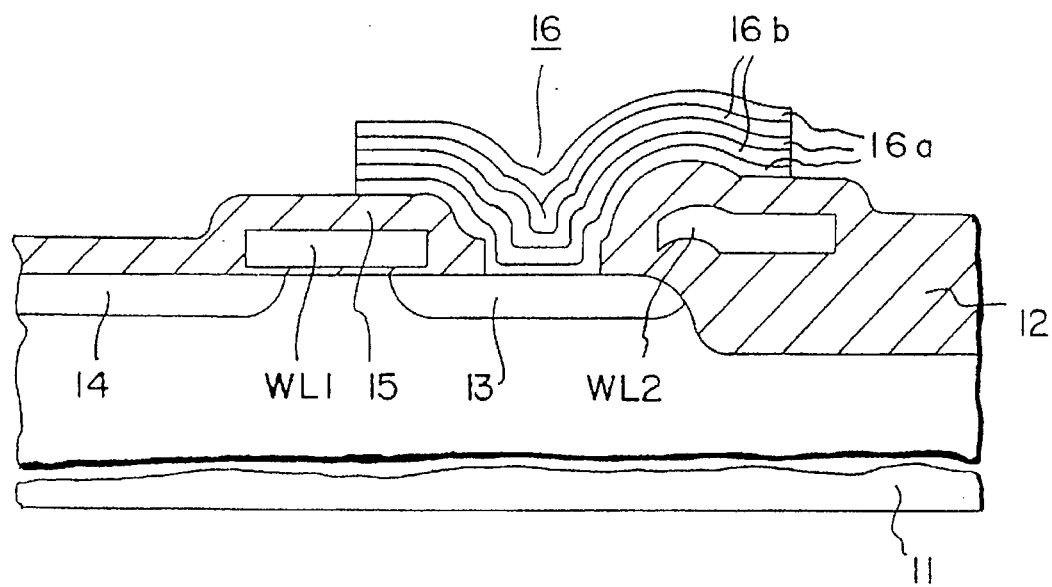

Then, as shown in FIG. 4C, the stacked polysilicon films 16a and 16b are subjected to a patterning process in accordance with a desired size of a storage capacitor. The patterning may be performed by the photolithography technology.

Figure 4D:
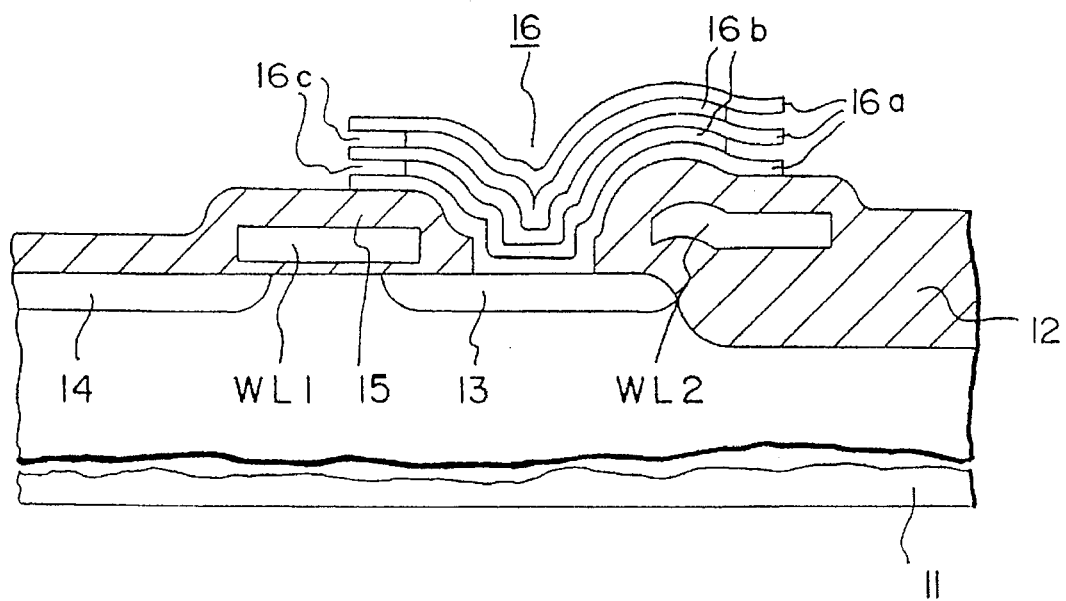

Thereafter, the Si substrate 11 of FIG. 4C is put into a mixture liquid containing hydrogen fluoride (HF) and nitric acid (HNO$_3$). In this step, only the n$^+$-type polysilicon films 16b are selectively etched. All the side surfaces of the stacked polysilicon films are subjected to etching, and thereby grooves 16c are formed around the side surfaces thereof as shown in FIG. 4D. It should be appreciated that the presence of the grooves 16c greatly contribute to an increase in the surface area of the storage electrode. It is to be noted that the grooves 16c are always formed around the side surfaces of the stacked polysilicon films even when the grooves 16c are small.

Then, an arsenic ion is implanted into the stacked polysilicon layer and is diffused into the entire of the electrode 16 with a high concentration of approximately 1×10$_{20}$ [cm$^{-2}$]. Thereby, the electrode 16 is changed to an n$^+$-type polysilicon electrode and thereby the resistance of the electrode 16 can be reduced.

Subsequently, a silicon dioxide (SiO$_2$) film which is very thin in the order of approximately 20 [Å], for example, is formed on the exposed surfaces of the electrode 16 as the natural oxide. Thereafter, a silicon nitride (Si$_3$N$_4$) film having a thickness of 100 [Å], for example, is deposited on the natural oxide layer by CVD. In FIG. 4E, the SiO$_2$ film and the Si$_3$N$_4$ film are illustrated as a capacitor dielectric film 17. Then the Si substrate 11 is subjected to annealing in an oxidation atmosphere at a temperature of 950° C. for 30 minutes, for example. Thereafter, a polysilicon film is deposited on the entire surface of the Si substrate 11 by CVD, and is patterned by the photolithography. Thereby an opposed electrode (also called a cell plate) 18 made of polysilicon is formed so as to completely surround the storage electrode 16. Subsequently an insulating film 19 is deposited on the entire surface of the Si substrate 11 by CVD, and an opening 14a is formed therein by the photolithography technology. Finally, the bit line 20 made of aluminum (Al), for example, is formed on the insulating film 19 by vacuum evaporation and is then subjected to the patterning process using the photolithography technology.

Figure 5:
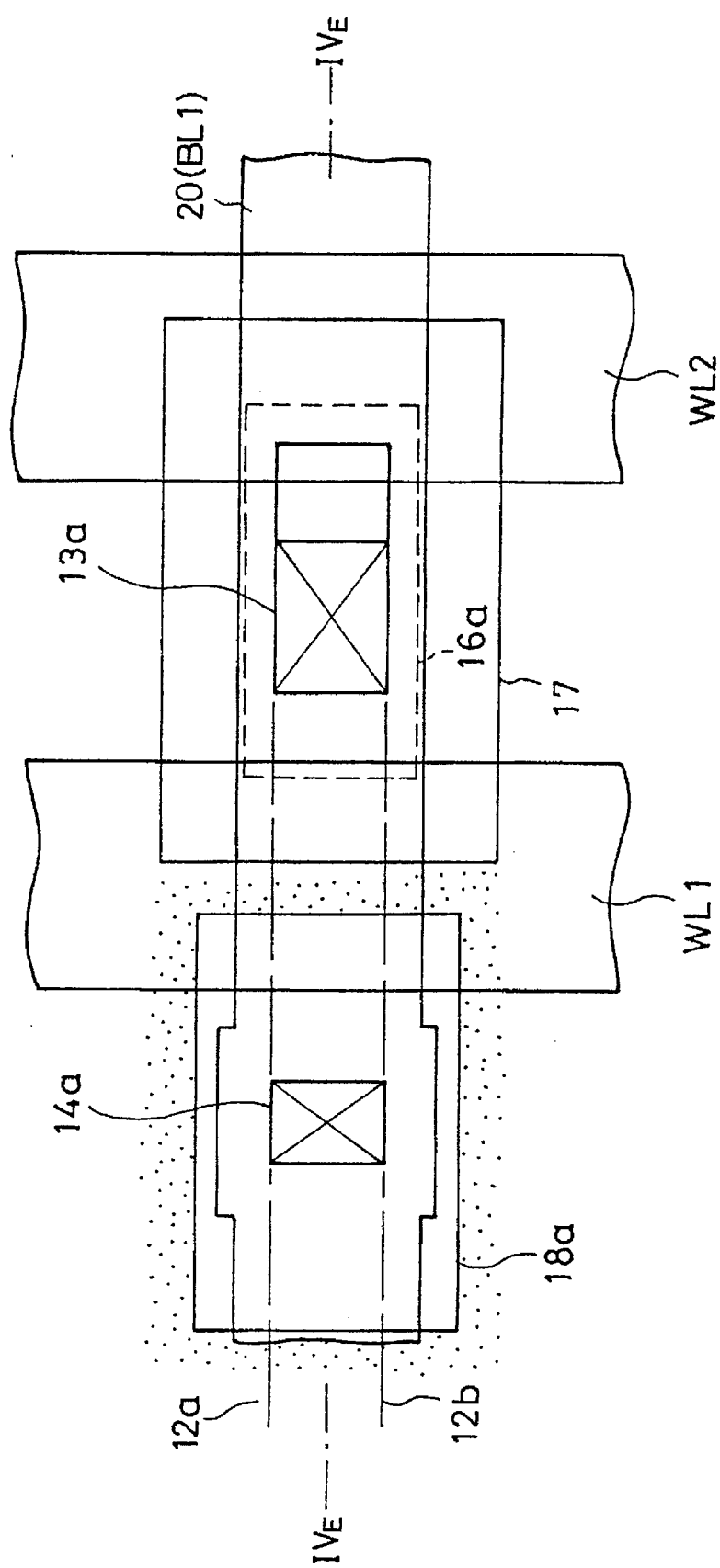
FIG. 5 is a plan view of the first embodiment.

FIG. 5 is a plan view of the DRAM cell that is formed by the above-described process. FIG. 4E corresponds to an elevational cross sectional view taken along a line IVE$_E$—IV$_E$. In FIG. 5, the opening 13a forms a contact hole necessary for establishing a contact between the n -type impurity diffused region or drain region 13 and the polysilicon film positioned at the lowermost of the stacked storage electrode 16. The opening 14a forms a contact hole necessary for establishing a contact between the n$^+$-type impurity diffused region or source region 14 and the bit line 20. A reference numeral 16a denotes bottoms of the grooves of the storage electrode 16. A reference numeral 18a denotes an opening which is formed in the cell plate (opposed electrode) 18. A reference numeral 12a denotes a boundary between the field oxidation film 12 and the drain and source regions 13 and 14.

The DRAM cell of the first embodiment shown in FIGS. 4E and 5 has a charge storage capacitor having an increased capacitance. It should be appreciated that a plurality of grooves are formed around all the side surfaces of the storage capacitor body 16. In other words, the storage electrode 16 has an elevational cross section such that branches extend from a trunk. Further, it should be appreciated that the storage capacitor 16 is formed so as to partially overlap the transfer transistor T, as clearly shown in FIGS. 4E and 5. With this structure, an increased integration density can be obtained without decreasing the capacitance of the storage capacitor.

A description is given of a second embodiment of the present invention with reference to FIGS. 6A, 6B, 7A through 7H and 8, in which the same elements as those in the previous figures are denoted by the same reference numerals.

Figure 6A:
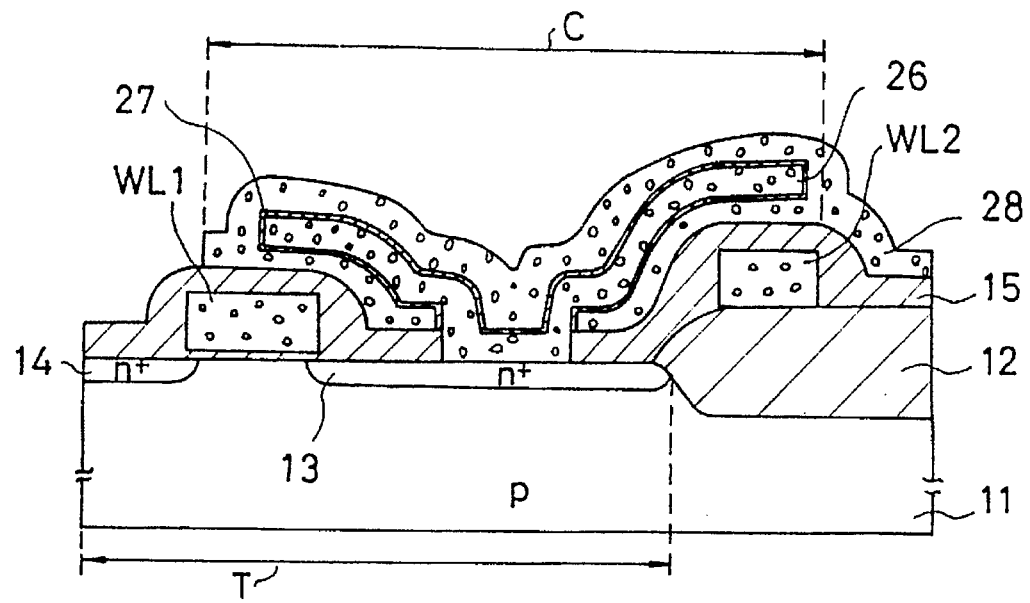
FIG. 6A is an elevational cross sectional view of a second embodiment of the present invention.

One of the essential features of the embodiment shown in FIG. 6A is that a gap is formed between the insulating film 15 and a storage electrode 26 so as to be formed around the storage electrode 26 which is surrounded by a dielectric film 27. The gap is filled with a polysilicon film which serves as an opposed electrode 28. This is clearly distinct from the first embodiment of the present invention.

Figure 7A:
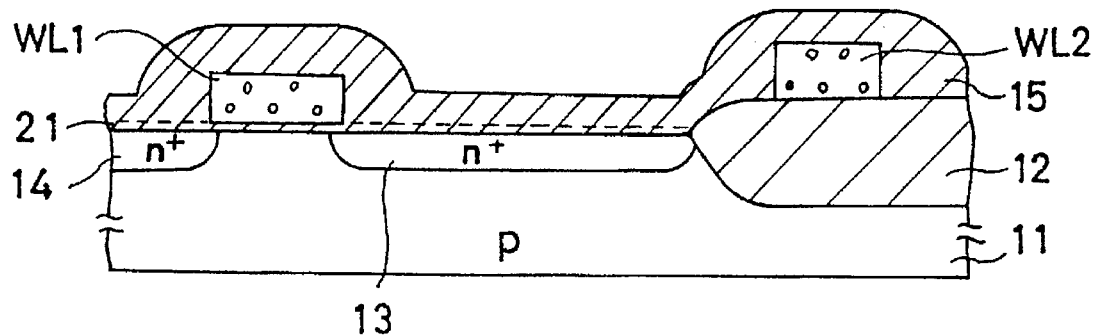
FIGS. 7A through 7H are elevational cross sectional view showing step of a process for producing the second embodiment of FIG. 6A.

The DRAM cell of FIG. 6A can be produced as follows. First, a layer structure shown in FIG. 7A is formed by a sequence of processes which are identical to those described previously with reference to FIG. 4A. In FIG. 7A, a gate oxidation film 21 which is not shown in FIG. 4A is indicated by a broken line.

Figure 7B:
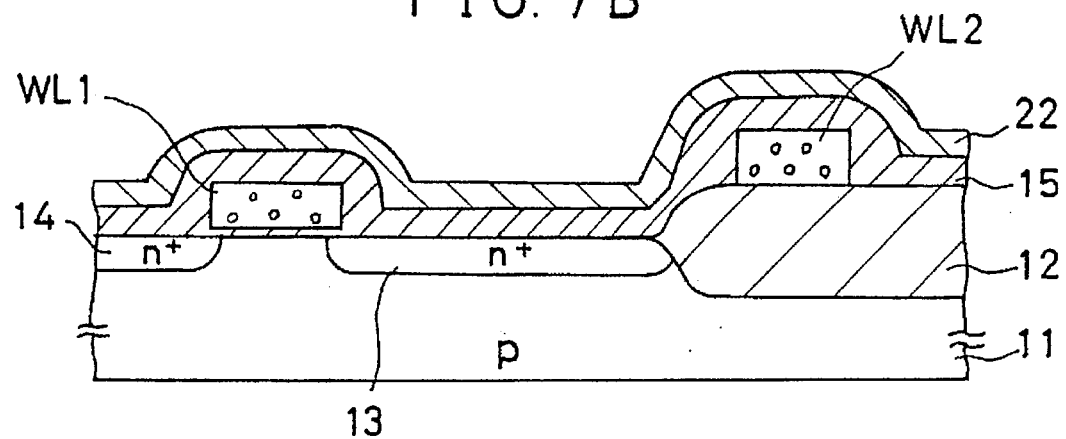

Next, as shown in FIG. 7B, a film 22 having a thickness almost equal to 1,000 [Å] is formed on the entire surface of the Si substrate 11 by CVD or LPCVD. The deposition of the films 15 and 22 may be successively performed. It is to be noted that the film 22 is made of a material different from a material forming the insulating film 15. For example, in the case where the insulating film 15 is a Si$_3$N$_4$ film, a SiO$_2$ film can be used as the film 22 formed thereon. Alternatively, in the case where the insulating film 15 is a SiO$_2$ film, a Si$_3$N$_4$ film is used to form the film 22. In the following description, it is assumed that the films 15 and 22 are formed by Si$_3$N$_4$ and SiO$_2$ films, respectively.

Figure 7C:
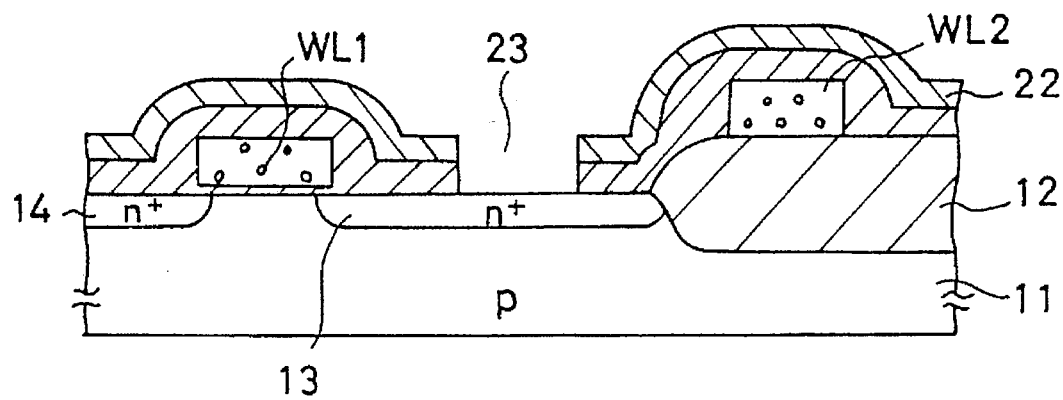

Then, as shown in FIG. 7C, an opening 23 is formed in the SiO$_2$ film 22 and the Si$_3$N$_4$ film 15 is formed by anisotropic etching such as reactive ion etching (RIE). In this step, a resist film (not shown) is used as a mask. The opening serves as a contact hole at which the drain region 13 is electrically in contact with the storage electrode 26 which is formed by the later step.

Thereafter, an impurity-doped conductive polysilicon film having a thickness of approximately 1,000 [Å] is deposited on the entire surface of the SiO$_2$ film 22 having the opening 23 by CVD or LPCVD. Then the polysilicon film is subjected to the patterning process. Thereby, as shown in FIG.

7D, the storage electrode 26 having an illustrated elevational cross section is formed.

Figure 7D:
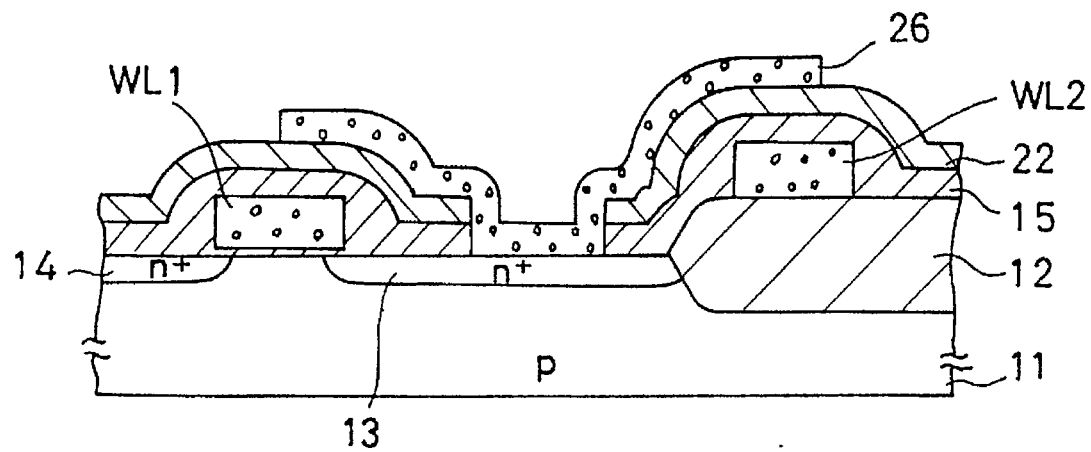
Figure 7E:
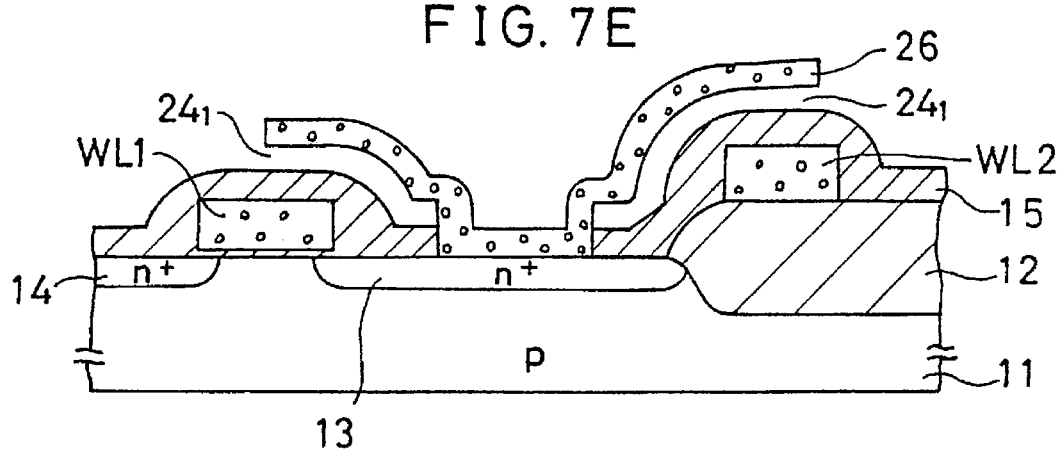

Subsequently, as shown in FIG. 7E, the $SiO_2$ film 22 is completely removed by isotropic etching in which the Si substrate 11 of FIG. 7D is put into a liquid containing hydrogen fluoride (HF). The $Si_3N_4$ film 15 which covers the gate electrodes (word lines) WL1 and WL2 is not etched by the HF liquid. Thereby, it is to be noted that a gap $24_1$ is formed between the insulating film 15 and the storage electrode 26 so as to be formed around the storage electrode 26.

Figure 7F:
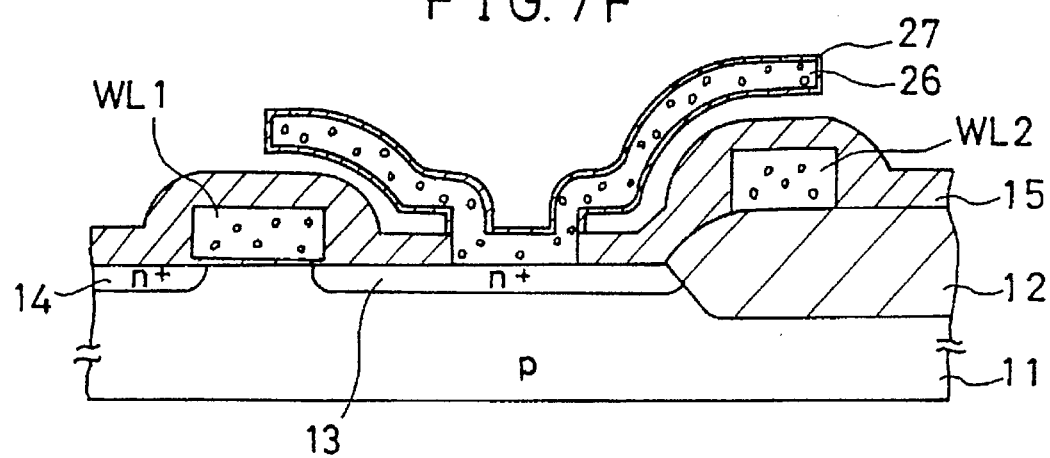

Then, the storage electrode 26 is subjected to the thermal oxidation process and thereby the dielectric film 27 made of a $SiO_2$ film is formed on the exposed surface of the storage electrode 26, as shown in FIG. 7F. In this step, it is preferable to set an oxidation atmosphere at a low pressure equal to or lower than 10 [torr]. Under this condition, the dielectric film 17 can be uniformly formed on a surface portion of the storage electrode 26 which faces the insulating film 15 through the gap $24_1$. In place of the formation of the $SiO_2$ film 27, it is possible to grow a $Si_3N_4$ film around the storage electrode 26 by LPCVD.

Figure 7G:
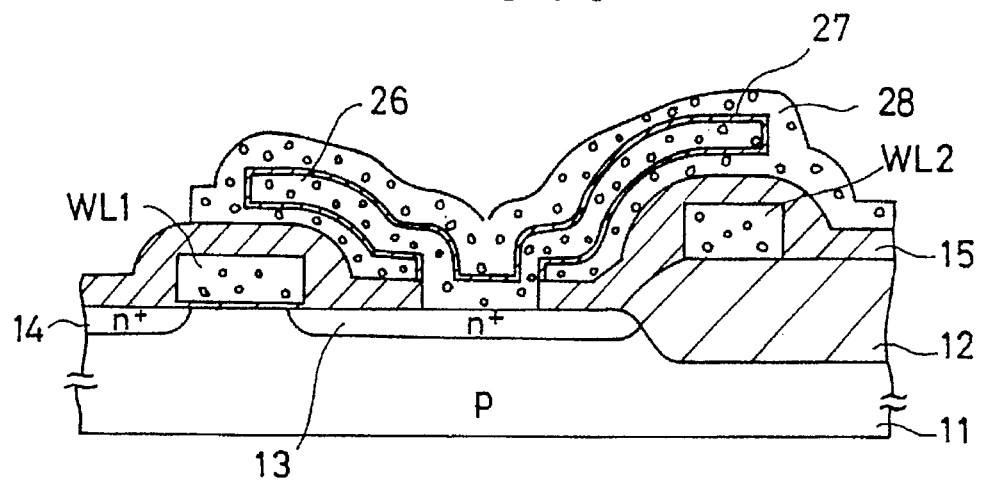

Following the process of FIG. 7F, an impurity-doped polysilicon film having a thickness of approximately 1,500 [Å], is deposited on the entire surface of the substrate 11 of FIG. 7F by CVD or LPCVD. In this process, it is preferable to grow the polysilicon film in low-pressure atmosphere lower than approximately 1 [torr]. Under this condition, the polysilicon film can be grown so as to completely fill the gap $24_1$. Then, the polysilicon film is subjected to the patterning process, whereby as shown in FIG. 7G, the polysilicon film 28 is formed. The patterned polysilicon film 28 is the opposed electrode 28.

Figure 7H:
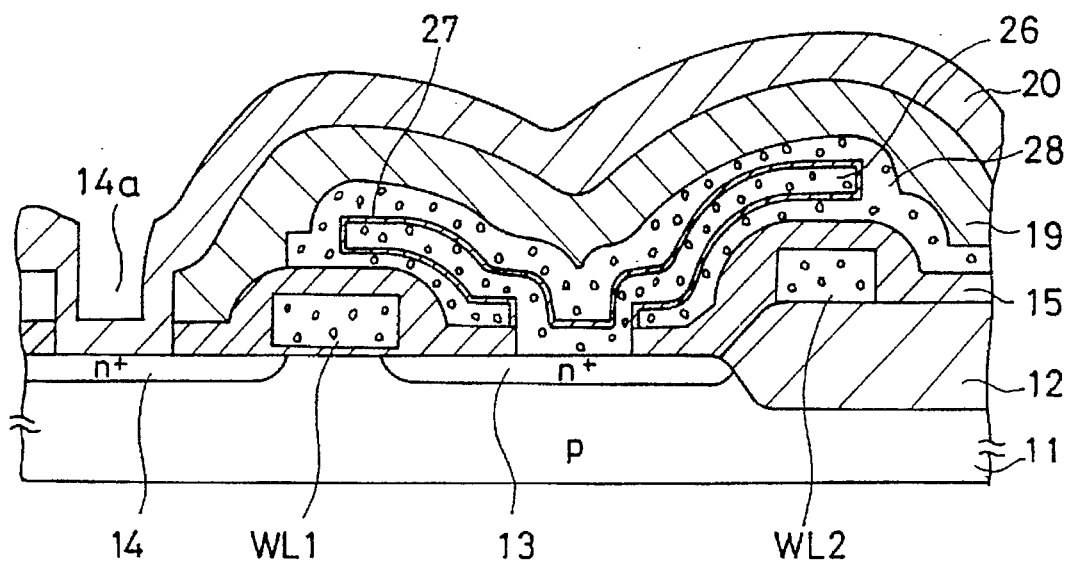

Then, as shown in FIG. 7H, the insulating film 19 made of phosphosilicate glass (PSG), for example, is deposited on the entire surface of the Si substrate 11 of FIG. 7G, by CVD. Then, the contact window 14a for the source region 14 is formed by the photolithography technique. Finally, a bit line 20 made of aluminum (Al), for example, is formed on the insulating film 19 by vacuum evaporation and photolithography technology.

Figure 6B:
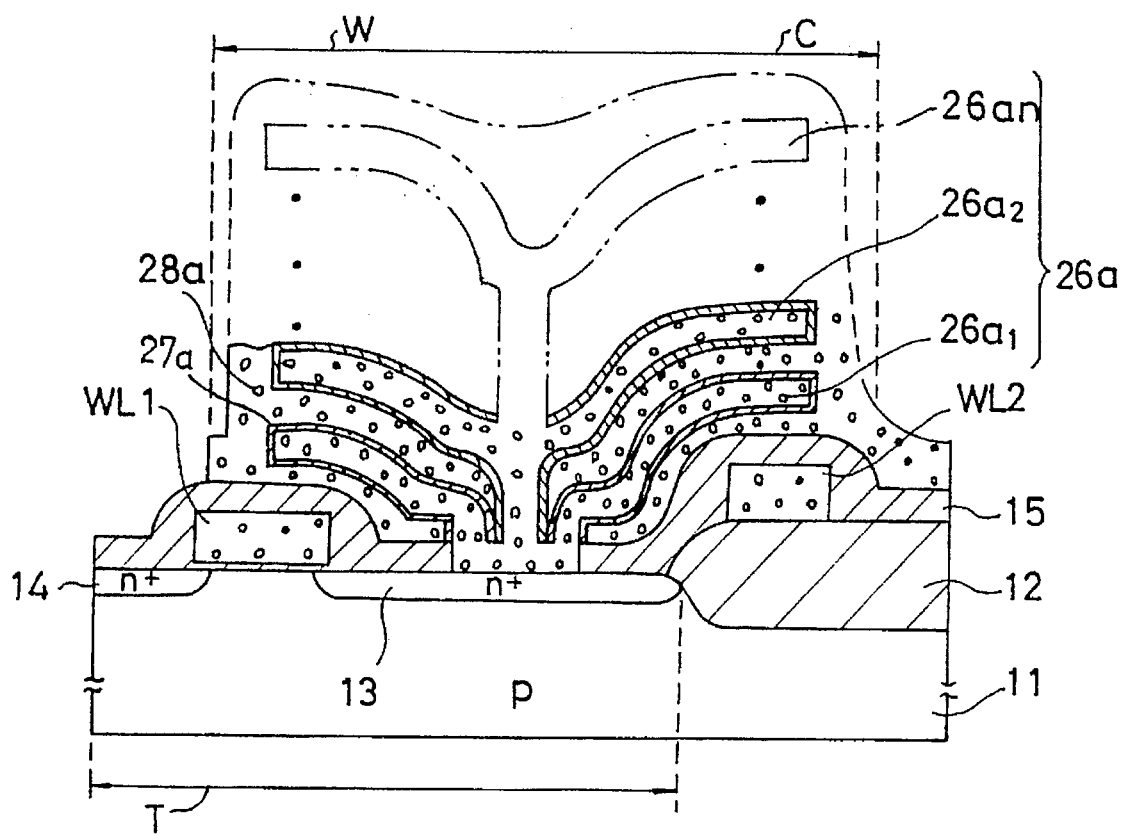
FIG. 6B is an elevational cross sectional view of a variation of the second embodiment of FIG. 6A.

FIG. 6B is a variation of the embodiment shown in FIG. 6A. The variation has an essential feature such that a storage electrode 26a includes a plurality of polysilicon films $26a_1$, $26a_2$, ..., $26a_n$. A dielectric film 27a is formed so as to surround an exposed surface of the storage electrode 26a. An opposed electrode 28a is formed so as to surround the storage electrode 26a, on the surface of which the dielectric film 27a is formed. The storage capacitor of the variation has a capacitance greater than that of the second embodiment of FIG. 6A.

Figure 8A:
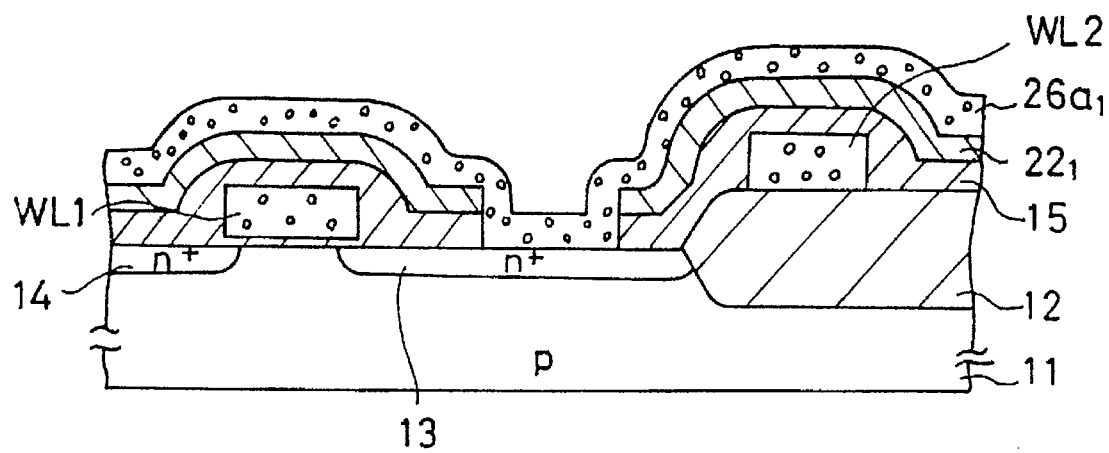
FIGS. 8A through 8F are elevational cross sectional view showing steps of a process for producing the variation of FIG. 6B.
Figure 8B:
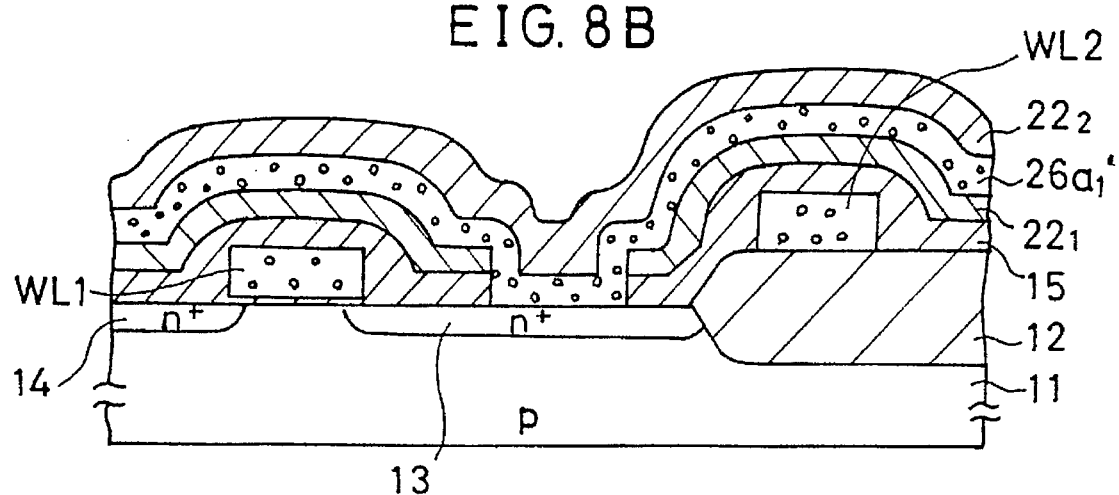
Figure 8C:
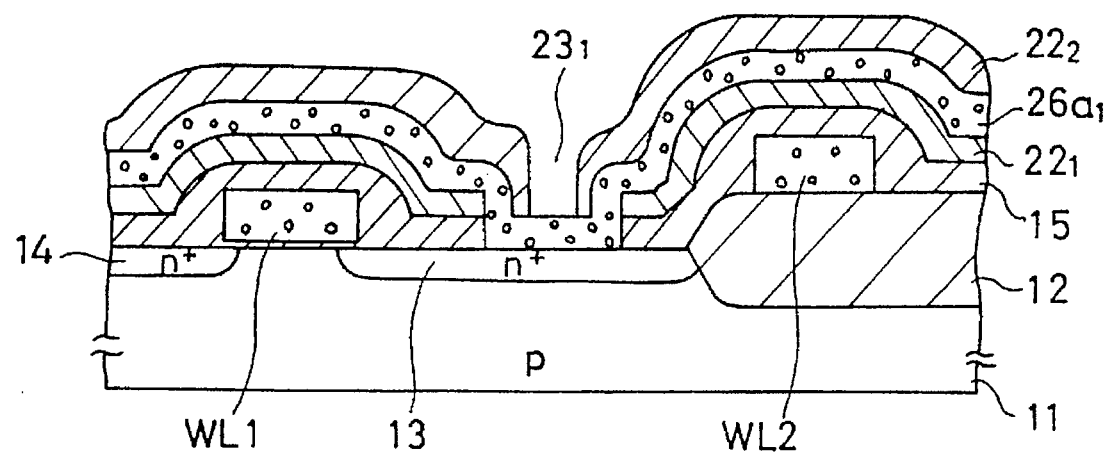
Figure 8D:
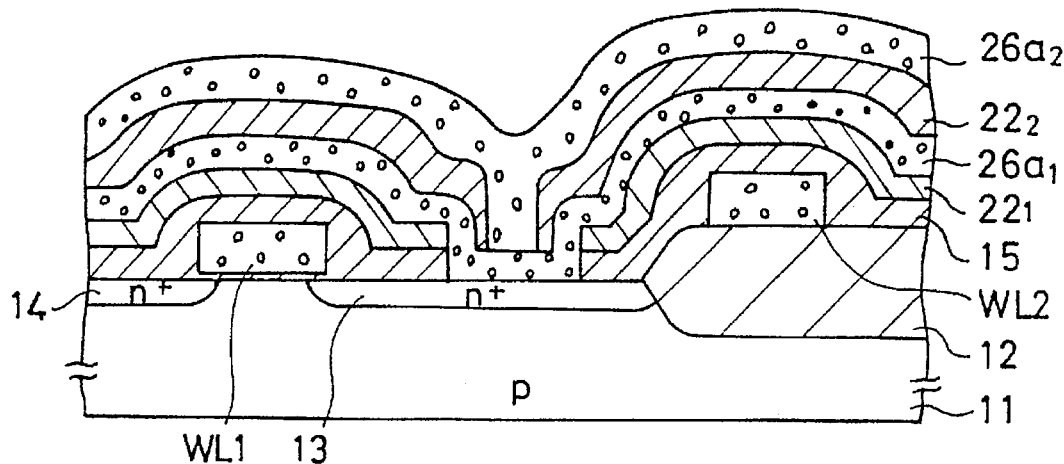
Figure 8E:
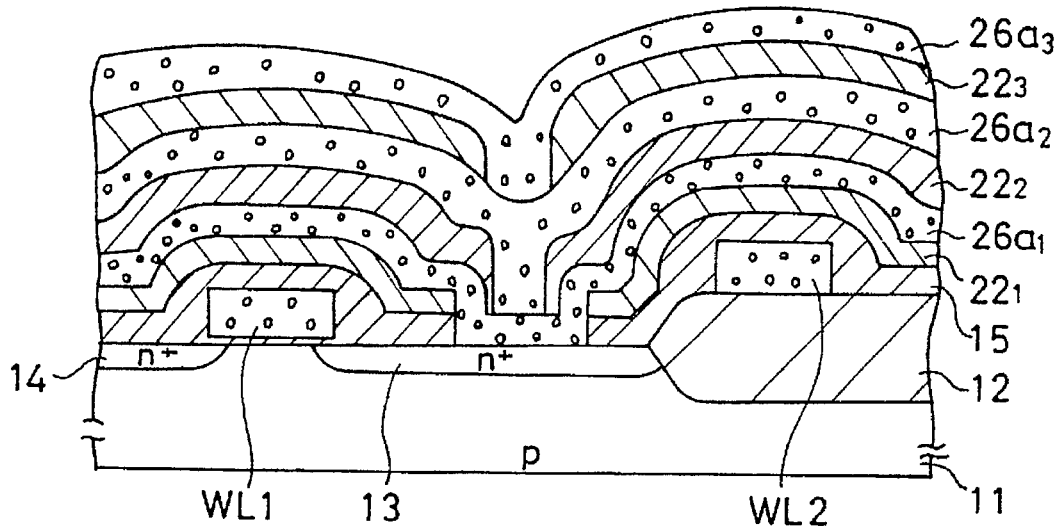
Figure 8F:
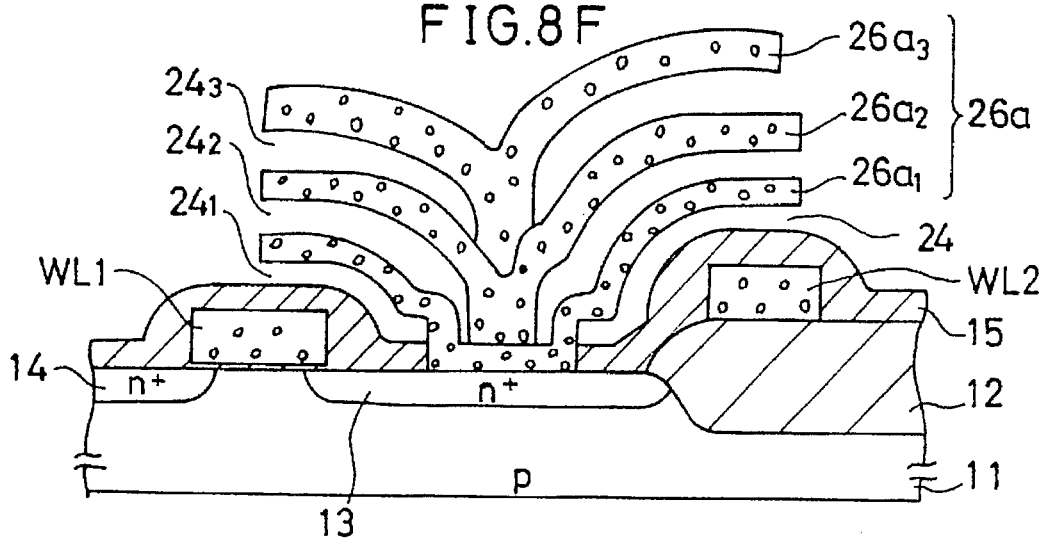

The DRAM cell of FIG. 6B can be produced as follows. First, the structure shown in FIG. 7C described before is formed by the processes indicated in FIGS. 7A through 7C. Then, as shown in FIG. 8A, an impurity-doped polysilicon film $26a_1$ having a thickness of approximately 1,000 [Å] is deposited on a $SiO_2$ film $22_1$ by CVD or LPCVD. Thereafter, as shown in FIG. 8B, a $SiO_2$ film $22_2$ having a thickness of approximately 1,000 [Å] is deposited on the entire surface of the polysilicon film $26a_1$ by CVD or LPCVD. Then, as shown in FIG. 8C, an opening $23_1$ is formed in the $SiO_2$ film $22_2$ by reactive ion etching (RIE) in which etching gas containing $CF_4/H_2$ is used. The polysilicon film $26a_1$ is exposed through the opening $23_1$. Thereafter, as shown in FIG. 8D, a polysilicon film $26a_2$ having a thickness of approximately 1,000 [Å] is deposited on the entire surface of the $SiO_2$ film $22_1$ having the opening $23_1$ by CVD or LPCVD. Then, as shown in FIG. 8E, an opening is formed in the polysilicon film $22_3$. The contact between the polysilicon films $26a_2$ and $26a_3$ may be not necessarily positioned above the drain region 13. For example, the contact may be positioned above gate electrode WL1. Thereafter, an impurity-doped polysilicon film $26a_3$ is deposited on the entire surface of the $SiO_2$ film $22_3$. In this manner, n number of the polysilicon films (fins) can be formed. Although three polysilicon layers $26a_1$, $26a_2$ and $26a_3$ are formed as shown in FIG. 8F, two layers $26a_1$ and $26a_2$ may be formed without depositing the polysilicon layer $26a_3$.

Then, the $SiO_2$ films $22_2$ and $22_3$ and the polysilicon films $26a_1$, $26a_2$ and $26a_3$ are subjected to the patterning process such as reactive ion etching (RIE), in which a resist film (not shown) is used as a mask. Subsequently, remaining portions of the $SiO_2$ films are completely removed by isotropic etching in which a liquid containing HF is used. Thereby, the storage electrode 26a having a structure shown in FIG. 8F is formed. As shown in FIG. 8F, there is formed a gap $24_1$ between the insulating film 15 and the lowermost film $26a_1$ so as to surround the storage electrode 26a. There are also formed gaps $24_2$ and $24_3$ between the mutually adjacent polysilicon films so as to surround the storage electrode 26a. Then, the entire exposed surface of the storage electrode 26a is subjected to the thermal oxidation process, and thereby the dielectric film 27a is formed thereon. Subsequent processes are the same as those for the DRAM device shown in FIG. 6A. The multilayer structure of FIG. 6B can also be produced by another process, which will be described later with reference to FIGS. 11A through 11G.

Figure 9:
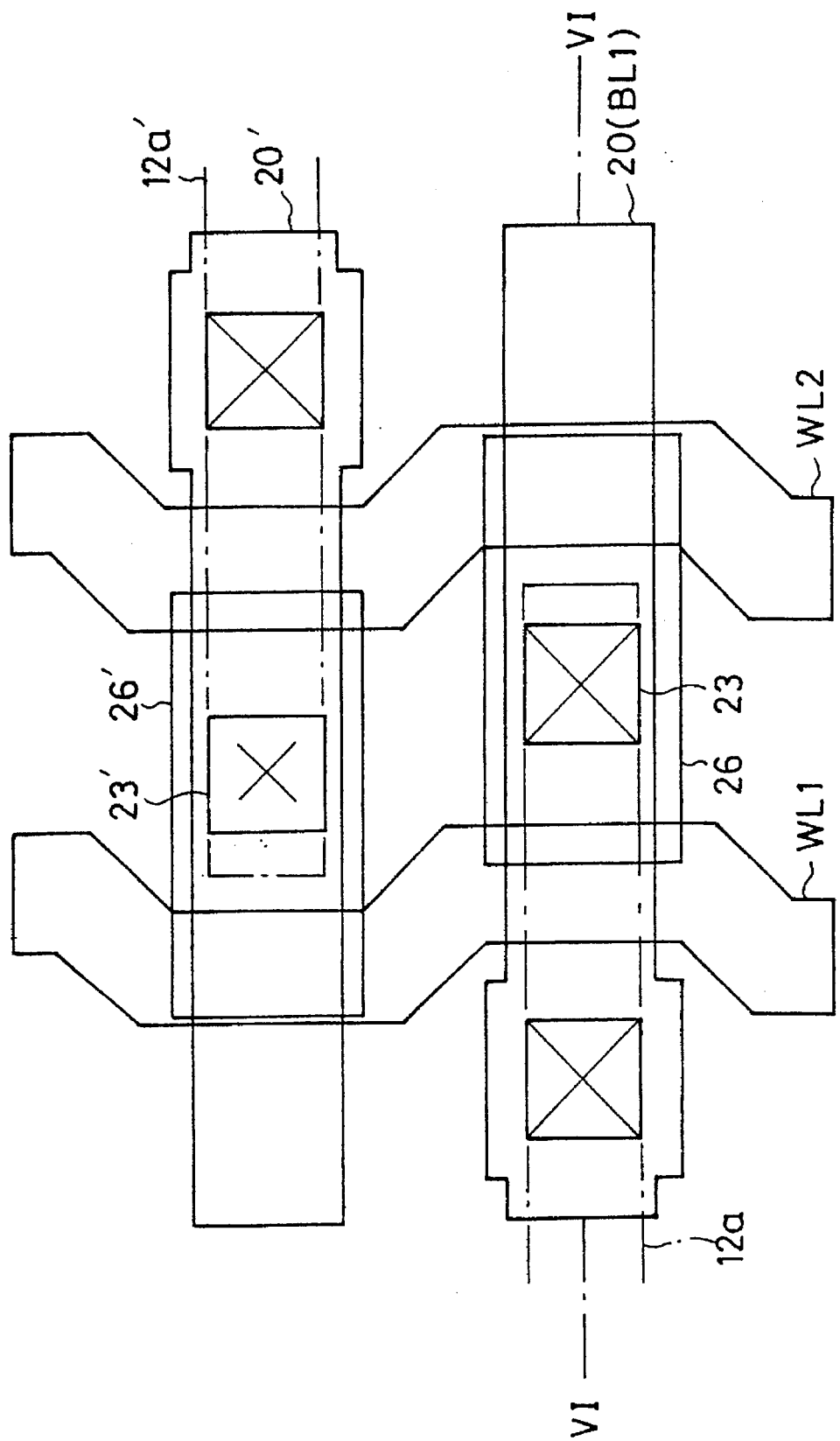
FIG. 9 is a plan view of various embodiments of the present invention.

FIG. 9 is a plan view of essential parts of each of the DRAM devices shown in FIGS. 6A and 6B. The cross sectional views of FIGS. 6A and 6B correspond to views taken along a line VI—VI. In FIG. 9, the same reference numerals as those in the previous figures denote the same elements as those shown in the previous figures. As shown in FIG. 9, the storage electrode 26 extends above the word lines WL1 and WL2. The storage electrode 26 partially overlaps the width of the word line WL1 and almost overlaps the width of the word line WL2 Reference numerals 12a', 20', 23' and 26' correspond to reference numerals 12a, 20, 23, and 26.

Figure 10A:
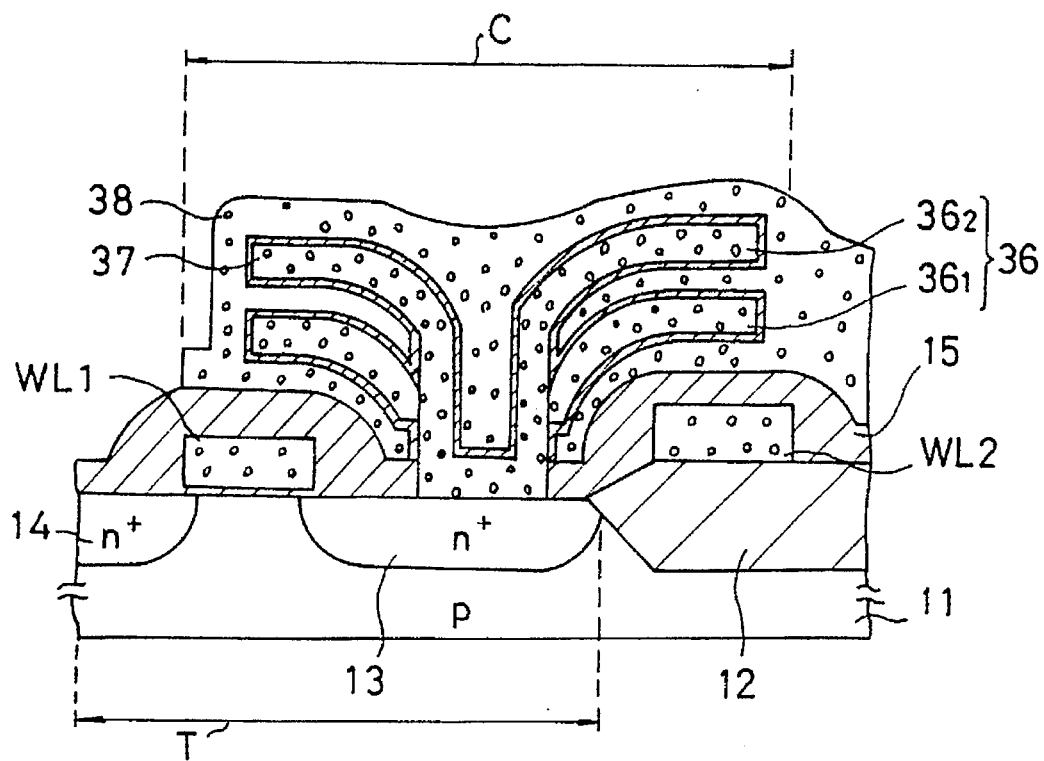
FIG. 10A is an elevational cross sectional view of a third embodiment of the present invention.

A description is given of a third embodiment of the present invention with reference to FIG. 10A. A storage electrode 36 of a DRAM cell of FIG. 10A has an essential feature such that an uppermost polysilicon film elevationally extends so as to make contact with the drain region 13. Polysilicon films other than the uppermost film are connected to an elevationally extending portion thereof.

Figure 11A:
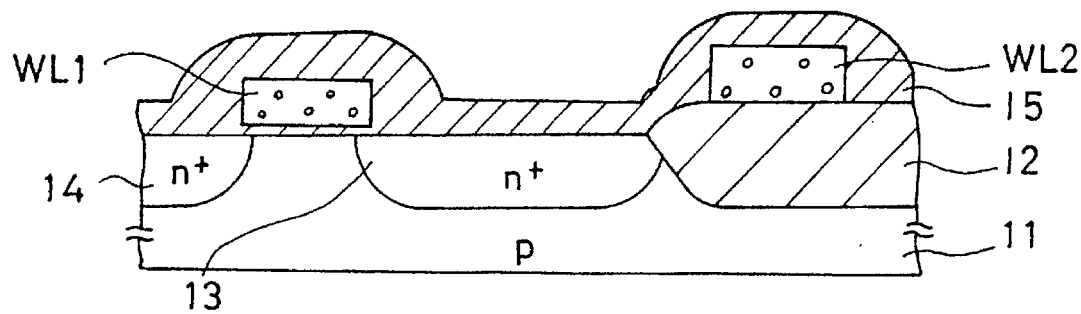
FIGS. 11A through FIG. 11G are elevational cross sectional views showing step of a process for producing the third embodiment of FIG. 10A.
Figure 11B:
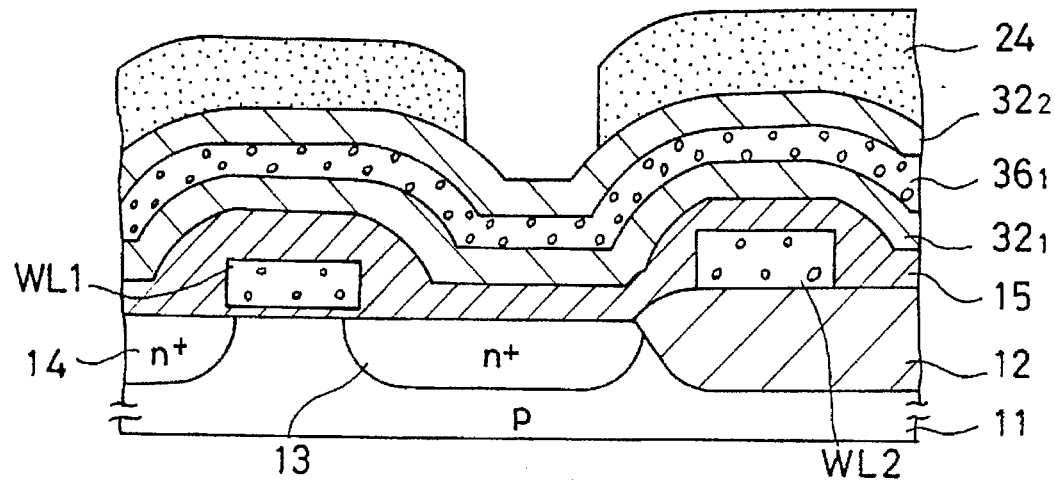
Figure 11C:
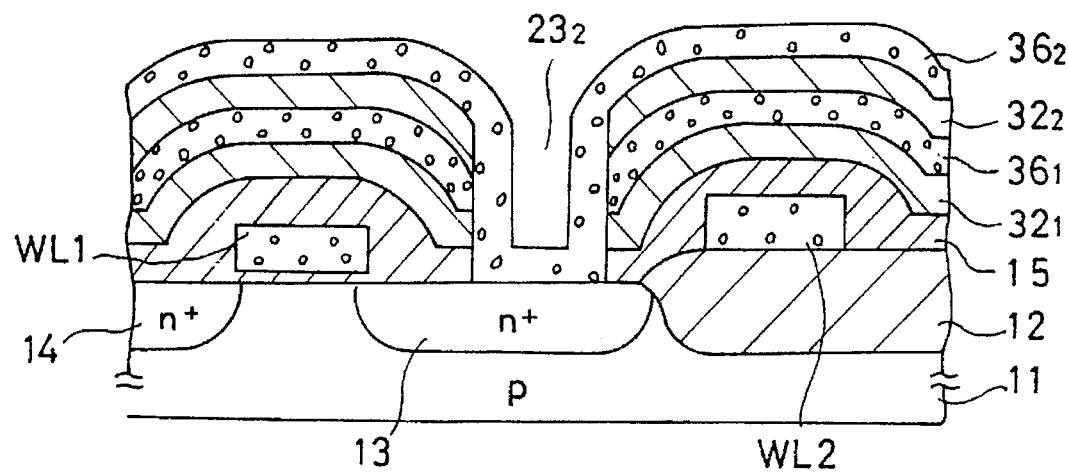
Figure 11D:
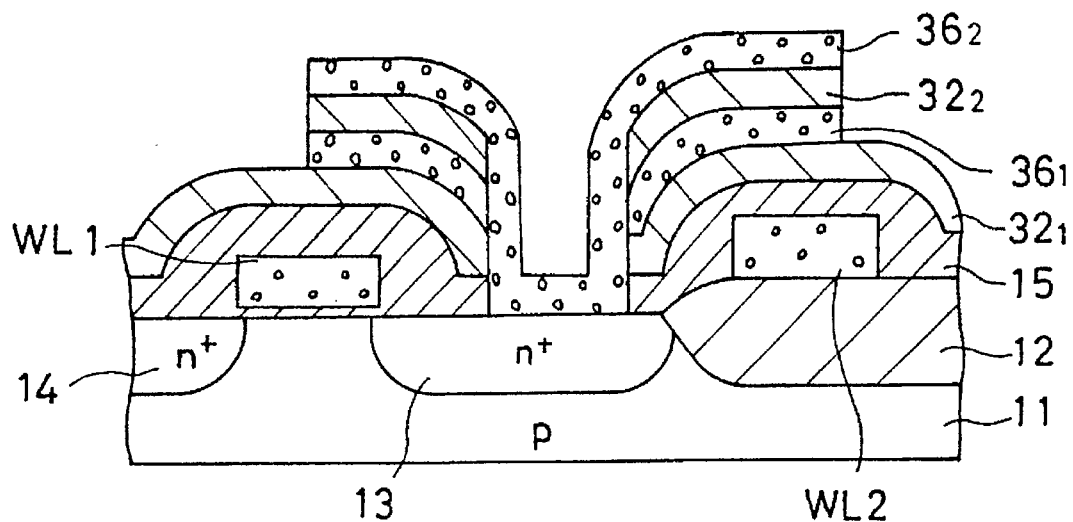
Figure 11E:
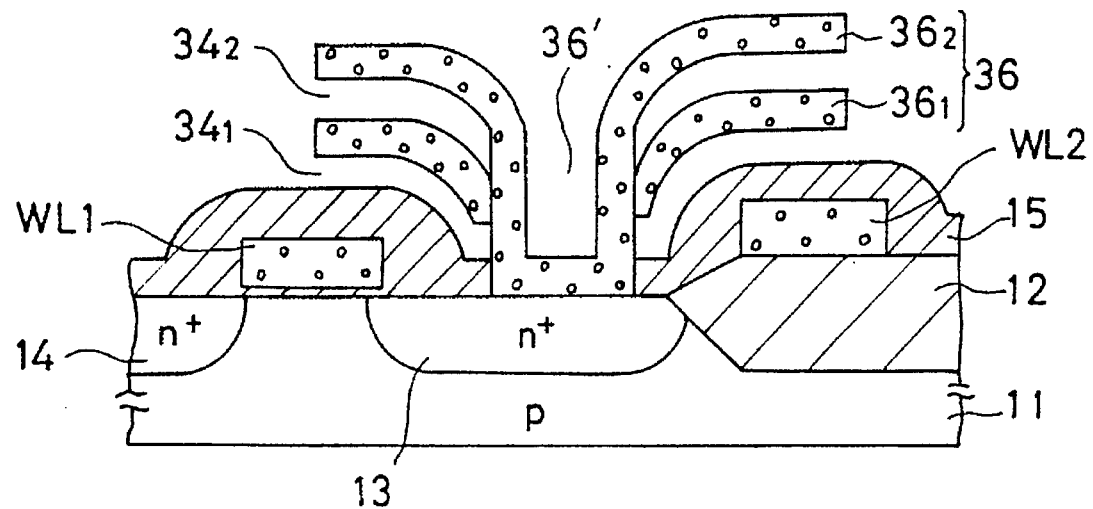
Figure 11F:
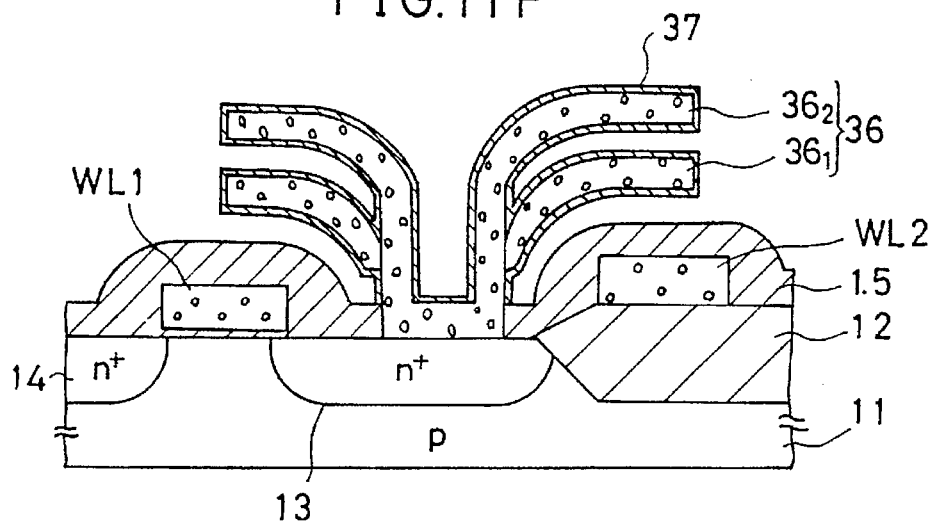
Figure 11G:
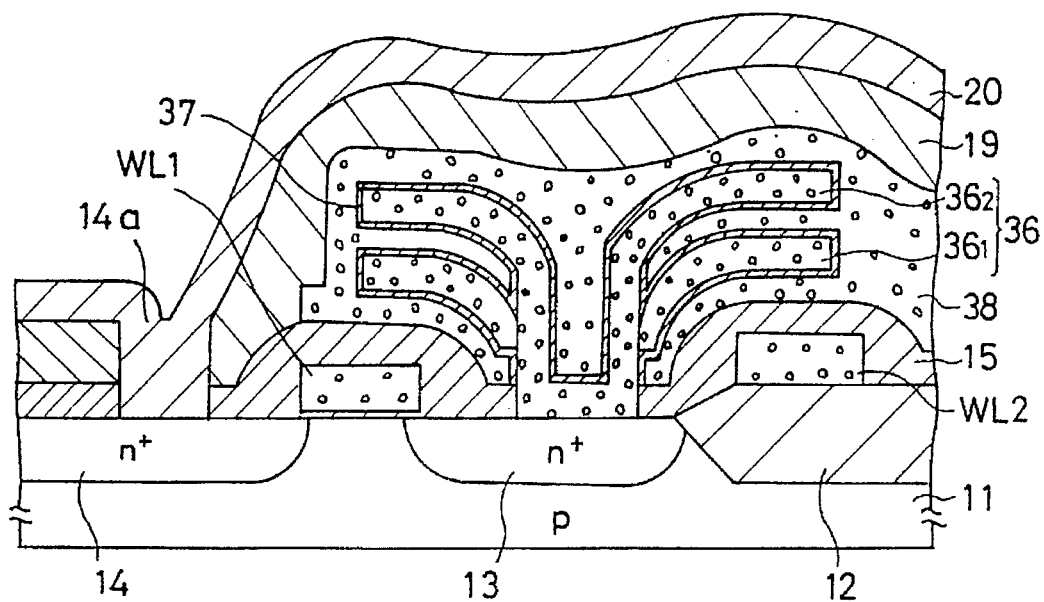

The DRAM device of FIG. 10A can be formed in accordance with steps shown in FIGS. 11A through 11G. First, a structure shown in FIG. 11A is formed by the processes which are the same as those described before by referring to FIG. 6A. Subsequently, as shown in FIG. 11B, there are successively deposited a $SiO_2$ film $32_1$ having a thickness of approximately 1,000 [Å], an impurity-doped polysilicon film $36_2$ having a thickness of approximately 1,000 [Å], and a $SiO_2$ film $32_1$ having a thickness of approximately 1,000 [Å]. The deposition of the above films can be performed by CVD or LPCVD. In this manner, a plurality of polysilicon films (fins) may be formed. Then, as shown in FIG. 11B, a resist film 24 is formed on the $SiO_2$ film $32_1$ and is then subjected to the patterning process. Thereafter, the $SiO_2$ films $32_1$ and $32_2$, the polysilicon film $36_1$ and the insulating film 15 are selectively removed by anisotropic etching such as RIE in which the resist film 24 is used as a mask. In this etching process, etching gas containing $CF_4/H_2$ is used for the $SiO_2$ films $32_1$ and $32_2$ and the $Si_3N_4$ film 15, and $CCl_4/O_2$ is used for the polysilicon film $36_1$. Thereby, an opening $23_2$ is formed. Then, as shown in FIG. 11C, an impurity-doped polysilicon film $36_2$ having a thickness of 1,000 [Å] is deposited on the entire surface of the $SiO_2$ film $32_2$ by CVD or LPCVD. Thereafter, by using a resist film (not shown) as a mask, the polysilicon film $36_2$, the $SiO_2$ film $32_2$ and the polysilicon film $36_1$ are subjected to the patterning process by anisotropic etching such as RIE, as shown in FIG. 11D. Then, remaining portions of the $SiO_2$ film $32_1$ and $32_2$ are completely removed by isotropic etch in which a liquid containing hydrogen fluoride (HF) is used. Thereby the storage electrode 36 having the structure shown in FIG. 11E is formed. The lower film $36_1$ is connected to an elevationally extending portion 36' of the upper film $36_2$. There is formed a gap $34_1$ between the lower film $36_1$ and the insulating film 15 so as to surround the storage electrode 36. Also there is formed a gap $34_2$ between the films $36_1$ and $36_2$ so as to surround the storage electrode 36. In the case where the insulating film 15 is a $SiO_2$ film, and films $36_1$ and $36_2$ are formed by $Si_3N_4$ films, phosphorus acid ($PH_3PO_4$) etching is used. Then, the entire surface of the storage electrode 36 is subjected to the thermal oxidation process, and thereby the dielectric film 37 is formed thereon, as shown in FIG. 11F. Thereafter, as shown in FIG. 11G, an impurity-doped polysilicon film 38 is deposited on the Si substrate 11 of FIG. 11F and is then subjected to the patterning process. Thereby the opposed electrode 38 is formed. In the deposition of the polysilicon film 38, the gaps $34_1$ and $34_2$ can be completely filled by growing the film in a low-pressure atmosphere lower than 10 [torr]. Thereafter, the insulating film 19 made of phosphosilicate glass, for example, is formed on the entire surface of the Si substrate 11, and the contact window 14a is formed by CVD and photolithography technology. Finally, the bit line 20 made of aluminum (Al), for example, is formed on the insulating film 19 by vacuum evaporation and photolithography technology.

Figure 10B:
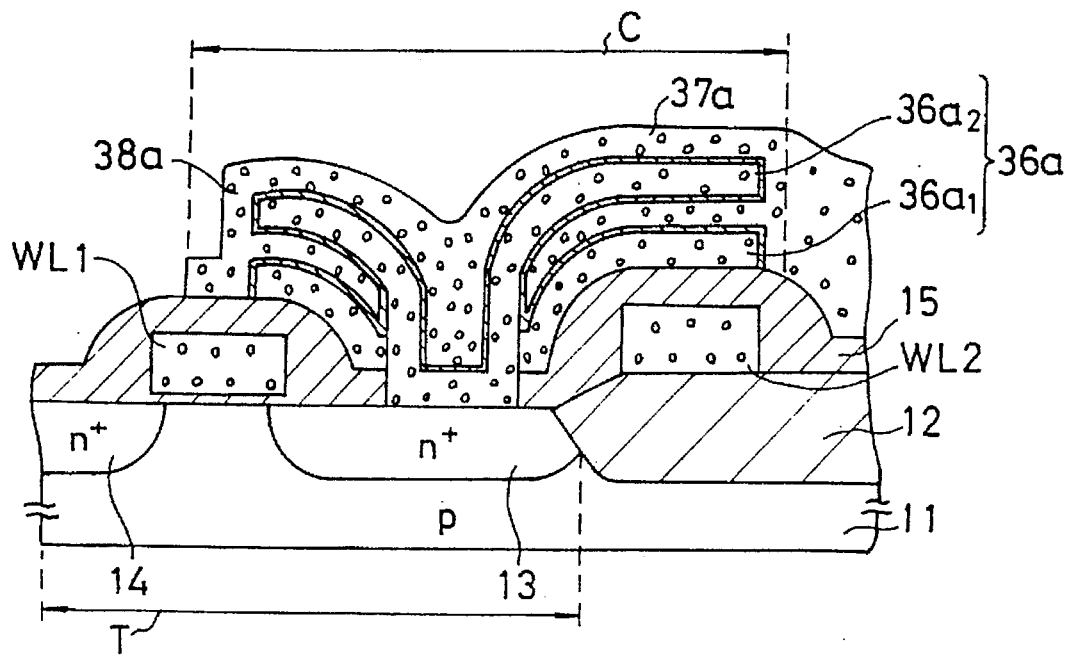
FIG. 10B is an elevational cross sectional view of a variation the third embodiment of FIG. 10B.

A variation of the DRAM device shown in FIG. 10A is illustrated in FIG. 10B. The variation is different from the DRAM cell of FIG. 10A in that a lowermost polysilicon film of a storage capacitor 36a is formed directly on the $SiO_2$ film 15. A capacitance which can be obtained by the structure of FIG. 10B is slightly reduced, compared with the capacitance obtained by the structure of FIG. 10A. However, the number of steps of the production process for the DRAM of FIG. 11B can be reduced, as will be seen from the following description.

Figure 12:
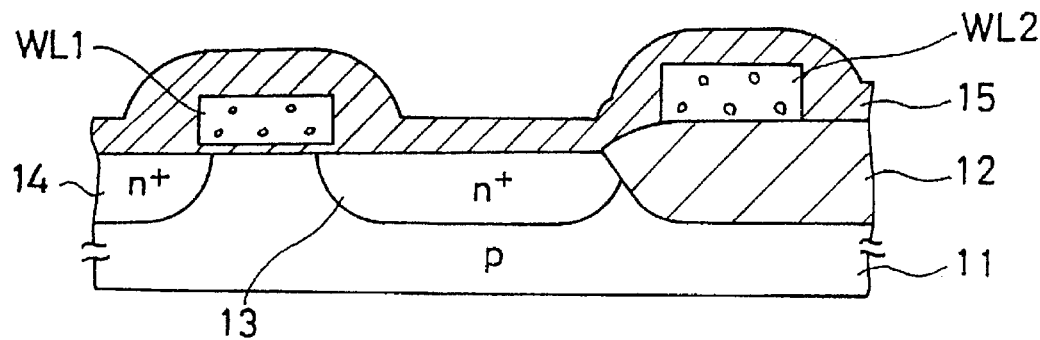
FIGS. 12A through 12G are elevational cross sectional views showing steps of a process for producing the variation of the third embodiment.
Figure 12:
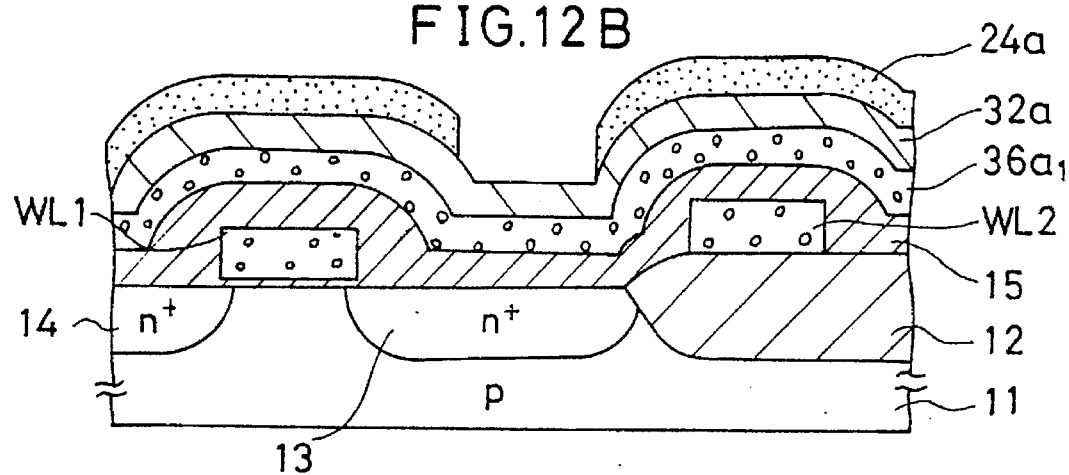
Figure 12:
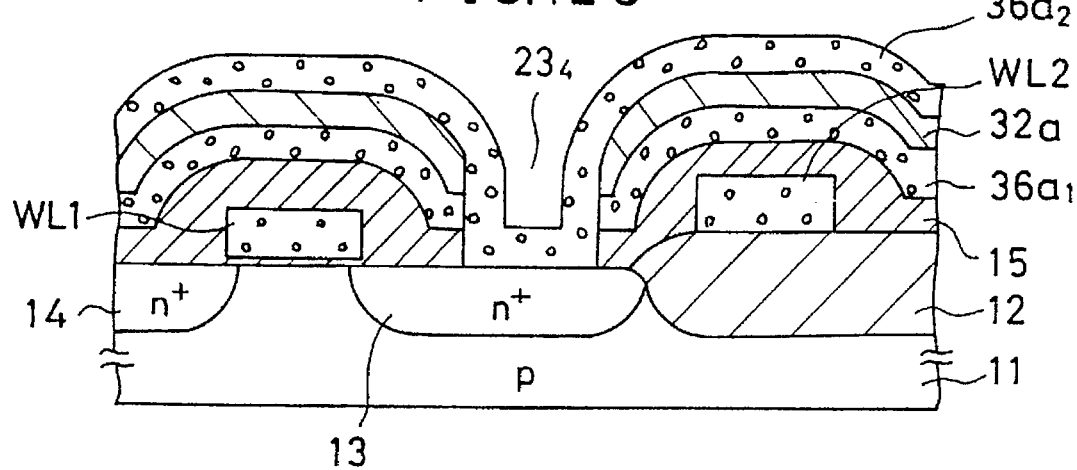
Figure 12D:
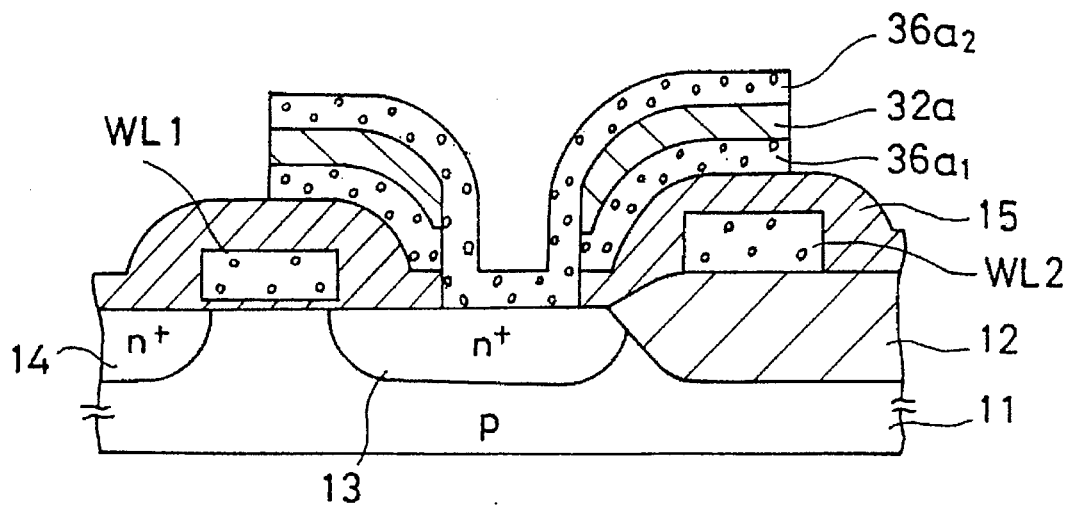
Figure 12E:
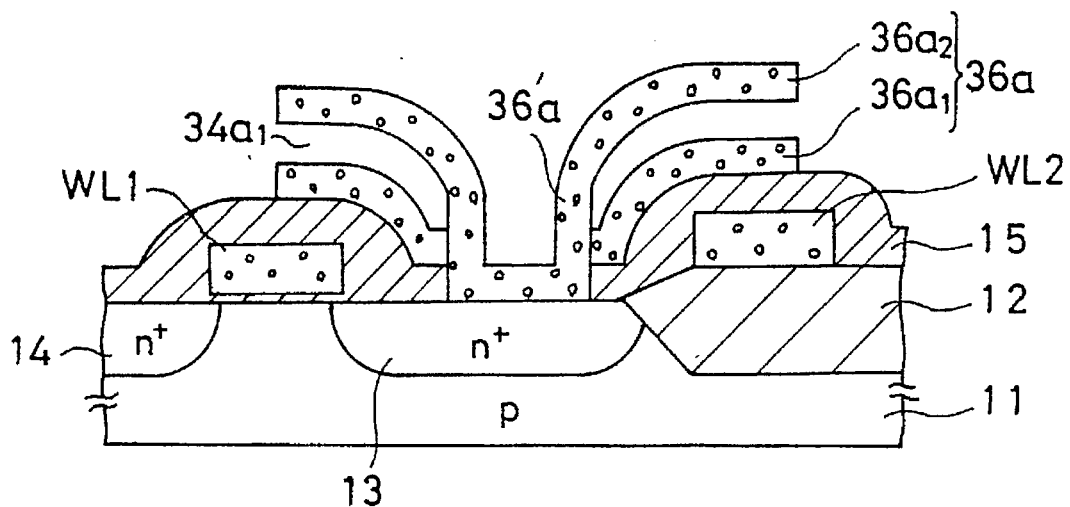
Figure 12F:
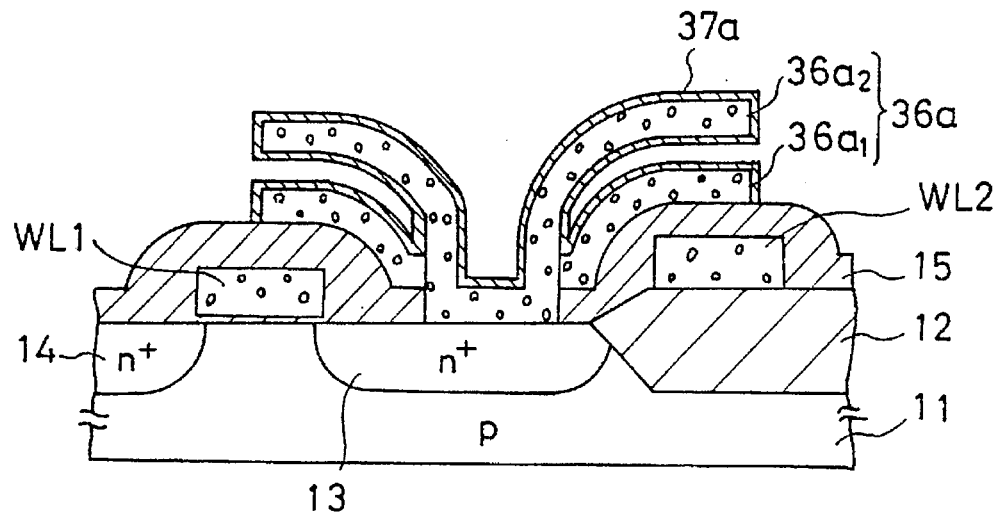
Figure 12G:
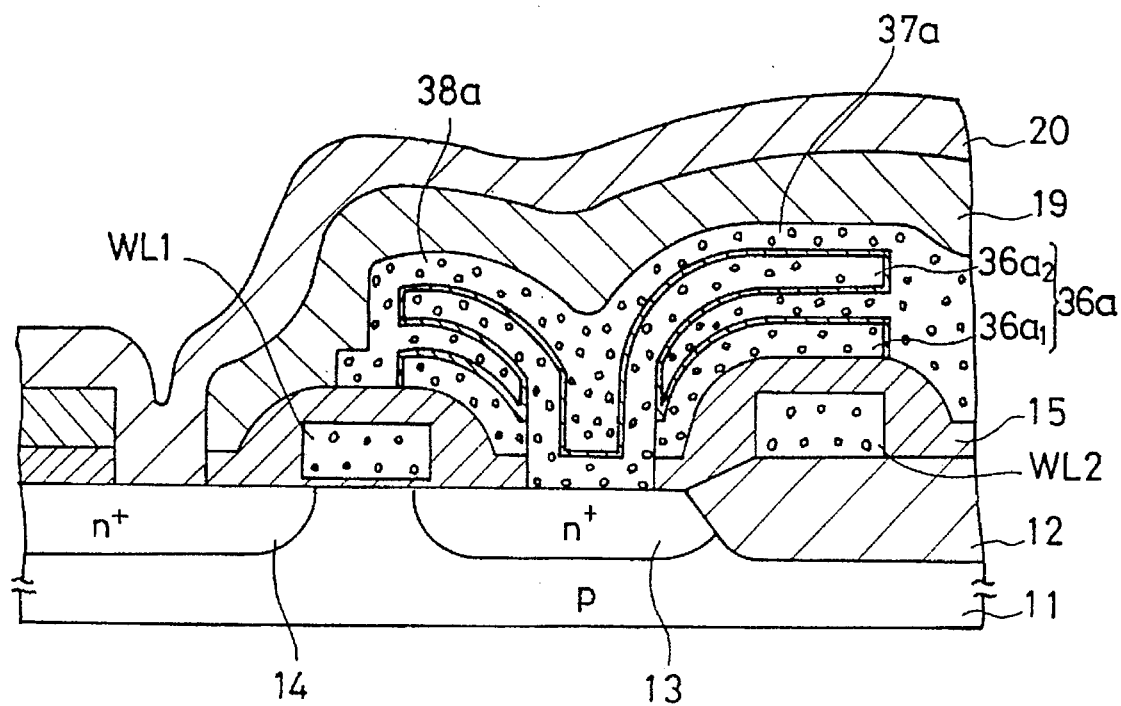

A structure shown in FIG. 12A is formed by a processes which are the same as those described before with reference to FIG. 6A. Then an impurity-doped polysilicon film $36a_1$ and a $SiO_2$ film 32a are successively deposited on the Si substrate 11 by low-pressure CVD. Each of the polysilicon film $36a_1$ and the $SiO_2$ film 32a has a thickness of 1,000 [Å], for example. This process for forming the polysilicon film $36a_1$ and 32a may be repetitively carried out as necessary. Then, as shown in FIG. 12B, the resist film 24a is formed on the entire surface of the $SiO_2$ film 32a and is then subjected to the patterning process. Thereafter, by using the resist film 24a as a mask, the $SiO_2$ film 32a, the polysilicon film $36a_1$ and the $Si_3N_4$ film 15 are selectively removed by anisotropic etching such as RIE. Thereby, an opening $23_4$ is formed. In this process, $CF_4/H_2$ gas is used for the $SiO_2$ film 32a and the $Si_3N_4$ film 15, and $CCl_4/O_2$ gas is used for the polysilicon film $36a_1$. Subsequently, as shown in FIG. 12C, an impurity-doped polysilicon film $36a_2$ having a thickness of approximately 1,000 [Å] is deposited on the entire surface of the $SiO_2$ film 32a having the opening $23_4$ by CVD or LPCVD. Then by using a resist film (not shown) as a mask, as shown in FIG. 12D, the polysilicon film $36a_2$, the $SiO_2$ film 32a and the polysilicon film $36a_1$ are subjected to the patterning process by anisotropic etching such as RIE. Thereafter, A remaining portion of the $SiO_2$ film 32a is completely removed by isotropic etching in which an HF liquid or the like is used, so that the storage capacitor 36a shown in FIG. 12E is obtained. As shown, the upper film has an elevationally extending portion 36a'. And, there is formed a gap $34a_1$ between the adjacent films $36a_1$ and $36a_2$ so as to surround the storage electrode 36a. Thereafter, the exposed surface of the storage capacitor 36a is subjected to the thermal oxidation process, and thereby a dielectric film 37a is formed thereon. Steps following the step shown in FIG. 12F are the same as those in the previous embodiments. FIG. 12G illustrates one completed cell of the DRAM device.

Figure 13A:
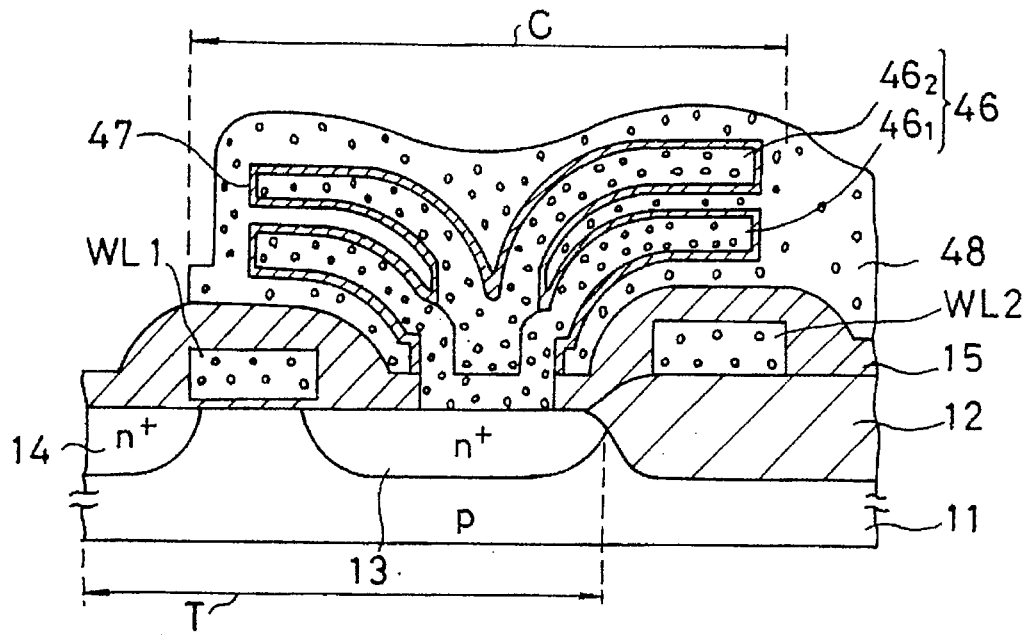
FIG. 13A is an elevational cross sectional view of a fourth embodiment of the present invention.

A description is given of a fourth embodiment of the present invention with reference to FIG. 13A. A storage electrode 46 of the embodiment of FIG. 13A has an essential feature such that an upper polysilicon film out of adjacent films is mounted directly on a lower polysilicon film of the adjacent films above the drain region 13. This feature is distinct from the feature of the third embodiment.

Figure 14A:
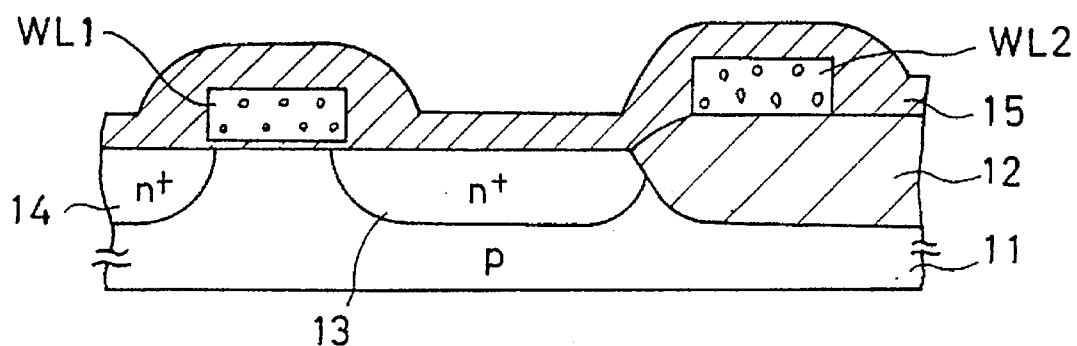
FIG. 14A through 14I are elevational cross sectional views showing steps of a process for producing the fourth embodiment of FIG. 13A.
Figure 14B:
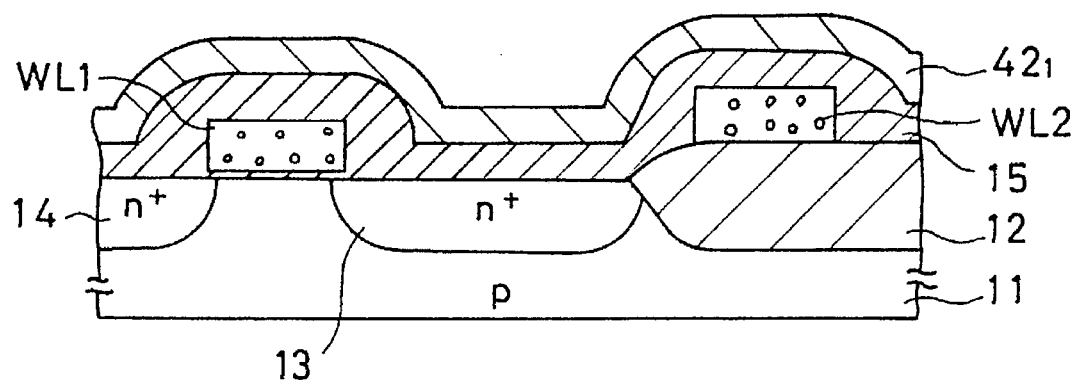
Figure 14C:
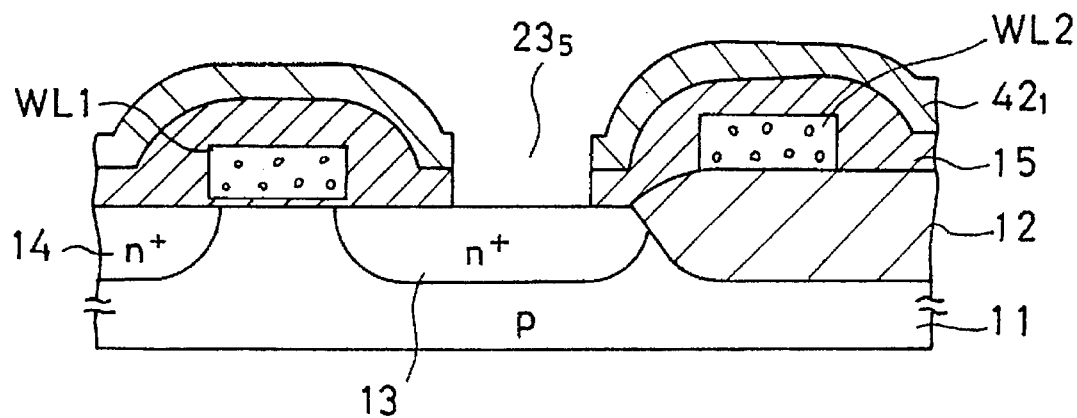
Figure 14D:
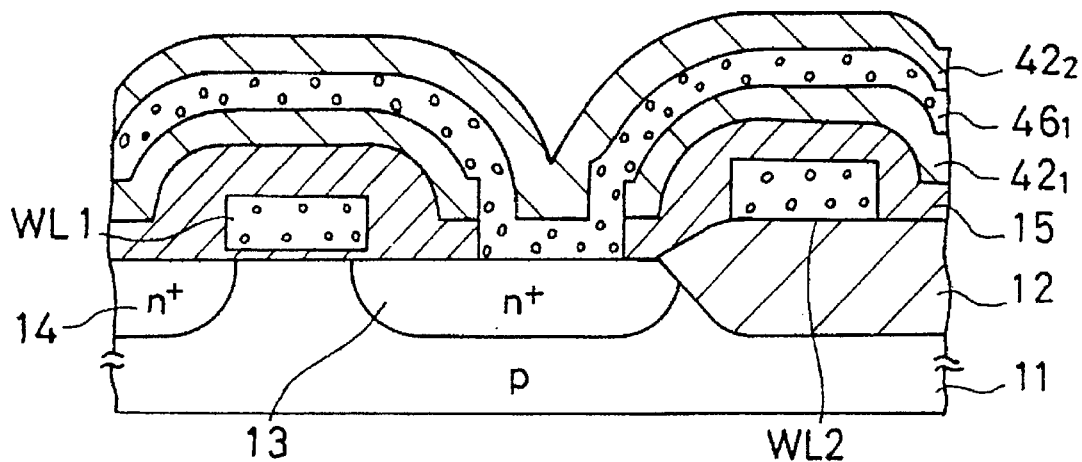
Figure 14E:
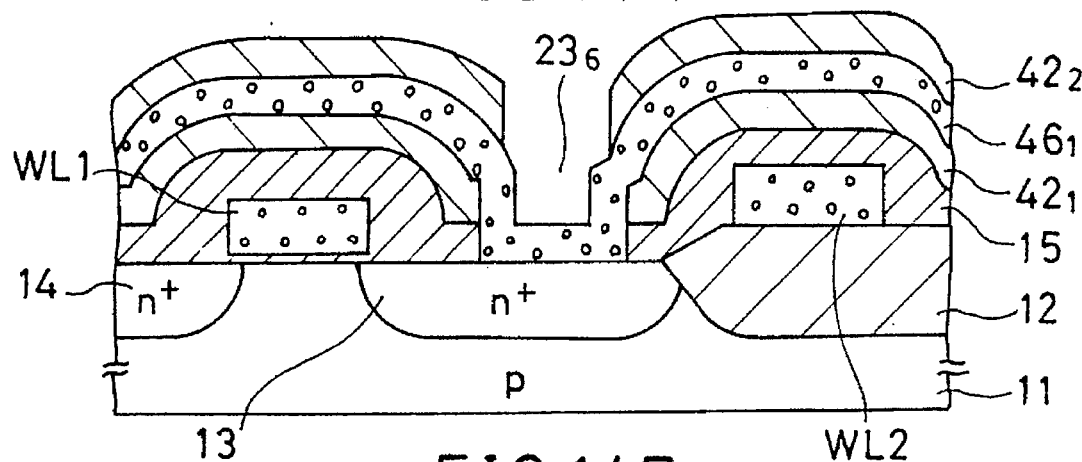
Figure 14F:
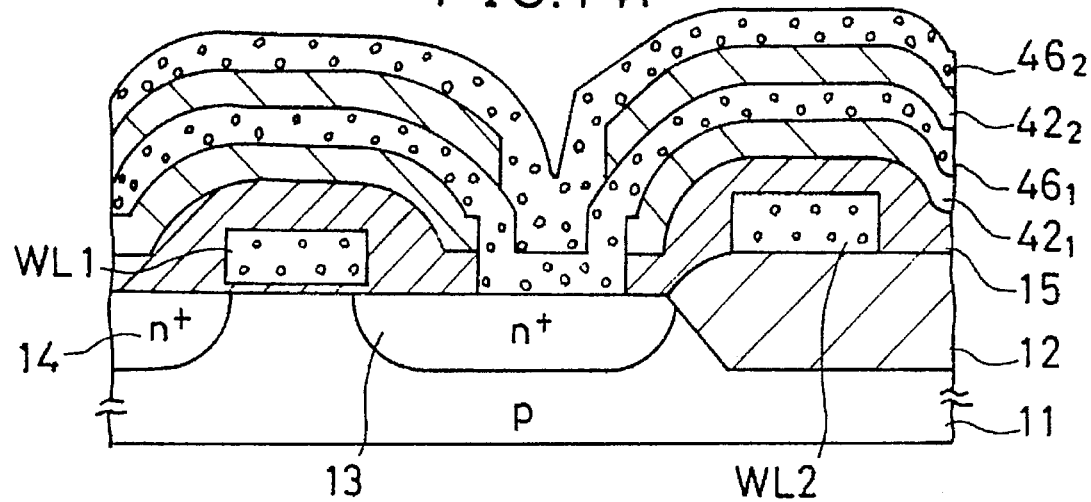

The DRAM cell of FIG. 13A can be produced in accordance with steps shown in FIGS. 14A through 14I. First, a structure shown in FIG. 14A is produced by processes which are the same as those described previously by referring to FIG. 4A. Successively, as shown in FIG. 14B, a $SiO_2$ film $42_1$ having a thickness of approximately 1,0001 [Å] is deposited on the entire surface of the insulating film 15 by CVD or LPCVD, as described previously with reference to FIG. 7B. Then an opening $23_5$ is formed by a process which is identical to the process described before with reference to FIG. 7C. Thereafter, as shown in FIG. 14D, an impurity-doped polysilicon film $46_1$ is deposited on the entire surface of the insulating film 15 having the opening $23_5$ by CVD or LPVVD. The polysilicon film $46_1$ has a thickness of 1,000 [Å], for example. Subsequently, as shown in FIG. 14D, a $SiO_2$ film $42_2$ is deposited on the entire surface of the polysilicon film $46_1$ by CVD or LPCVD. The $SiO_2$ film $42_2$ has an almost a thickness identical to that of the polysilicon film $46_1$. Then, as shown in FIG. 14E, an opening $23_6$ is formed in the $SiO_2$ film $42_2$ by reactive ion etching (RIE) in which $CF_4/H_2$ gas is used. A bottom of the opening $23_6$ is the surface of the polysilicon film $46_1$. Thereafter, as shown in FIG. 14F, an impurity-doped polysilicon film $46_2$ having a thickness of approximately 1,000 [Å] is deposited on the entire surface of the $SiO_2$ film $42_2$ having the opening $23_6$ by CVD or LPCVD.

Figure 14G:
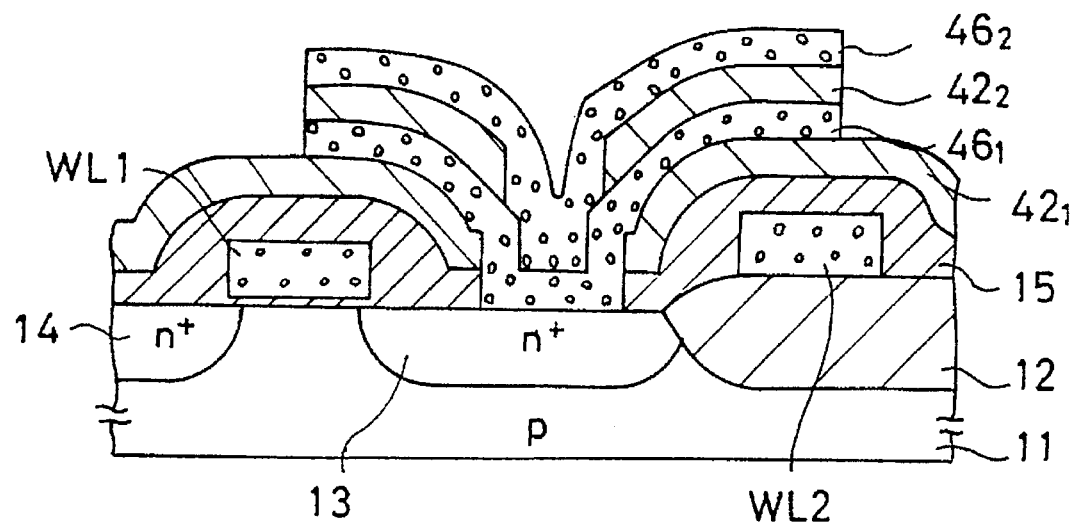
Figure 14H:
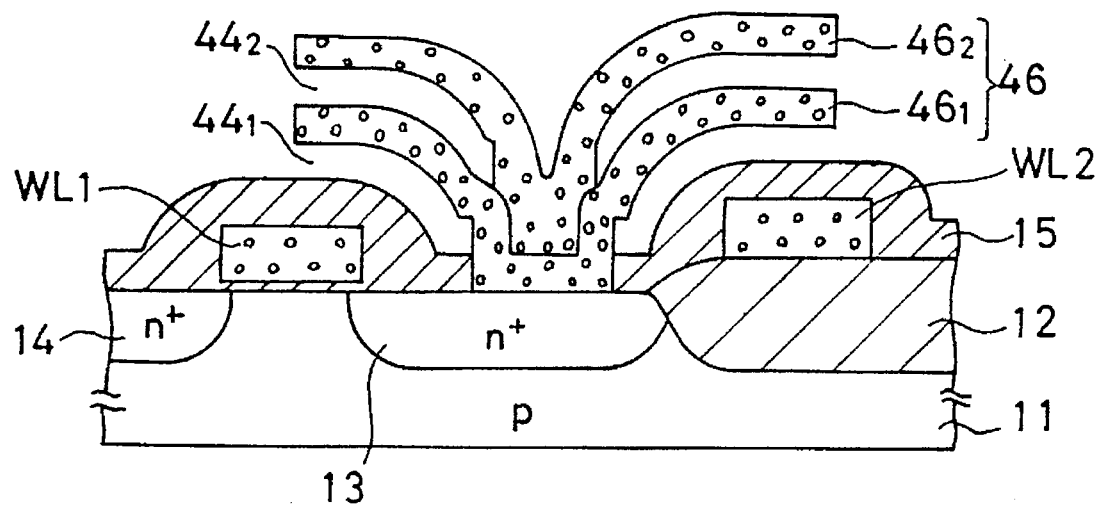
Figure 14:
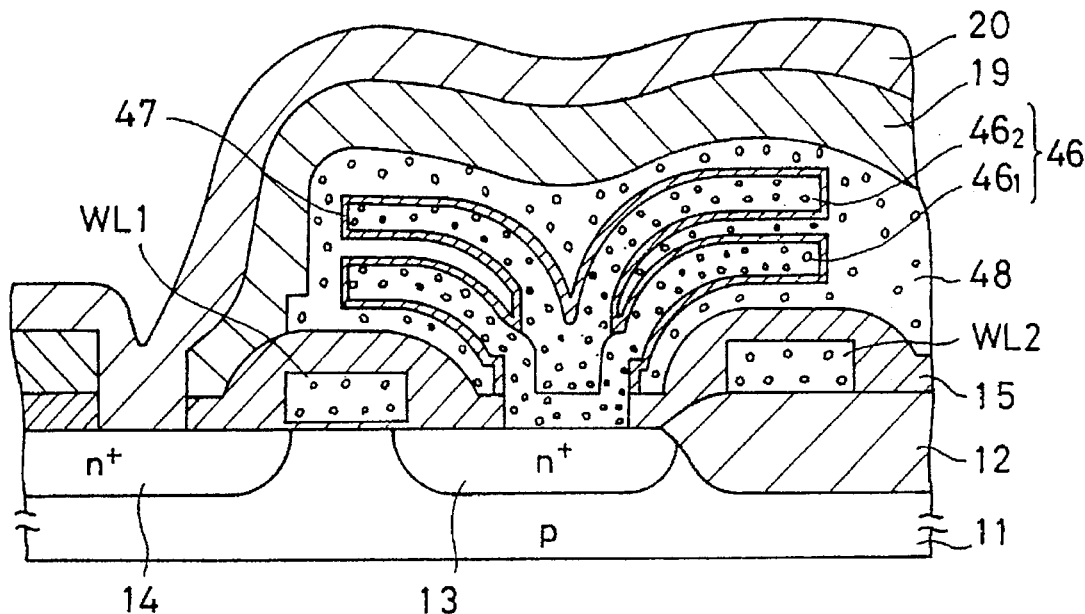

Then, as shown in FIG. 14G, the $SiO_2$ film and $42_2$ and the polysilicon films $46_1$ and $46_2$ are subjected to the patterning process using reactive ion etching (RIE), in which a resist film (not shown) is used as a mask. Subsequently, as shown in FIG. 14H, a remaining portion of the $SiO_2$ films are completely removed by isotropic etching in which a liquid containing HF is used. Thereby, the storage electrode 46 having a structure shown in FIG. 14H is formed. As illustrated, there is formed a gap $44_1$ between the insulating film 15 and the lower polysilicon film $46_1$ so as to surround the storage electrode 46. Also there is formed a gap $44_2$ between the films $46_1$ and $46_2$ so as to surround the storage electrode 46. Then, the entire exposed surface of the storage electrode 46 is subjected to the thermal oxidation process, and thereby the dielectric film 47 is formed thereon, as shown in FIG. 14I. Subsequent steps are the same as those for the DRAM cell shown in FIG. 6A, and thereby an opposed electrode 48, the insulating film 19 and bit line 20 are formed.

Figure 13B:
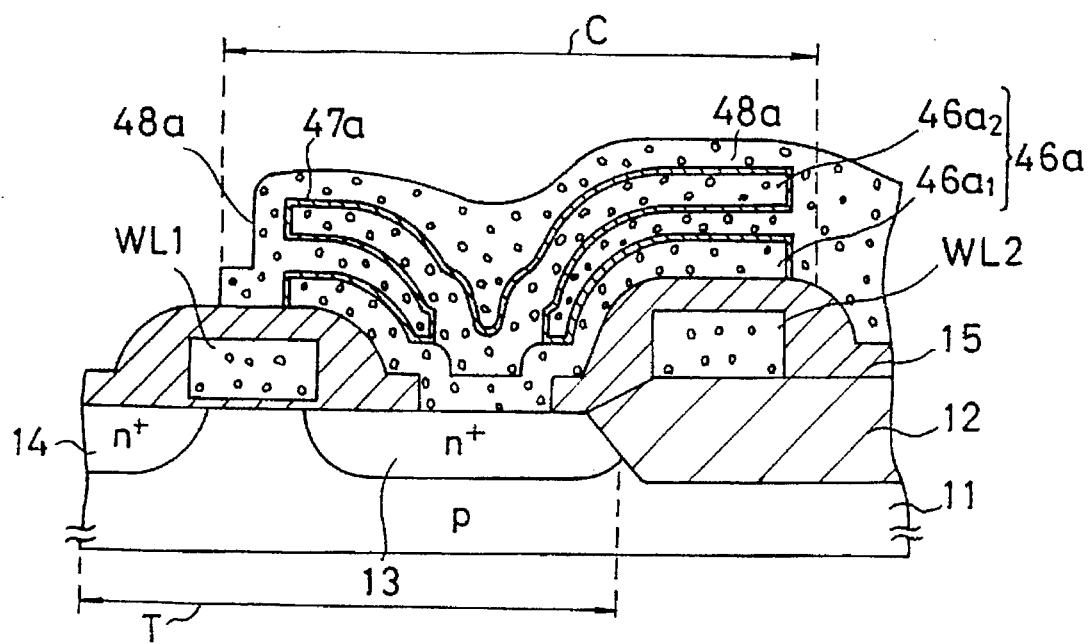
FIG. 13B is an elevational cross sectional view of a variation of the fourth embodiment.

A variation of the fourth embodiment of FIG. 13A is illustrated in FIG. 13B. The variation is different from the embodiment of FIG. 13A in that a lowermost polysilicon film of a storage electrode 46a of FIG. 13B is formed directly on the insulating film 15.

Figure 15A:
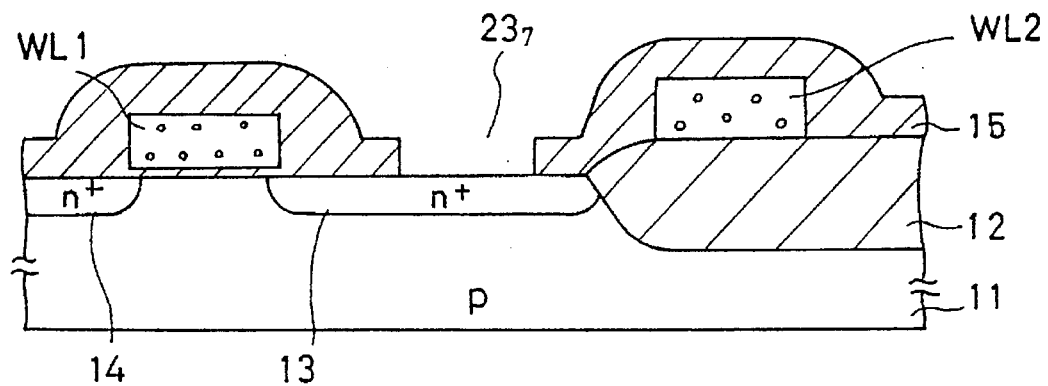
FIGS. 15A through 15G are elevational cross sectional views showing steps of a process for producing the variation of the fourth embodiment.
Figure 15B:
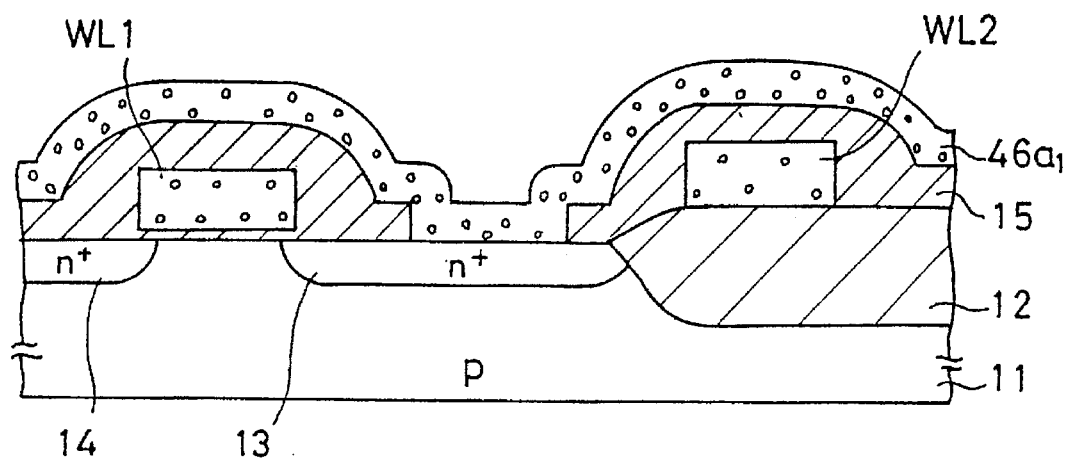
Figure 15C:
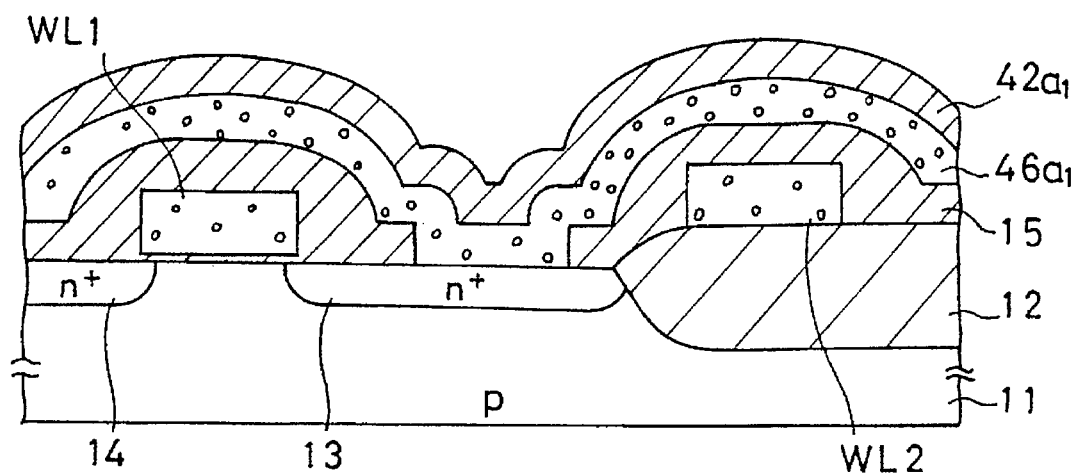
Figure 15D:
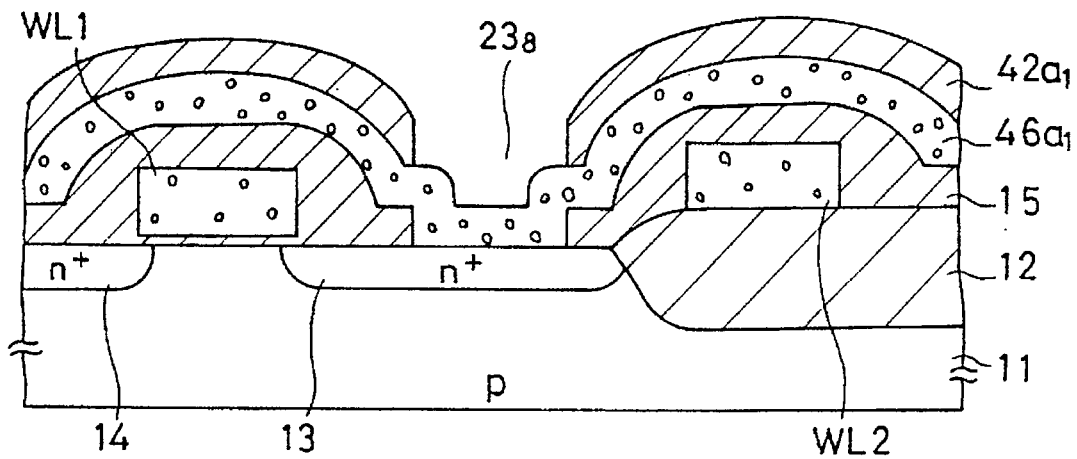
Figure 15E:
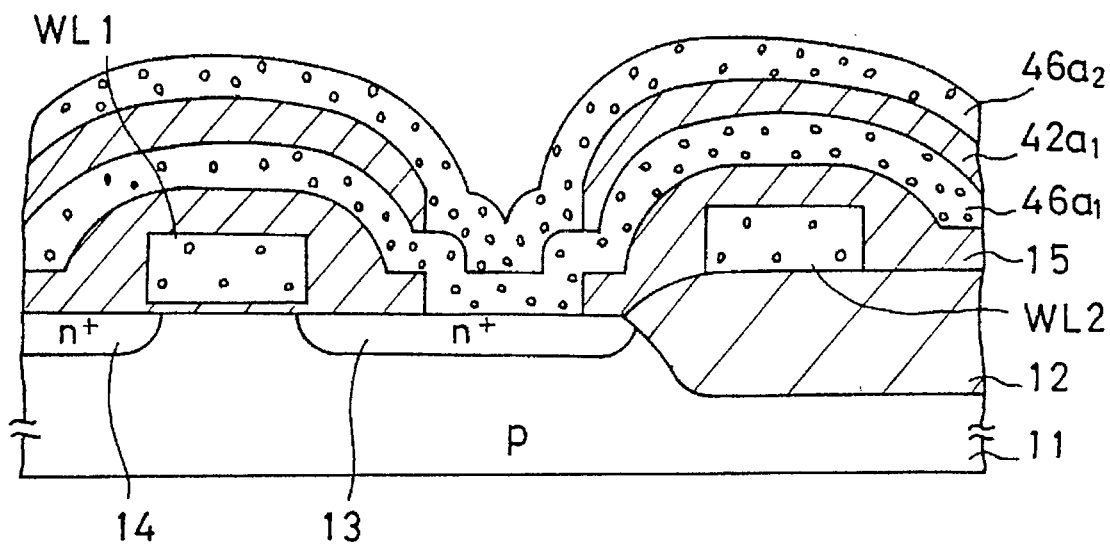
Figure 15F:
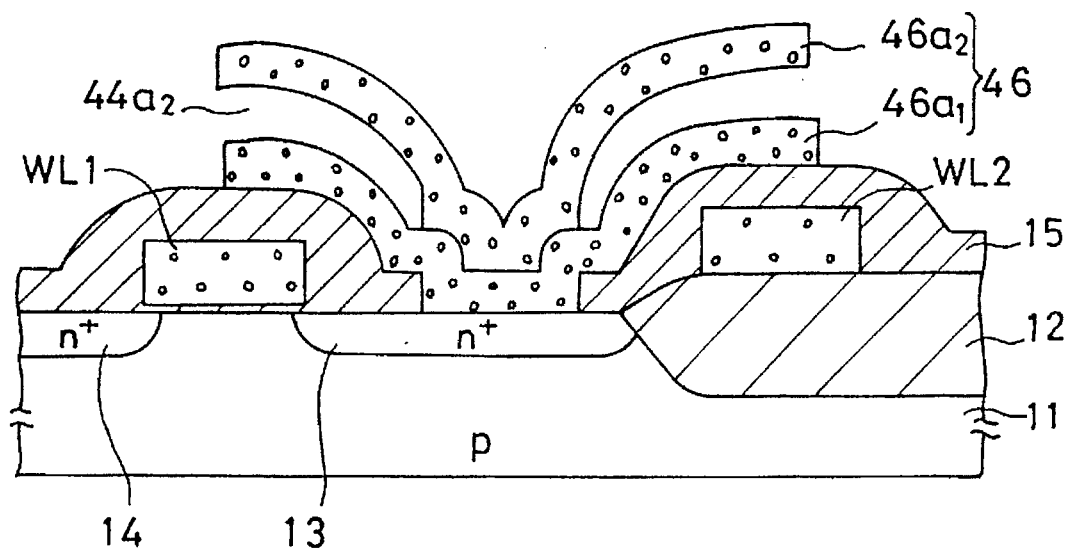
Figure 15G:
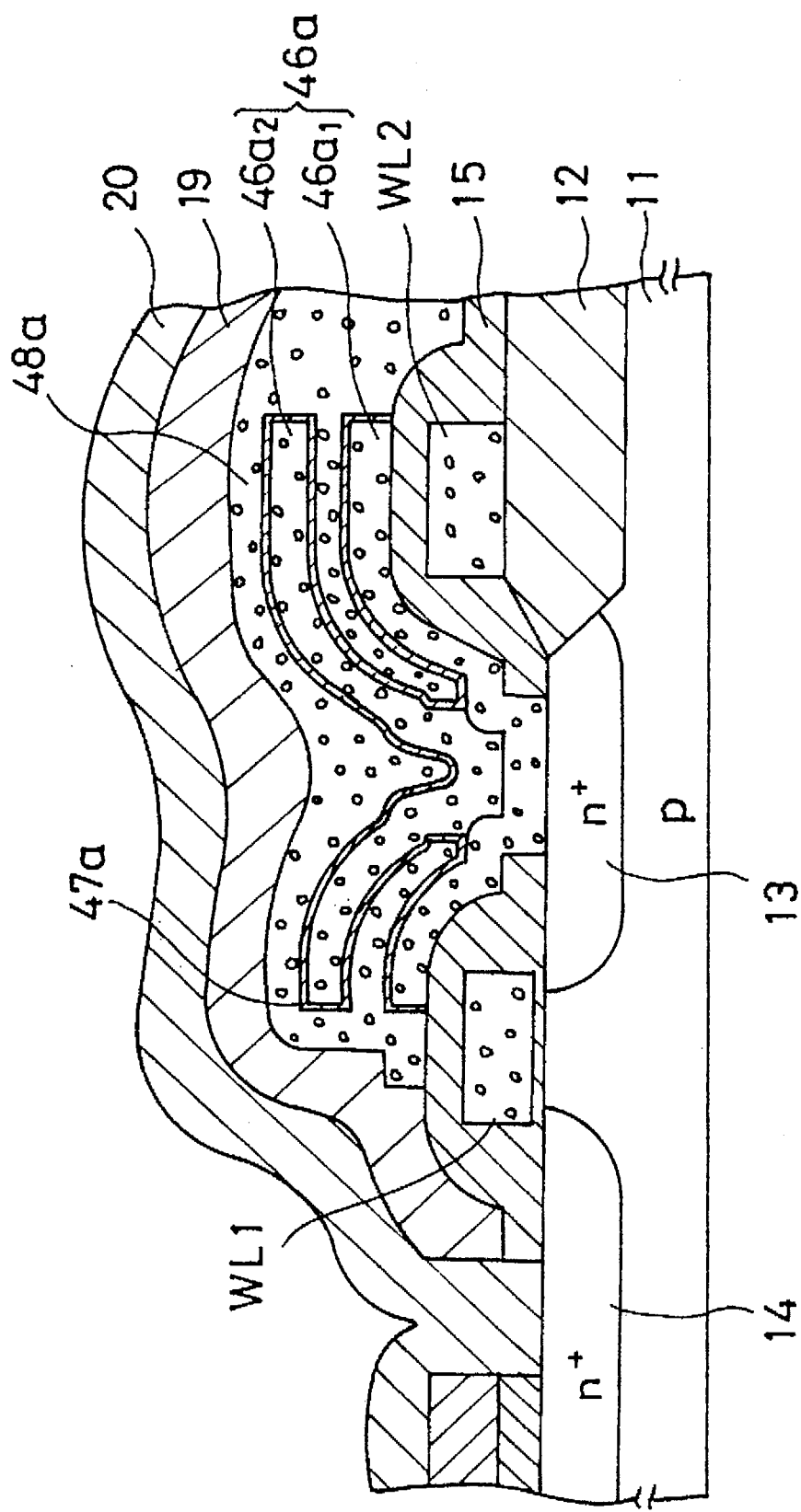

The variation of FIG. 13B can be produced by processes shown in FIGS. 15A through 15G. At first, the film structure identical to that shown in FIG. 6A is formed by the processes described before associated therewith. Then, as shown in FIG. 15A, the $Si_3N_4$ film 15 is selectively etched by anisotropic etching such as RIE wherein the resist film (not shown) is used. Thereby, an opening $23_7$ is formed in the $Si_3N_4$ film 15. The opening $23_7$ is used for the contact hole for establishing the connection with the drain region 13. Subsequently, an impurity-doped polysilicon film $46a_1$ having a thickness of approximately 1,000 [Å] is deposited on the entire surface of the substrate 11 of FIG. 15A. Next, as shown in FIG. 15C, a $SiO_2$ film $42a_1$ having a thickness of approximately 1,000 [Å] is deposited on the entire surface of the substrate 11 of FIG. 15B by CVD or LPCVD. Then, as shown in FIG. 15D, an opening $23_8$ is formed in the $SiO_2$ film $42a_1$ by RIE which uses $CF_4/H_2$ gas. Thereafter, an impurity-doped polysilicon film $46a_2$ having a thickness of approximately 1,000 [Å] is deposited on the entire surface of the $SiO_2$ film $42a_1$ having the opening $23_8$ by CVD or LPCVD. A sequence of steps of forming the bilayer structure consisting of the $SiO_2$ film $42a$ and the polysilicon film $46a_2$ and forming the opening $23_8$ may be repetitively carried out if desired. Next, the polysilicon film $46a_2$, $SiO_2$ film $42a_1$ and polysilicon film $46a_1$ are subjected to the patterning process by RIE. Thereafter, a remaining portion of the $SiO_2$ film $42a_1$ is completely removed by isotropic etching in which the HF liquid is used, so that as shown in FIG. 15F, the storage electrode 46a is formed. As illustrated, there is formed a gap $44a_2$ between the films $46a_1$ and $46a_2$ so as to surround the storage electrode 46a. It is to be noted that in this step, the insulating film 15 made of $Si_3N_4$ is not etched by the HF liquid. Thereafter, as shown in FIG. 15G, a dielectric film 47a, an opposed electrode 48a, the insulating film 19 and bit line 20 are formed in this order.

Figure 16A:
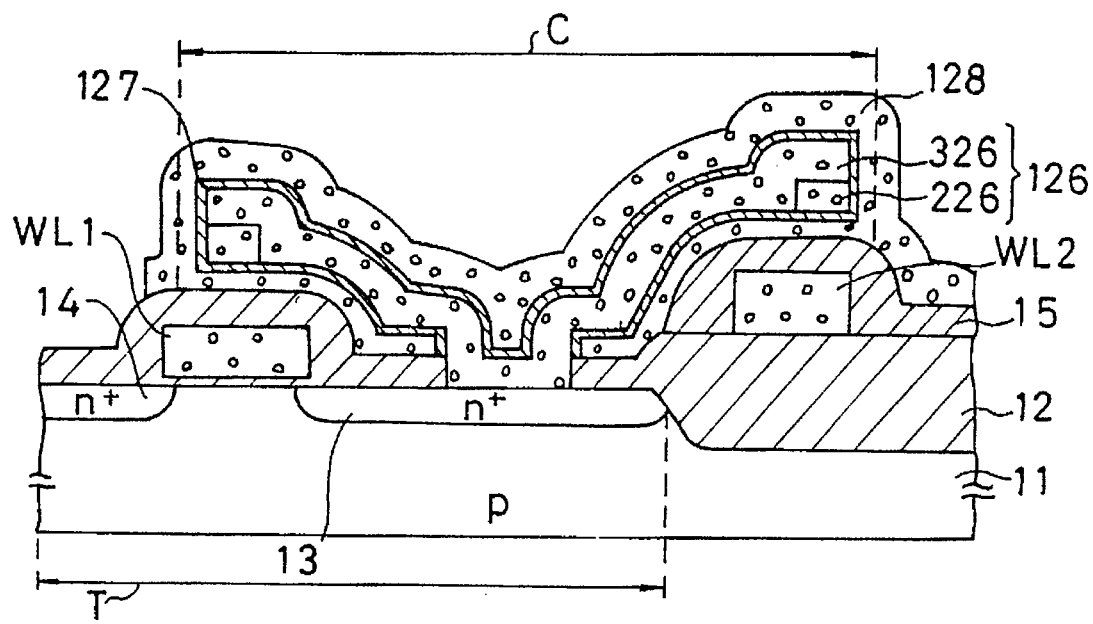
FIG. 16A is an elevational cross sectional view of a fifth embodiment of the present invention.

FIG. 16A shows a fifth embodiment of the present invention which is a modification of the second embodiment shown in FIG. 6A. One of the essential features of the fifth embodiment is that a storage electrode 126 is formed by a polysilicon film 226 and a polysilicon film 326 so that stepped portions are formed on the both sides of the elevational cross section of the storage electrode 126. The stepped portions contribute to a further increase in the capacitance of the storage capacitor, compared with the second embodiment shown in FIG. 6A.

Figure 17A:
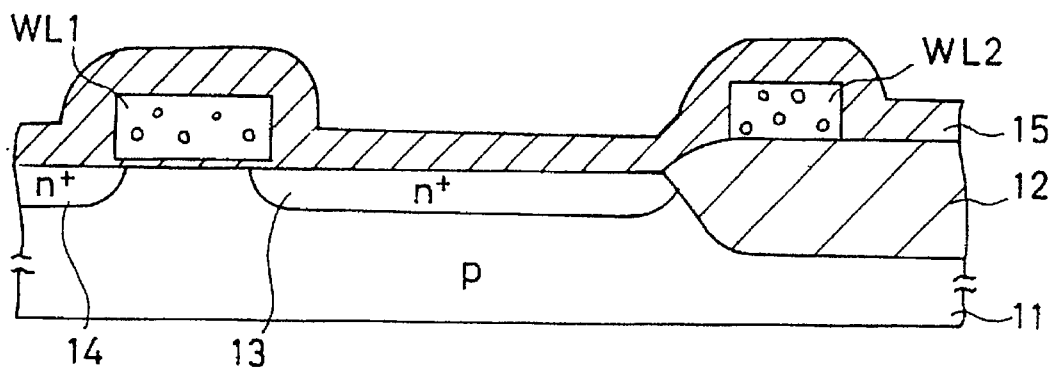
Figure 17B:
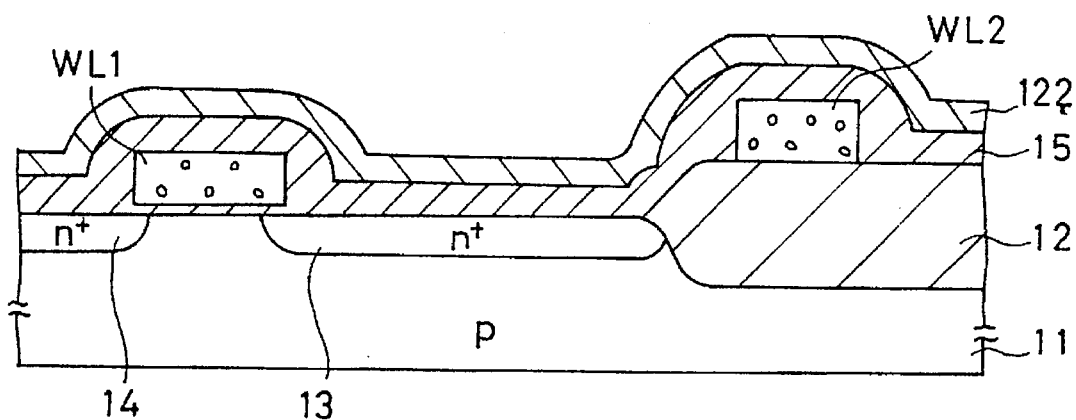
Figure 17C:
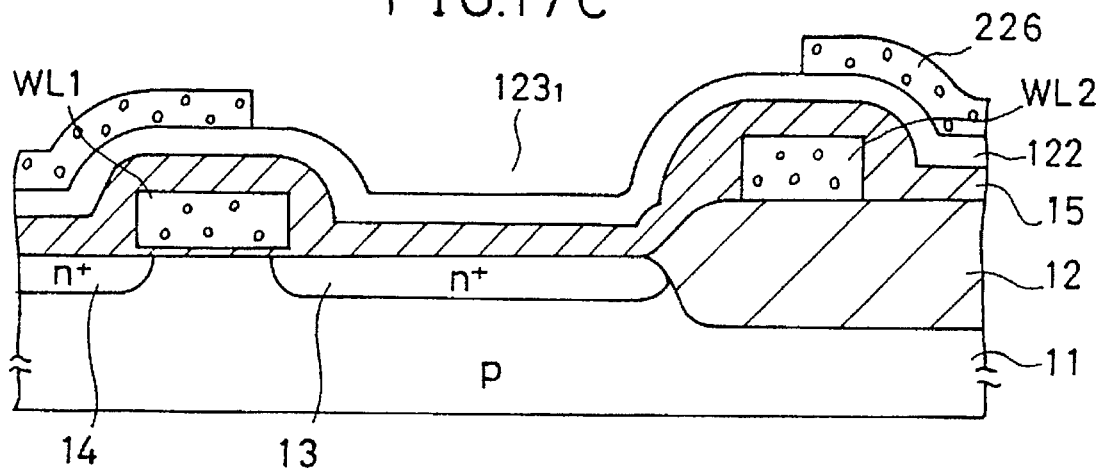

The DRAM cell of FIG. 16A can be produced by the following producing method. First, the layer structure shown in FIG. 17 is formed by processes which are the same as those described previously with reference to FIG. 6A. Next, a $SiO_2$ film 122 is formed on the entire surface of the $Si_3N_4$ film 15 by a process identical to that described before with reference to FIG. 7B. Thereafter, as shown in FIG. 17C, an impurity-doped polysilicon film 226 having a thickness of approximately 1,000 [Å] is deposited on the entire surface of the $SiO_2$ film 122 by CVD or LPCVD. Subsequently, the polysilicon film 226 is selectively removed by RIE in which the resist film (not shown) is used as a mask. Thereby, an opening $123_1$ which is wider than the n+-Impurity diffused region of drain region 13 is formed in the polysilicon film 226. The polysilicon film 226 is used for forming stepped portions located on the both sides of the elevational cross section of the storage electrode 126. Although the polysilicon film 226 has a thickness of approximately 1,000 [Å] described above, it is possible to form the polysilicon film 226 having a thickness of approximately 2,000 [Å]. In this case, a laser beam is projected on the polysilicon film 226 so as to form convex portions and recess portions thereon.

Figure 17G:
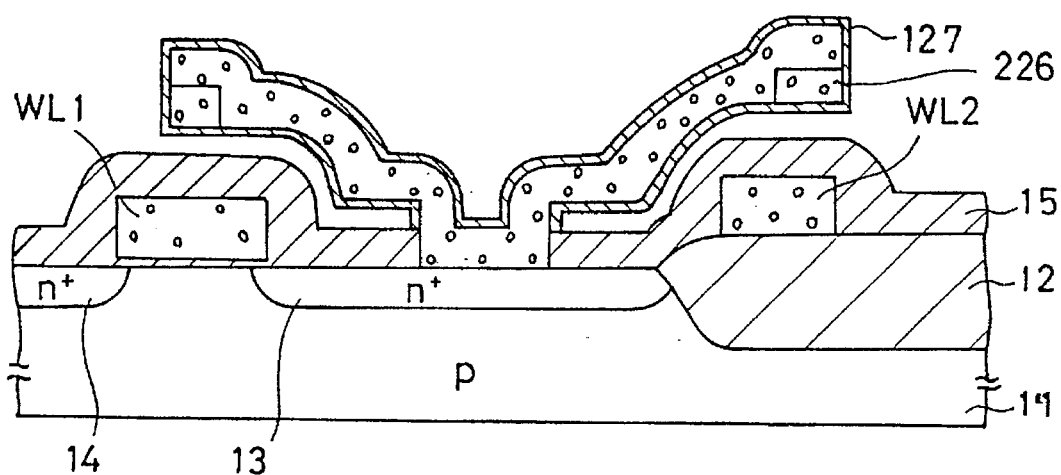
Figure 17H:
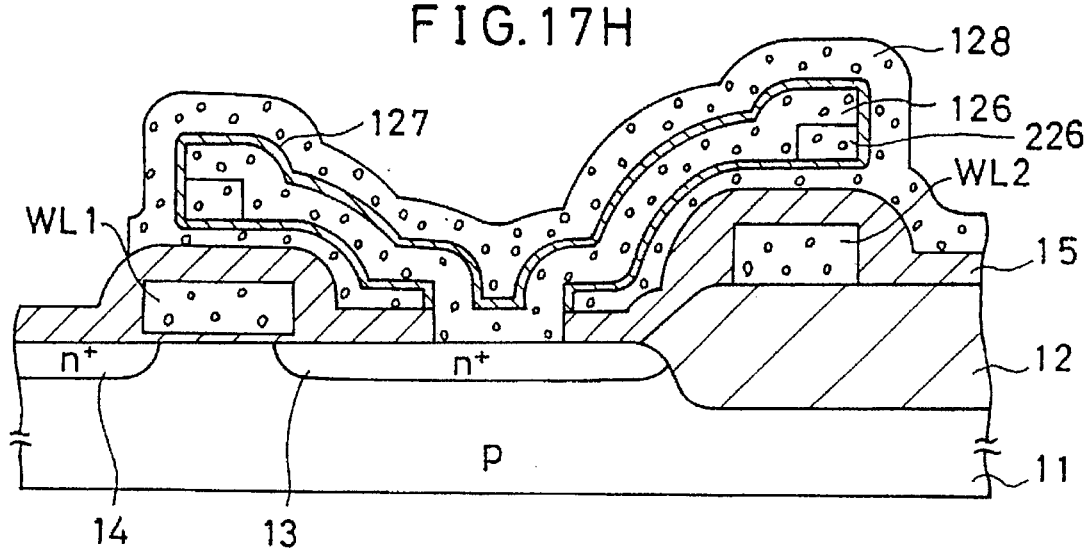
Figure 17I:
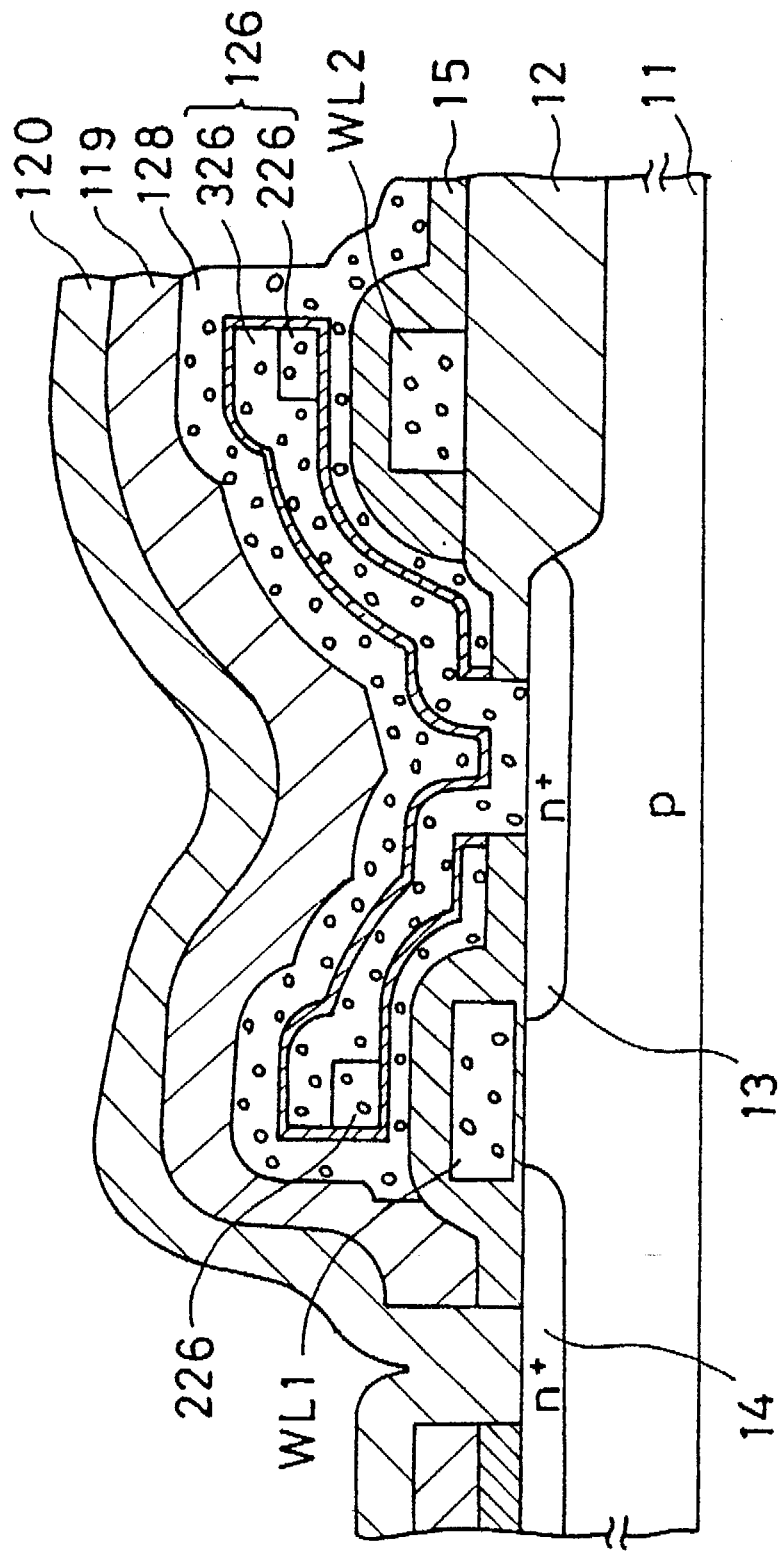

Thereafter, as shown in FIG. 17D, an opening $123_2$ which penetrates the $SiO_2$ film 122 and the $Si_3N_4$ film 15 is formed by anisotropic etching such as RIE in which the resist film (not shown) is used. The opening $123_2$ serves as a contact hole at which an electric contact between the storage electrode 126 and the drain region 13. Subsequently, as shown in FIG. 17E, an impurity-doped polysilicon film 326 having a thickness of approximately 1,000 [Å] is deposited on the entire surface of the substrate 11 shown in FIG. 17D by CVD or LPCVD, and is then subjected to the patterning process. Then, the $SiO_2$ film 122 is completely removed by isotropic etching using a liquid containing HF, so that the storage electrode 126 having the elevational cross section shown in FIG. 17F is formed. As illustrated, a gap 54 is formed between the insulating film 15 and the storage electrode 126 so as to surround the storage electrode 126. In the above etching step, the $Si_3N_4$ film 15 is not etched by the liquid containing HF. Thereafter, an exposed surface of the storage electrode 126 is subjected to the thermal oxidation process, and thereby is shown in FIG. 17G, a dielectric film 127 is formed so as to surround the the storage electrode 126. Next, an impurity-doped polysilicon film 128 is deposited on the entire surface of the substrate 11 of FIG. 17G, and is then subjected to the patterning process. Thereby, the opposed electrode 128 is formed. Finally, as shown in FIG. 17I, the insulating film 119 made of PSG for example, is formed on the entire surface of the Si substrate 11 by CVD or LPCVD, and then the bit line 120 made of Al is formed on the insulating film 119 by the vacuum evaporation and photolithography technology.

Figure 16B:
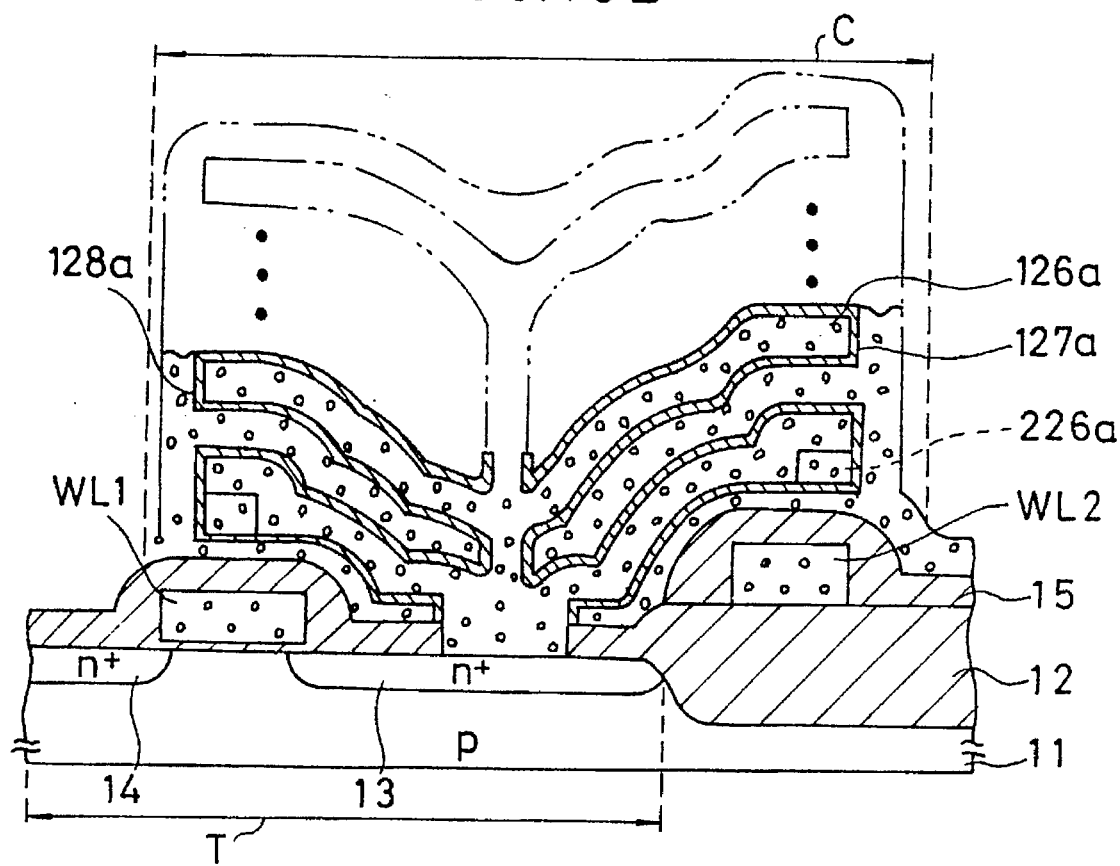
FIG. 16B is an elevational cross sectional view of a variation of the fifth embodiment of FIG. 16A.

FIG. 16B is a variation of the fifth embodiment of FIG. 16A. One of the essential features of the variation is that a storage electrode 126a is formed so as to have a plurality of stacked polysilicon films. A lowermost polysilicon film has stepped portions on the both sides of the elevational cross section of the storage electrode 126a. The stepped portions can be formed by a polysilicon film 226a.

The DRAM cell of FIG. 16B can be formed by the same process as that described before with reference to FIG. 8A through 8F except that before the polysilicon film $26a_1$ of FIG. 8A is formed, the polysilicon film 226a *is formed on the $SiO_2$ film $22_1$*, and an opening is formed therein as in the step shown in FIG. 17C.

Figure 18A:
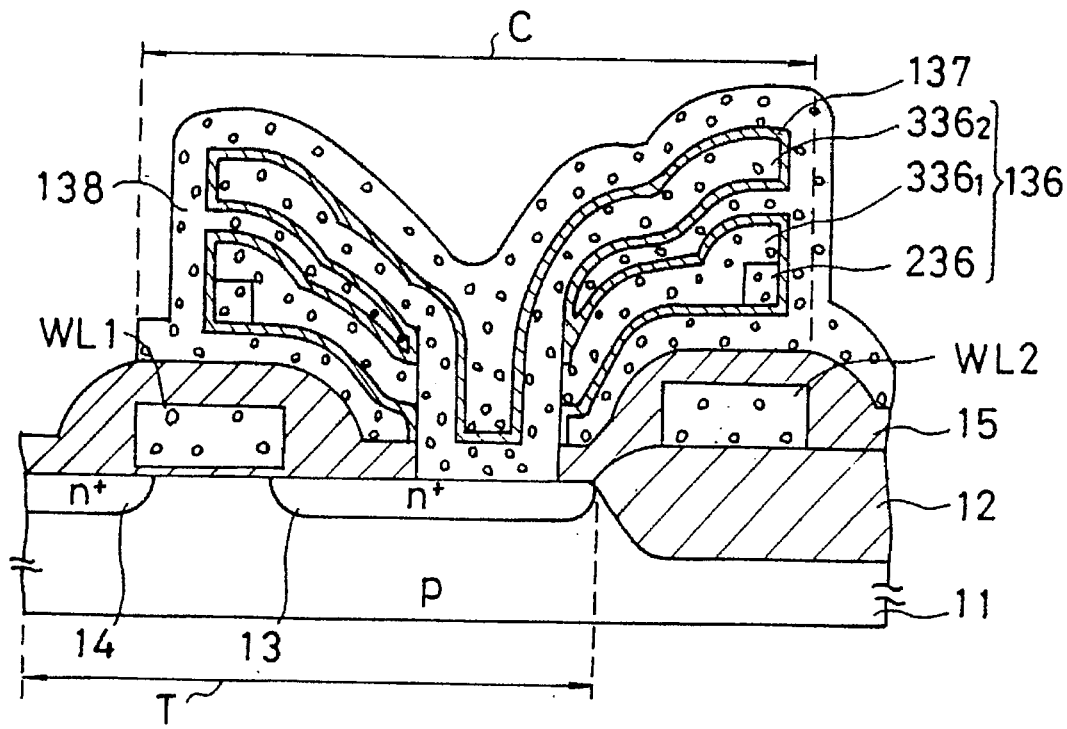
FIG. 18A is an elevational cross sectional view of a sixth embodiment of the present invention.
Figure 19A:
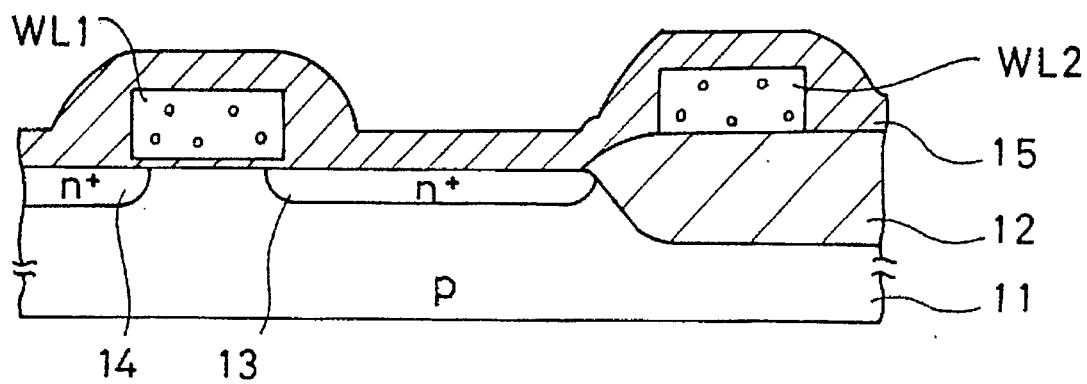
FIG. 19A through 19H are elevational views showing steps of a process for producing the sixth embodiment shown in FIG. 18A.
Figure 19B:
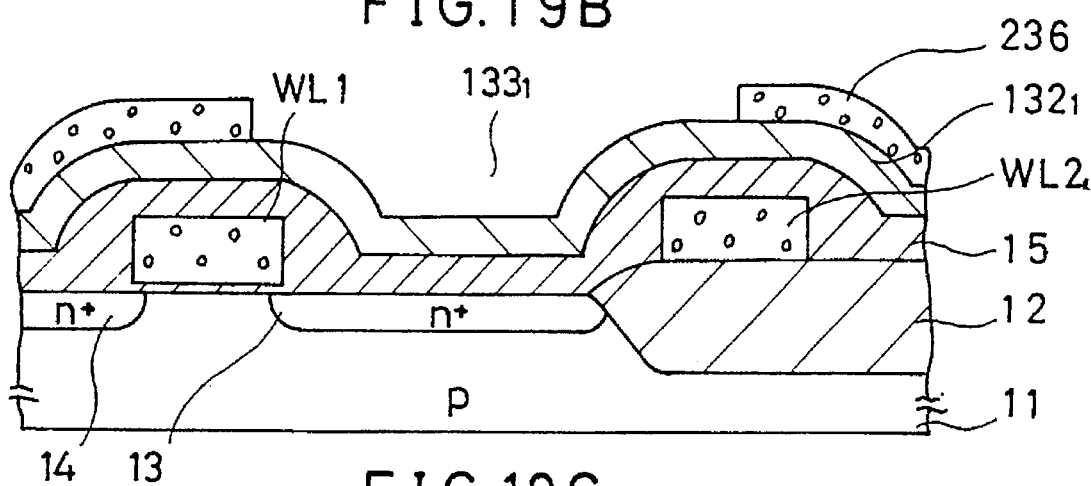

FIG. 18A is a sixth embodiment of the present invention. The sixth embodiment is a modification of the third embodiment of FIG. 10A. At first, the layer structure of FIG. 19A which is the same as that shown in FIG. 17A is formed. Next, a $SiO_2$ film 132 having a thickness of approximately 1,000 [Å] is formed on the entire surface of the $Si_3N_4$ 15 by CVD or LPCVD. Then, as shown in FIG. 19B, an impurity-doped polysilicon film 236 having a thickness of approximately 1,000 [Å] is deposited on the entire surface of the $SiO_2$ film 132 by CVD or LPCVD, and is then selectively removed by RIE, so that an opening $133_1$ which is wider than the drain region 13 is formed. Thereafter, as shown in FIG. 19C, an impurity-doped polysilicon film $336_1$ having a thickness of approximately 1,000 [Å] is deposited on the entire surface of the substrate 11 by CVD or LPCVD.

Figure 19C:
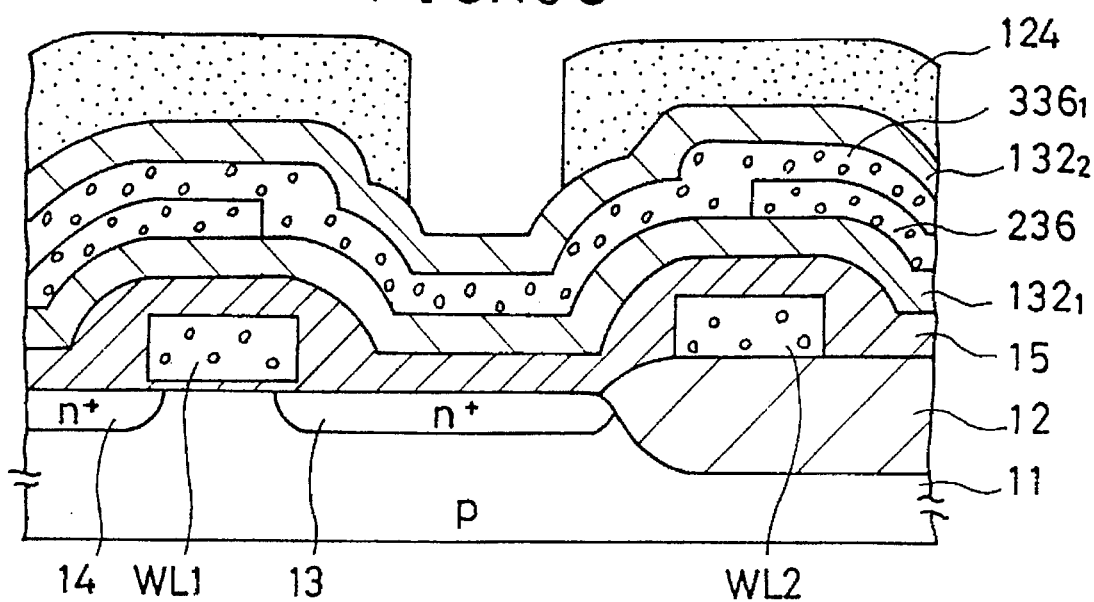

Subsequently, as shown in FIG. 19C, a $SiO_2$ film $132_2$ having a thickness of 1,000 [Å] is formed on the entire surface of the polysilicon film $336_1$ by CVD or LPCVD. The step for forming the bilayer structure consisting of the polysilicon film $336_1$ and the $SiO_2$ film $132_1$ may be repetitively carried out if desired.

Figure 19D:
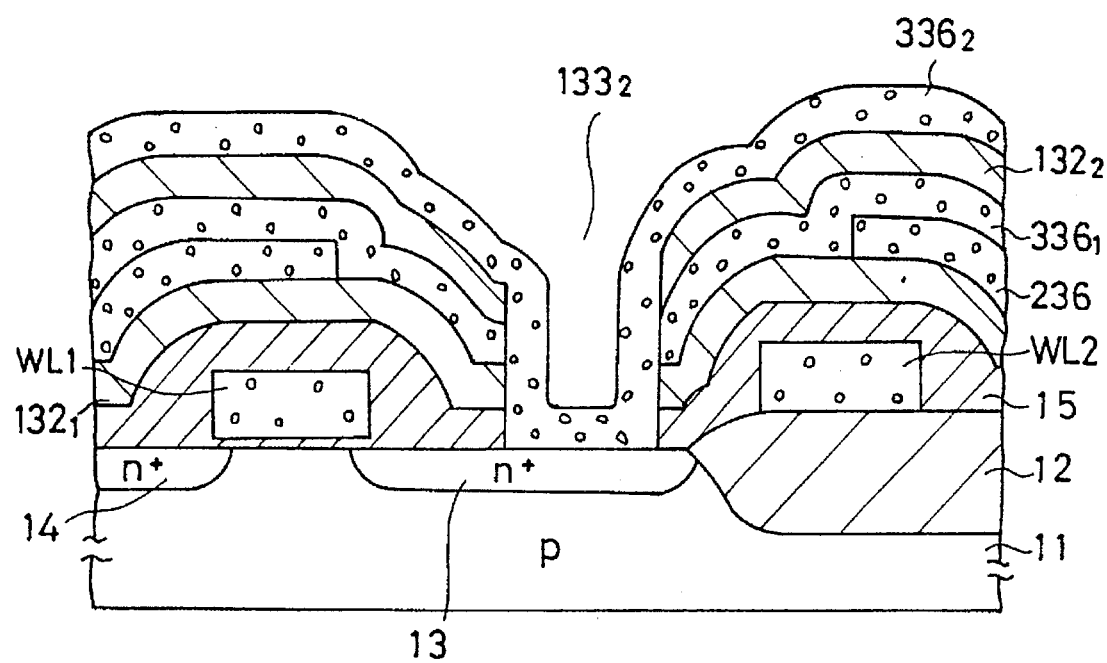
Figure 19E:
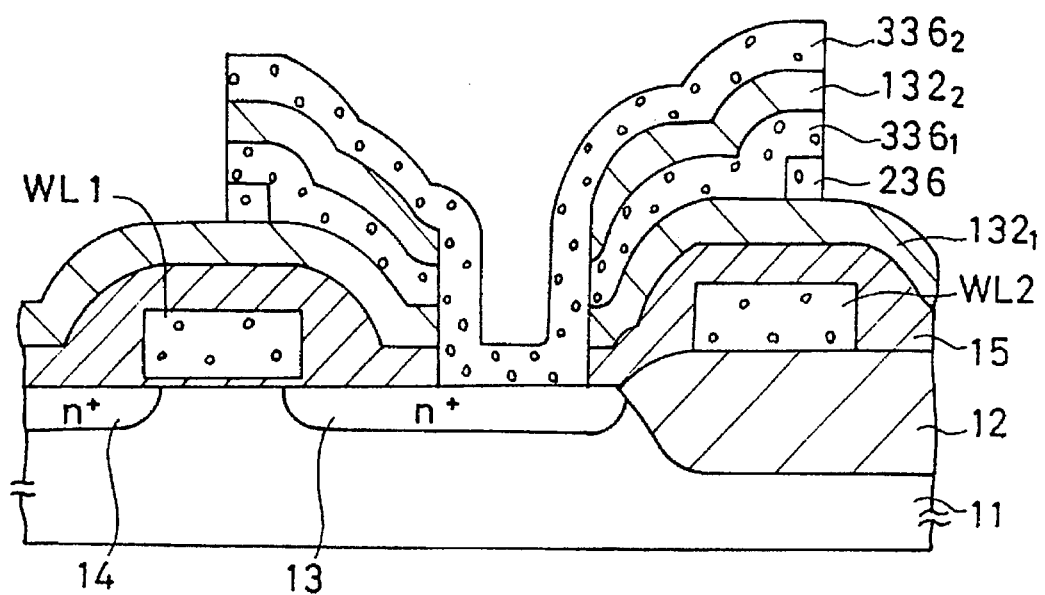

Then, a resist film 124 is formed on the entire surface of the $SiO_2$ film $132_1$ and is then subjected to the patterning process. Next, by using the resist film 124 as a mask, the $SiO_2$ film $132_2$, the polysilicon film $336_1$, the $SiO_2$ film $132_1$ and the $Si_3N_4$ film 15 are selectively etched by anisotropic etching such as RIE. In the etching process, etching gas containing $CF_4/H_2$ is used for etching the $SiO_2$ films $132_1$ and $132_2$ and the $Si_3N_4$ film 15, and etching gas containing $CCl_4/O_2$ is used for etching the polysilicon film $336_1$. Thereby as shown in FIG. 19D, an opening $132_2$ which penetrates the above stacked films is formed. Subsequently, the as shown in FIG. 19D, an impurity-doped polysilicon film $336_2$ having a thickness of approximately 1,000 [Å] is deposited on the entire surface of the $SiO_2$ film $132_2$ having the opening $133_2$. Thereafter, the polysilicon film $336_2$, the $SiO_2$ film $132_2$, and the polysilicon films $336_1$ and $236$ are subjected to the patterning process by anisotropic etching such as RIE in which a resist film (not shown) is used. Thereby, the layer structure of FIG. 19E is obtained.

Figure 19F:
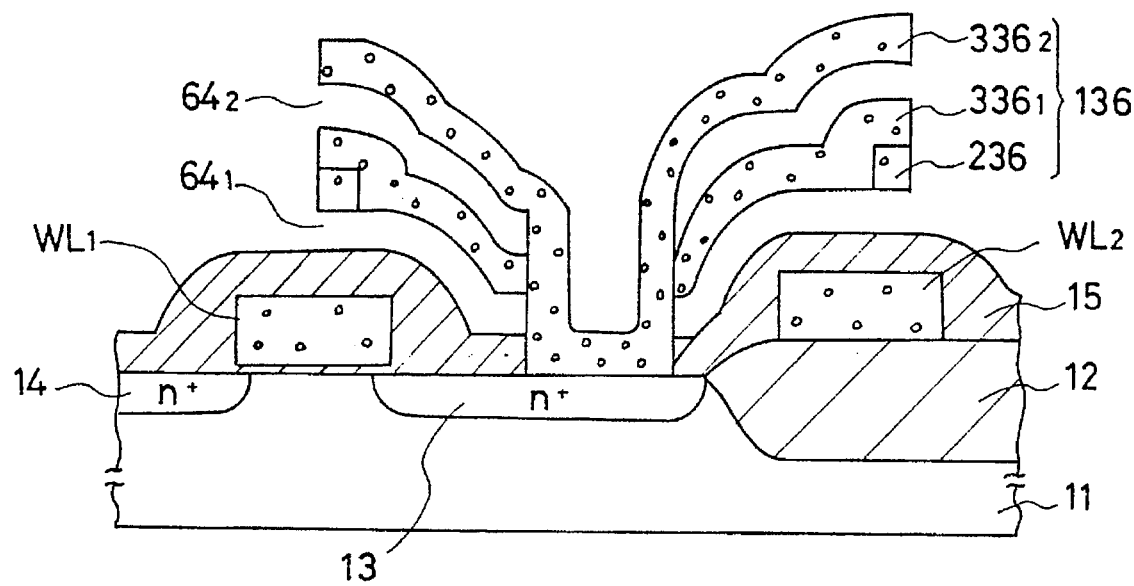
Figure 19G:
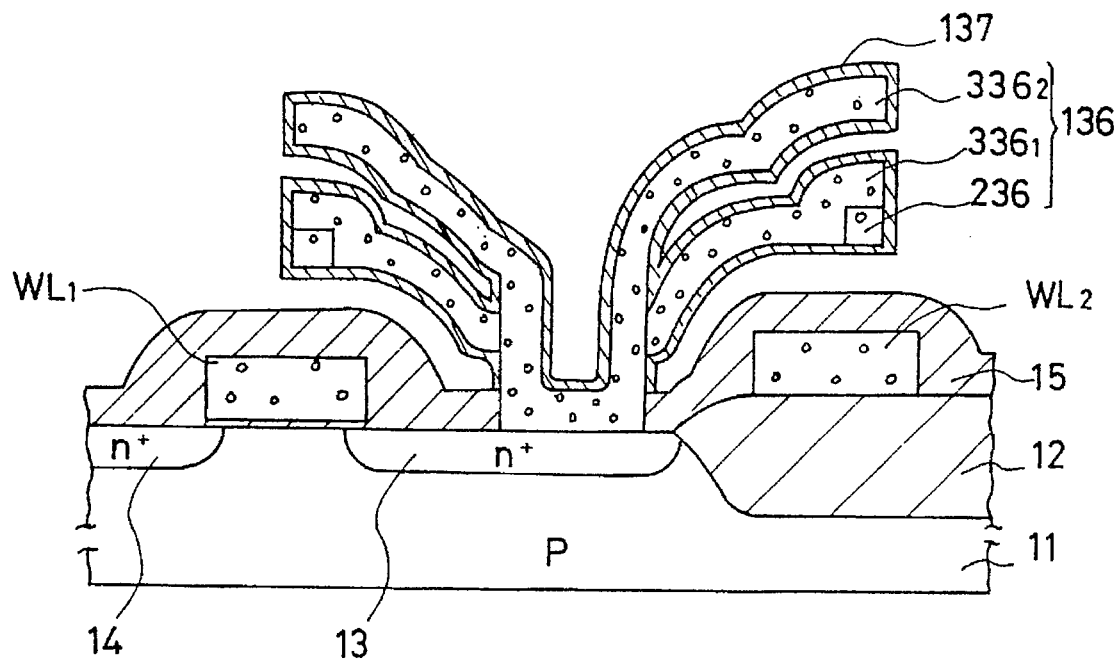

Next, remaining portions of the $SiO_2$ films $132_1$ and $132_2$ are completely removed by isotropic etching in which a liquid containing HF is used, and thereby the storage electrode 136 having the layer structure shown in FIG. 19F is formed. As illustrated, a gap $64_1$ is formed between the $Si_3N_4$ film 15 and the lower polysilicon film consisting of the films 236 and $336_1$ so as to surround the storage electrode 136. A gap $64_2$ is formed between the polysilicon films $64_1$ and $64_2$ so as to surround the storage electrode 136 In the above etching step, the $Si_3N_4$ which insulates the gate electrodes WL1 and WL2 from the polysilicon film $336_1$ is not etched. In the case where the insulating film 15 is a $SiO_2$ film and insulating films $132_1$ and $132_2$ are $Si_3N_4$ films, phosphorus acid ($PH_3PO_4$) etching is employed.

Figure 19H:
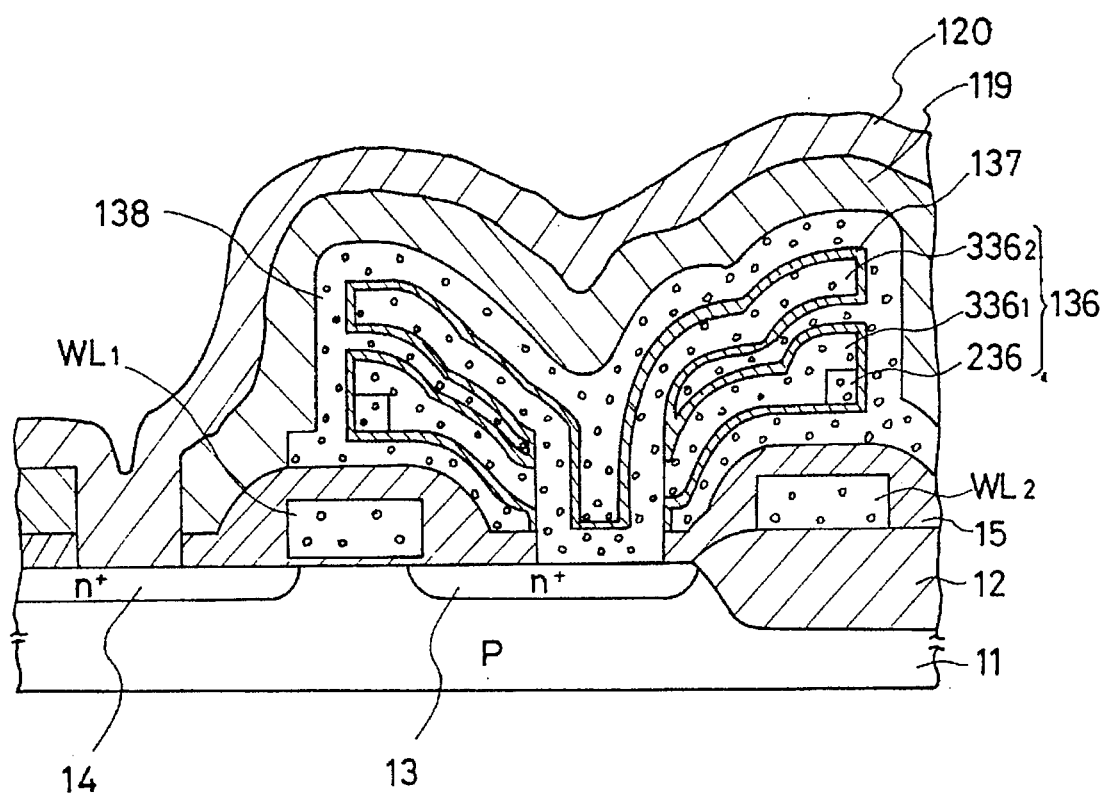

Thereafter, the exposed surface of the storage electrode 136 is subjected to the thermal oxidation process, and thereby a dielectric film 137 is formed so as to surround the storage electrode 136. Then, an opposed electrode 138, the insulating film 119 and the bit line 120 are formed in this order by the processes described before. FIG. 19H shows the DRAM cell obtained by the above method. The DRAM cell of FIG. 19H has the storage capacitor having the capacitance larger than that of FIG. 10A.

Figure 18B:
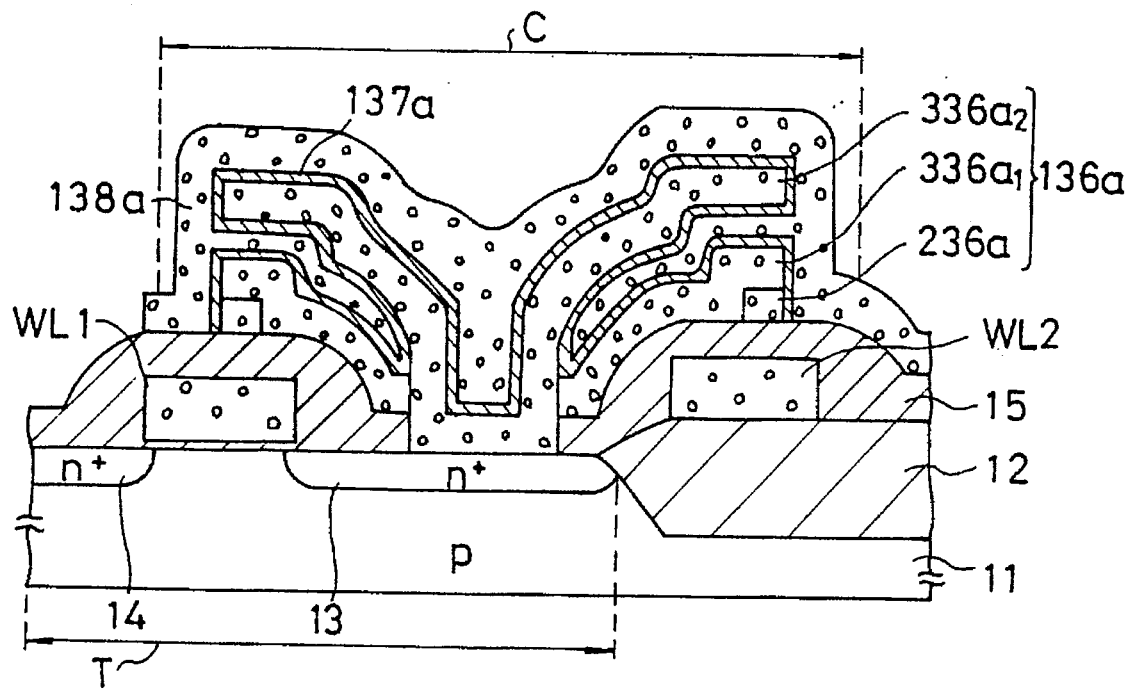
FIG. 18B is an elevational cross sectional view of a variation of the sixth embodiment of FIG. 18A.

FIG. 18B is a variation of the sixth embodiment of FIG. 18A. One of the essential features of the variation is that a lowermost polysilicon film of a storage electrode 136a is formed directly on the $Si_3N_4$ film 15. The capacitance of the capacitor C of this variation is smaller than that for the structure shown in FIG. 18A, because the area of a dielectric film 137a which is formed around the storage electrode 136a is decreased in comparison therewith. However, the step for forming the $SiO_2$ film $132_1$ is unnecessary and therefore the producing process of the variation can be simplified.

Figure 20A:
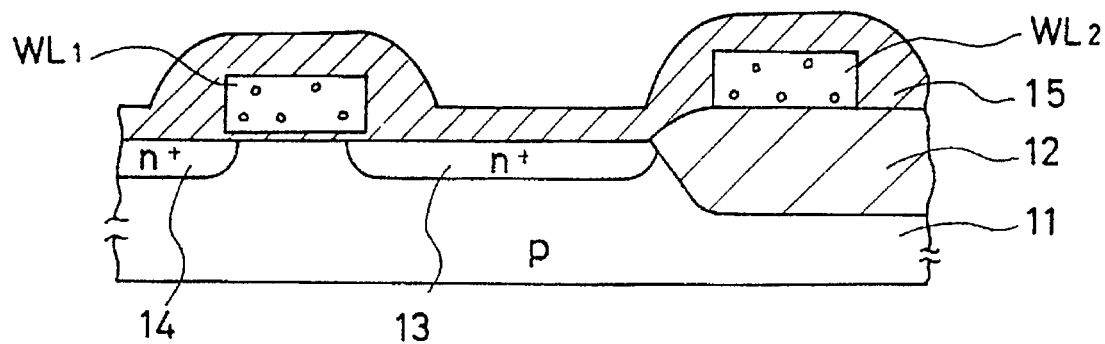
FIGS. 20A through 20F are elevational views showing steps of a process for producing the variation of the sixth embodiment.
Figure 20B:
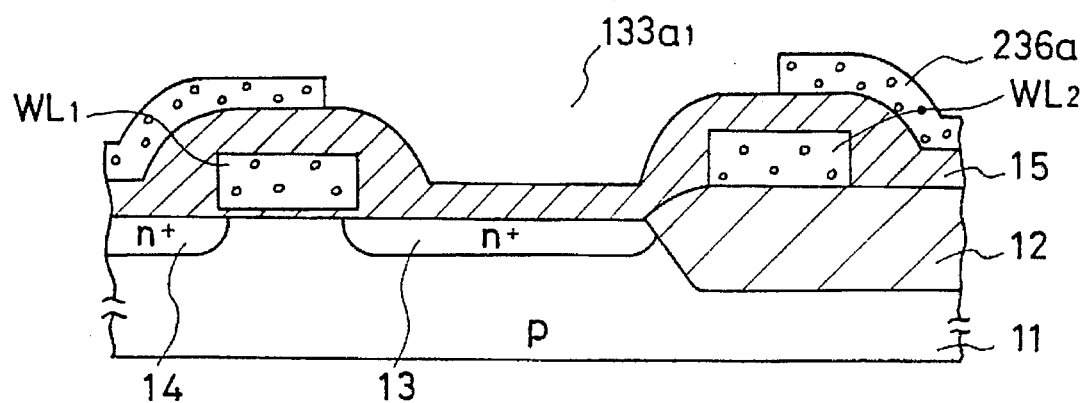
Figure 20C:
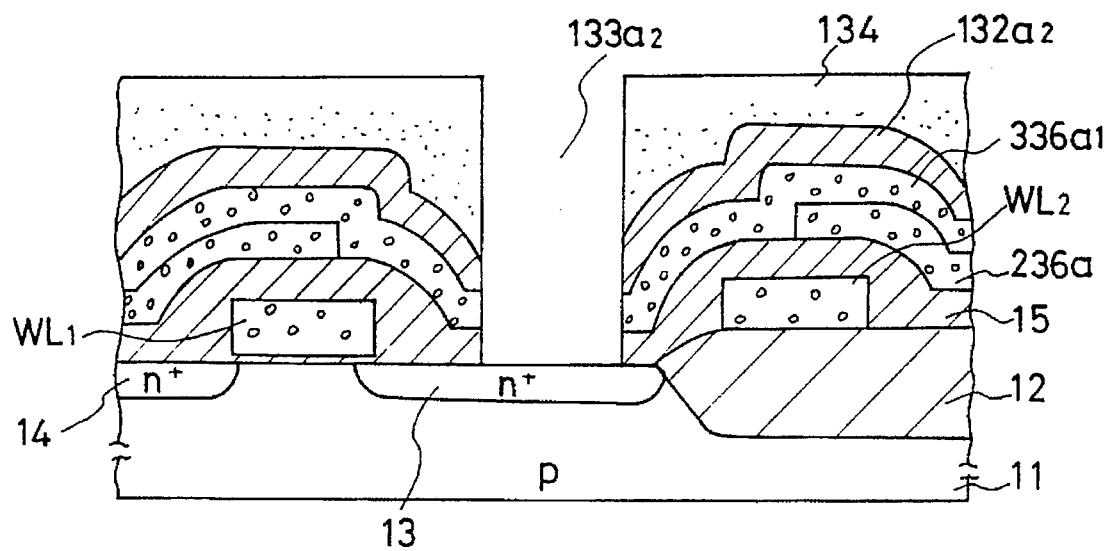
Figure 20D:
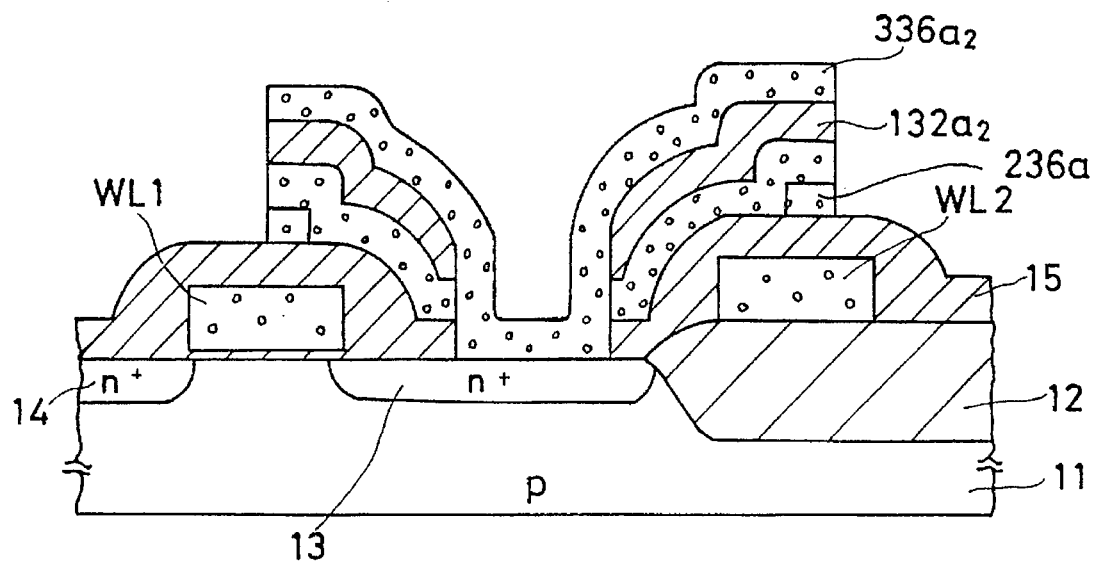
Figure 20E:
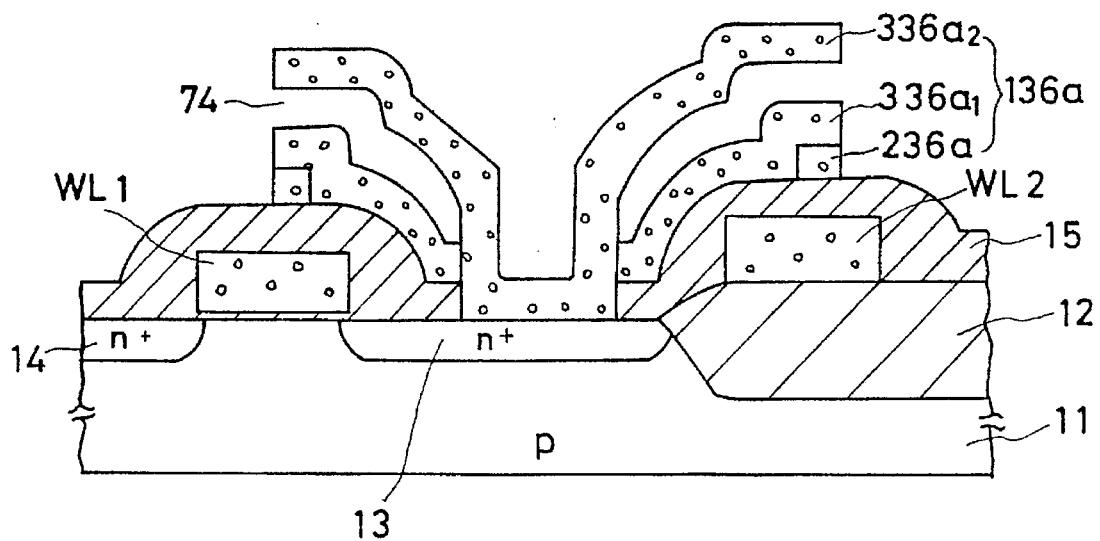
Figure 20F:
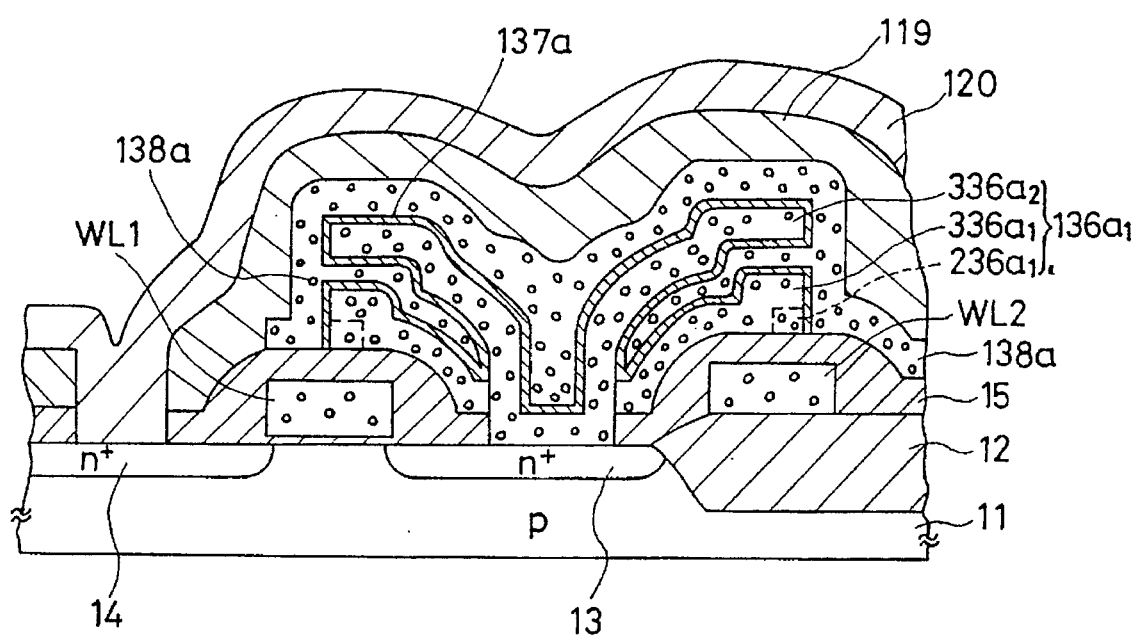

The variation of FIG. 18B can be produced by the following process shown in FIGS. 20A through 20F. First, there is formed the layer structure shown in FIG. 20A which is identical to that shown in FIG. 19A. Next, an impurity-doped polysilicon film 236a having a thickness of approximately 1,000 [Å] is deposited on the entire surface of the $Si_3N_4$ film 15 by CVD or LPCVD. Thereafter, the polysilicon film 236a is selectively removed by RIE in which a resist film (not shown) is used as a mask, and thereby an opening $133a_1$ which is wider than the drain region 13, is formed therein. Subsequently, on the entire surface of the substrate 11 of FIG. 20B, as shown in FIG. 20C, there are successively deposited an impurity-doped polysilicon film $336a_1$ having a thickness of approximately 1,000 [Å] and a $SiO_2$ film $132a_2$ having a thickness of approximately 1,000 [Å] by CVD or LPCVD. This step for forming the bilayer structure consisting of the polysilicon film $336a_1$ and the $SiO_2$ film 132 may be repetitively carried out if desired. Thereafter, as shown in FIG. 20C, a resist film 134 is formed on the entire surface of the $SiO_2$ film 132a and is then subjected to the patterning process. Then, as shown in FIG. 20C, the $SiO_2$ film $132a_2$, the polysilicon film $336a_1$ and the $Si_3N_4$ film 15 are selectively removed by anisotropic etching such as RIE, and thereby an opening $133a_2$ is formed. In the etching step, etching gas containing $CF_4/H_2$ is used for etching the $SiO_2$ film $132a_2$ and the $Si_3N_4$ film 15, and etching gas containing $CCl_4/O_2$ is used for etching the polysilicon film $336a_1$. Then, an impurity-doped polysilicon film $336a_1$, having a thickness of approximately 1,000 [Å] is formed on the entire surface of the $SiO_2$ film $132a_2$ by CVD or LPCVD. Thereafter, as shown in FIG. 20D, the polysilicon film 336a, the $SiO_2$ film $132a_2$ and the polysilicon film $336a_1$ are subjected to the patterning process using anisotropic etching such as RIE. Thereafter, a remaining portion of the remaining $SiO_2$ film $132a_2$ is completely removed by isotropic etching in which a liquid containing HF is used, and thereby the storage electrode 136a which has the elevational cross section having recess portions and convex portions shown in FIG. 20E is formed. As illustrated, a gap 74 is formed between adjacent polysilicon films so as to surround the storage electrode 136a. In the above etching process, the $Si_3N_4$ film 15 is not etched by the HF liquid. Thereafter, the exposed surface of the storage electrode 136a is subjected to the thermal oxidation process, and thereby an dielectric film 138a is formed so as to surround the storage electrode 136a. Then, an opposed electrode 138a made of an impurity-doped polysilicon film is deposited on the entire surface of the Si substrate 11 by CVD or LPCVD, and is then subjected to the patterning process. Finally, the insulating film 119 is formed on the entire surface of the Si substrate 11 and then the bit line 120 is formed. FIG. 20F shows the DRAM cell obtained by the above process.

A description is given of a seventh embodiment of the present invention, by referring to FIG. 21A. The seventh embodiment corresponds to a modification of the third embodiment of FIG. 13A. The seventh embodiment has also an essential feature in that a storage electrode 146 has stepped parts on both the sides of the elevational cross section thereof. Therefore, a storage capacitor of the seventh embodiment has a capacitance larger than that of the fourth embodiment shown in FIG. 13A.

Figure 22A:
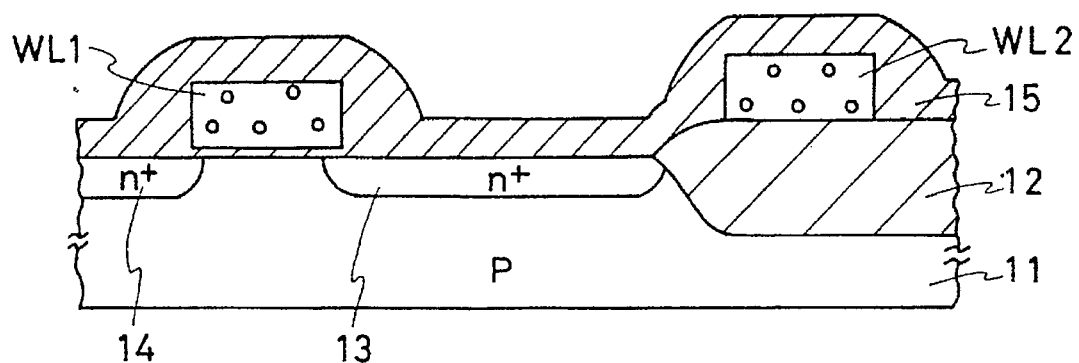
Figure 22B:
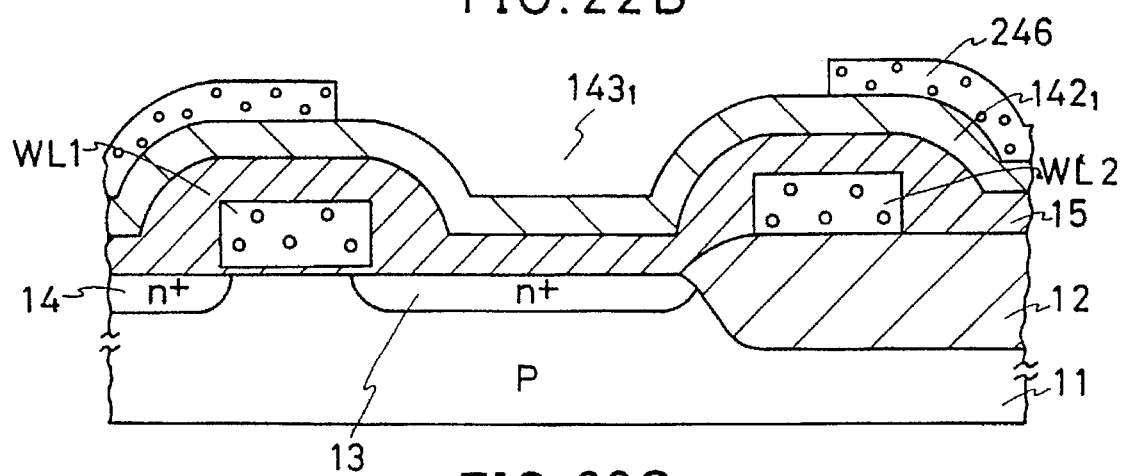
Figure 22C:
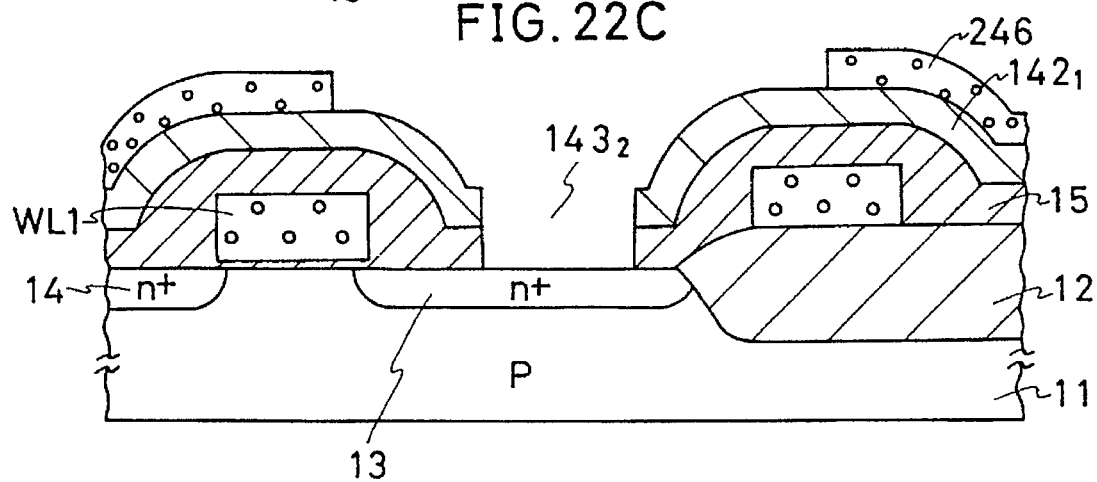
Figure 22D:
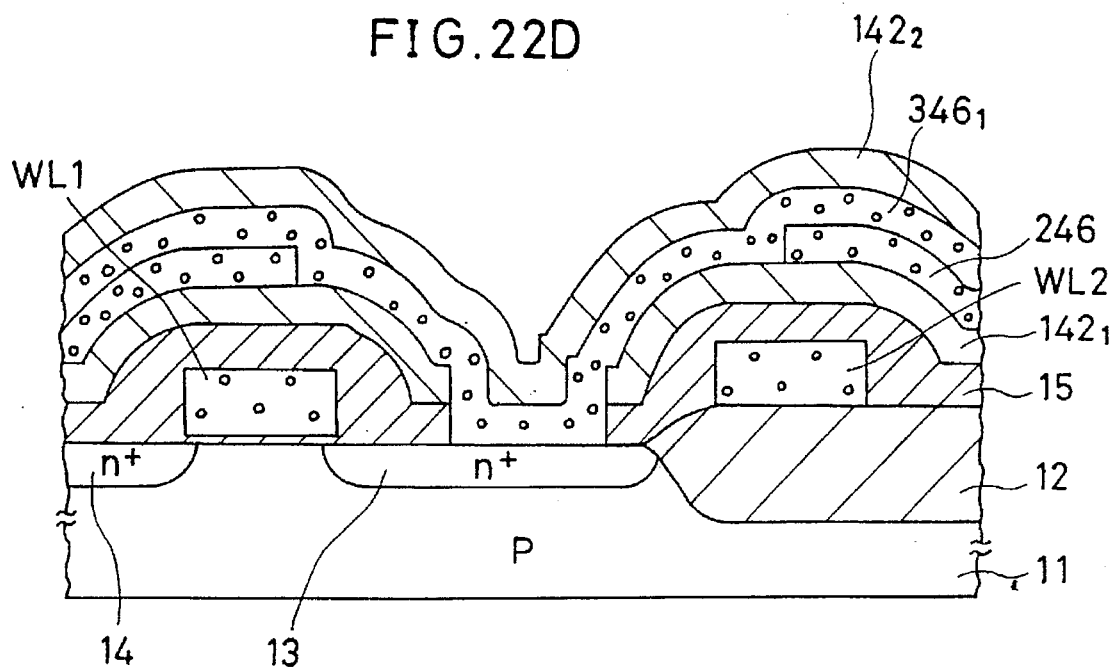
Figure 22E:
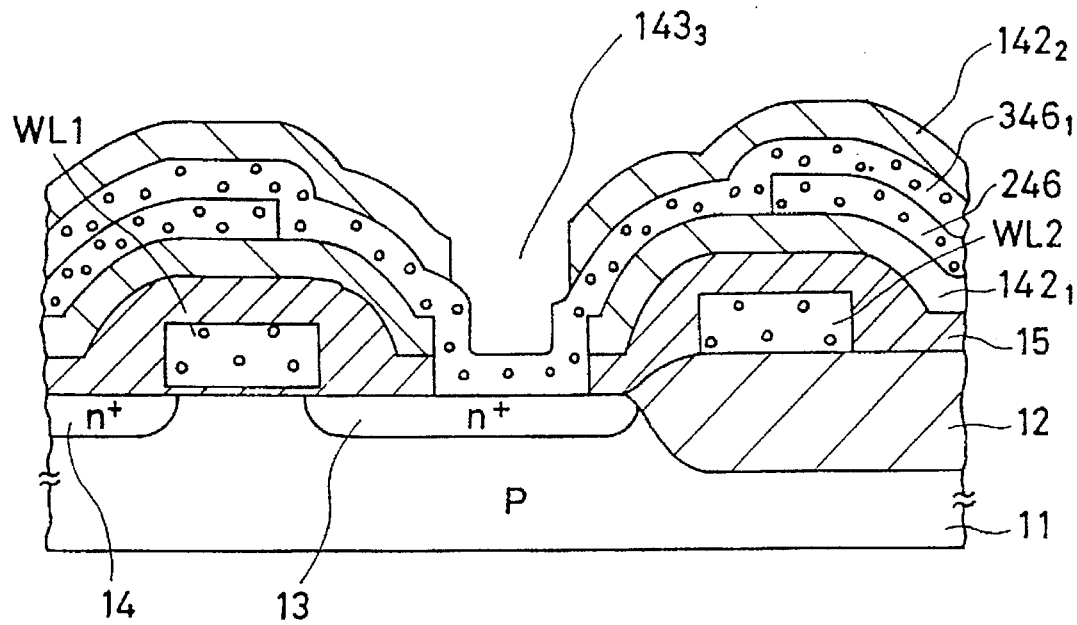
Figure 22F:
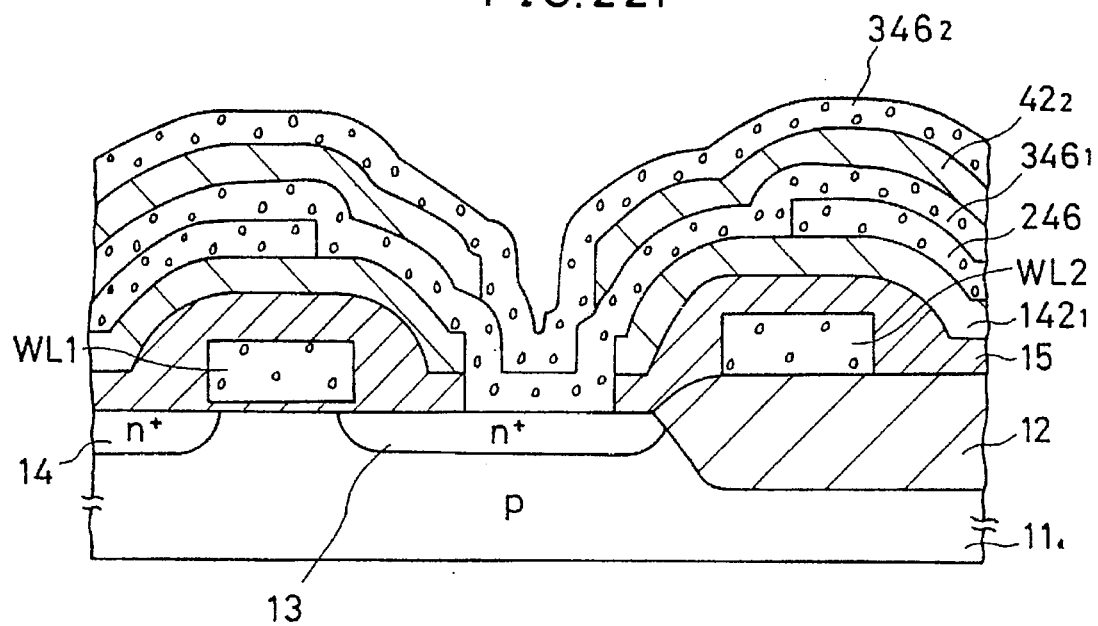
Figure 22G:
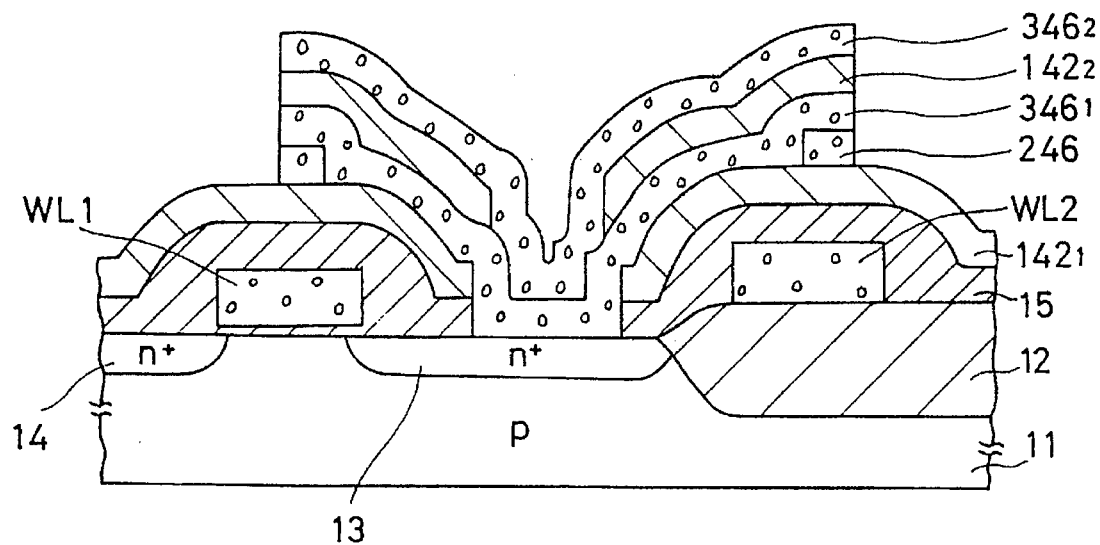
Figure 22H:
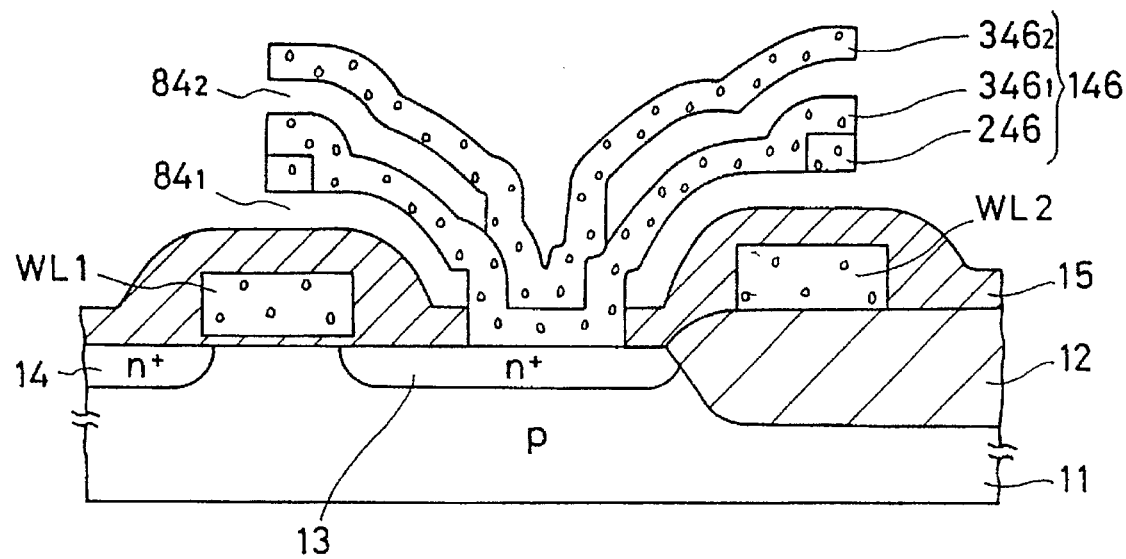
Figure 22I:
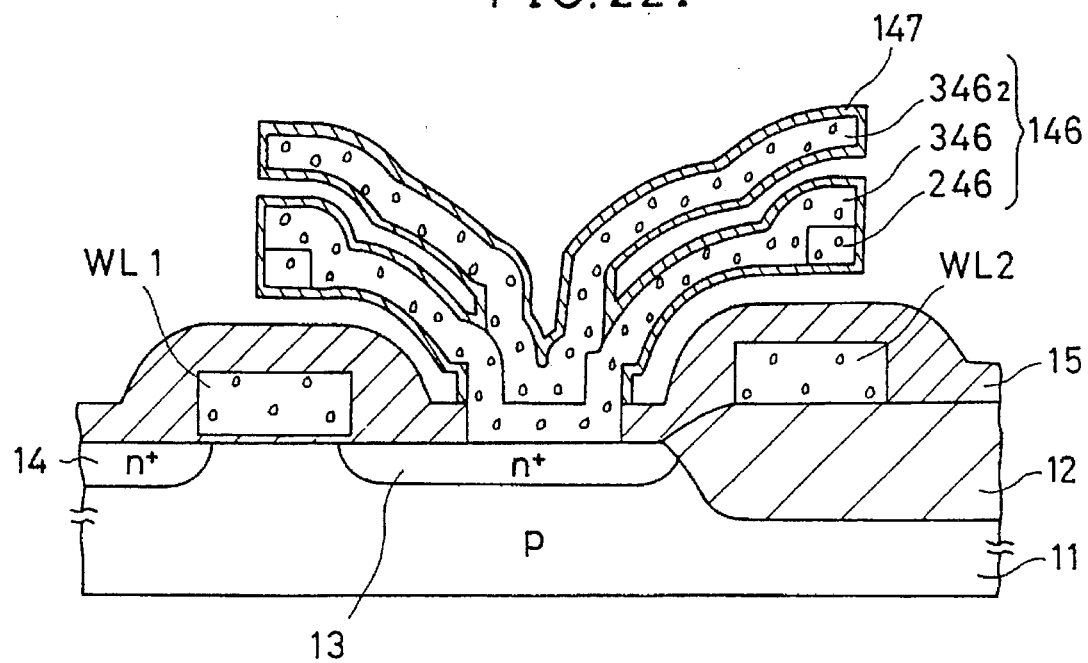
Figure 22J:
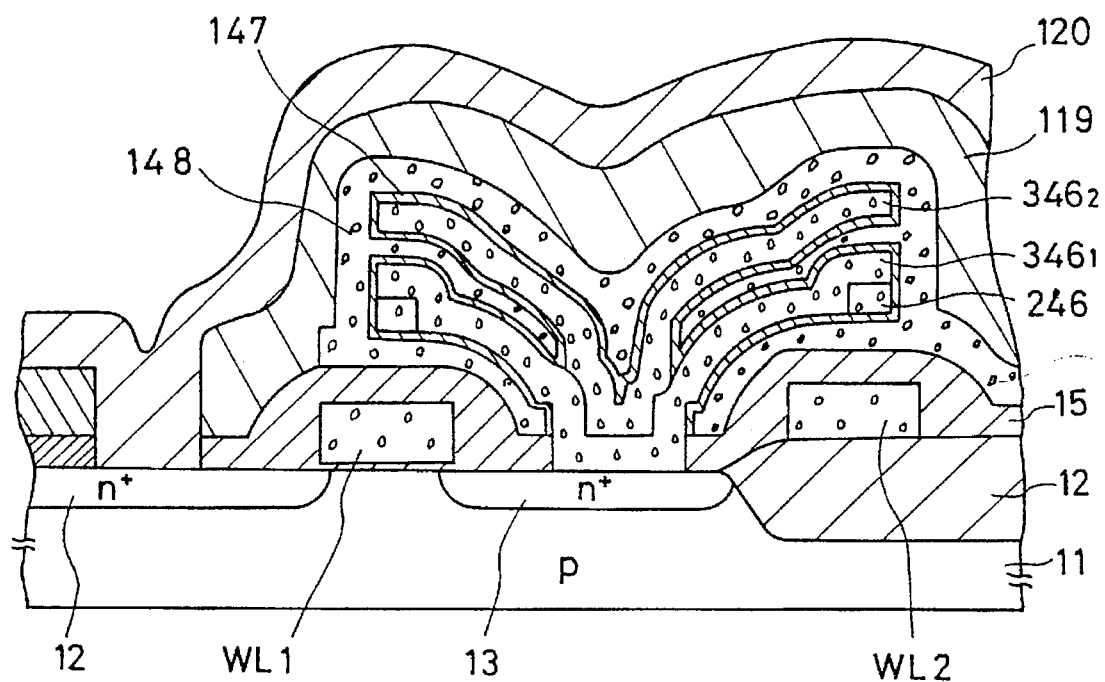

The seventh embodiment can be produced by the following production process. First, the structure shown in FIG. 22A is formed by processes identical to those described before with reference to FIG. 4A. Next, as shown in FIG. 22B, a $SiO_2$ film $142_1$ is deposited on the entire surface of the $Si_3N_4$ film 15 by CVD LPCVD. Subsequently, an impurity-doped polysilicon film 246 having a thickness of approximately 1,000 [Å] is formed on the entire surface of the $SiO_2$ film $142_1$ by CVD or LPCVD. Then, as shown in FIG. 22B, the polysilicon film 246 is selectively removed by RIE in which a resist film (not shown) is used, and thereby an opening $143_1$ is formed. The opening formed in the polysilicon film 246 is wider than the drain region 13. Thereafter, the $SiO_2$ film $142_1$ and the $Si_3N_4$ film 15 are selectively removed by anisotropic etching such as RIE in which a resist film (not shown) is used, and thereby an opening $143_2$ is formed as shown in FIG. 22C. In this etching step, etching gas containing $CF_4/H_2$ is used. Then, as shown in FIG. 22D, an impurity-doped polysilicon film $346_1$ having a thickness of approximately 1,000 [Å] is deposited on the entire surface of the Si substrate shown in FIG. 22C by CVD or LPCVD. Subsequently, as shown in FIG. 22D, a $SiO_2$ film $142_2$ is deposited on the entire surface of the polysilicon film $346_1$ by CVD or LPCVD. Then, as shown in FIG. 22E, an opening $143_3$ is formed in the $SiO_2$ film $142_2$ by RIE in which etching gas containing $CF_4/H_2$ is used. Thereby, the polysilicon film $346_1$ is partially exposed through the opening $143_3$. Thereafter, as shown in FIG. 22F, an impurity-doped polysilicon film $346_2$ having a thickness of approximately 1,000 [Å] is deposited on the entire surface of the $SiO_2$ film $142_2$ having the opening $143_3$ by CVD or LPCVD The deposition of the polysilicon film $346_1$ and the $SiO_2$ film $142_2$, and the formation of the opening $143_3$ may be repetitively performed, if desired. Thereafter, as shown in FIG. 22G, the polysilicon film $346_2$, the $SiO_2$ film $142_2$ and the polysilicon films $346_1$ and 246 are subjected to the patterning process by RIE. Thereafter, remaining portions of the $SiO_2$ films $142_1$ and $142_2$ are completely removed by isotropic etching in which a liquid containing HF is used. Thereby, there is formed the storage electrode 146 having the elevational cross section of FIG. 22H which has convex portions and recess portions. As illustrated, a gap $84_1$ is formed between the insulating film 15 and the lower polysilicon films consisting of the films 246 and $346_1$ so as to surround the storage electrode 146. Also, a gap $84_2$ is formed between the adjacent upper and lower films so as to surround the storage electrode 146. In the etching step, the gate electrodes WL1 and WL2 made of $Si_3N_4$ are not etched. Then, the exposed surface of the storage electrode 146 is subjected to the thermal oxidation process, and thereby, as shown in FIG. 22I, a dielectric film 147 is formed around the storage electrode 146. Thereafter, an impurity-doped polysilicon film 148 is deposited on the entire surface of the substrate shown in FIG. 22I, and is then subjected to the patterning step. Finally, the insulating film 119 and the bit line 120 is formed.

FIG. 21B is a variation of the seventh embodiment of FIG. 21A. The variation differs from the seventh embodiment shown in FIG. 21A in that a lowermost polysilicon film of a storage electrode 146a is formed directly on the $Si_3N_4$ film 15.

Figure 23A:
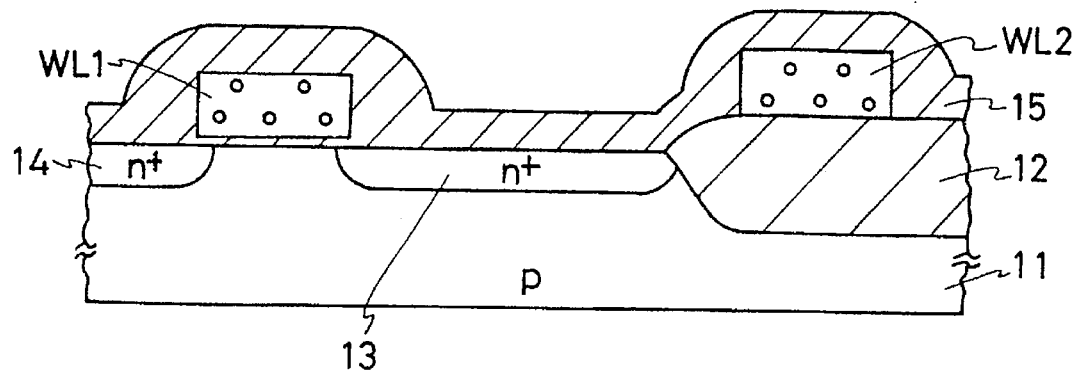
Figure 23B:
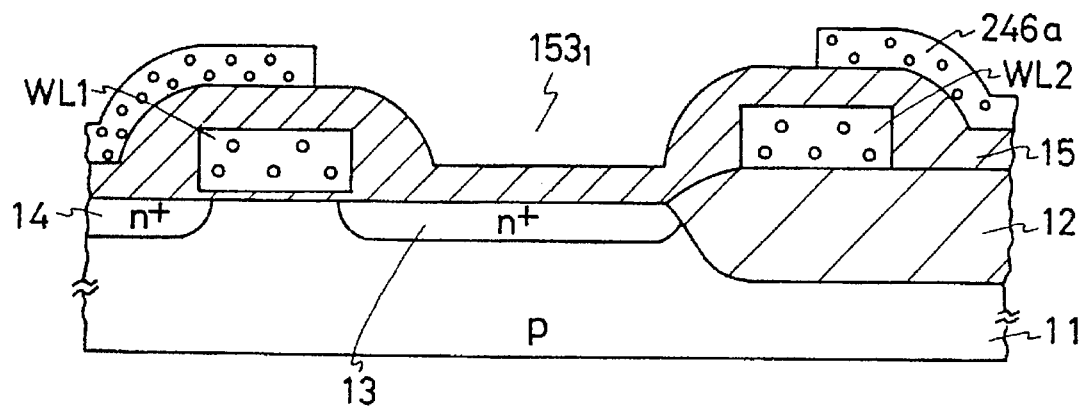
Figure 23C:
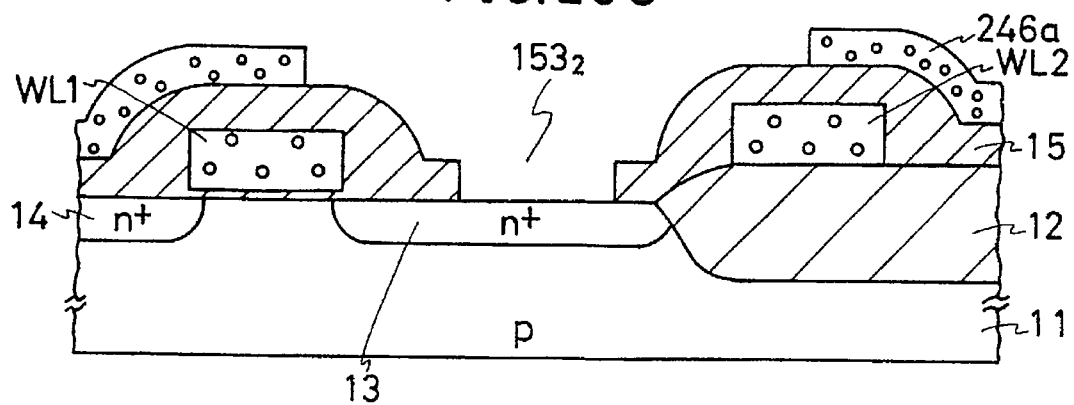

The variation of FIG. 21B can be formed by the following production process. First, the layer structure shown in FIG. 23A which is identical to that shown in FIG. 22A, is formed. Next, an impurity-doped polysilicon film 246a having a thickness of approximately 1,000 [Å] is deposited on the entire surface of the $Si_3N_4$ film 15 by CVD or LPCVD Then the polysilicon film 246a is selectively removed by RIE in which a resist film (not shown) is used as a mask, and thereby there is formed an opening $153_1$ which is wider than the drain region 13. Alternatively, it is also possible to form the polysilicon film 246a having a thickness of approximately 2,000 [Å] on the entire surface of the $Si_3N_4$ film 15 and then form convex portions and recess portions thereon by using a laser beam. Thereafter, the $Si_3N_4$ film 15 is selectively removed by anisotropic etching such as RIE in which a resist film (not shown) is formed. Thereby, as shown in FIG. 23C, an opening $153_2$ is formed in the $Si_3N_4$ film 15. In this etching step, etching gas containing $CF_4/H_2$ is used.

Figure 23D:
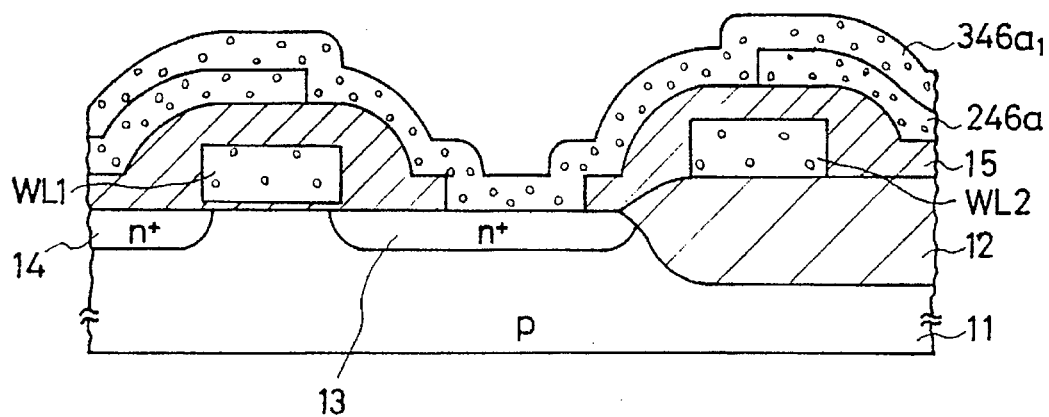
Figure 23E:
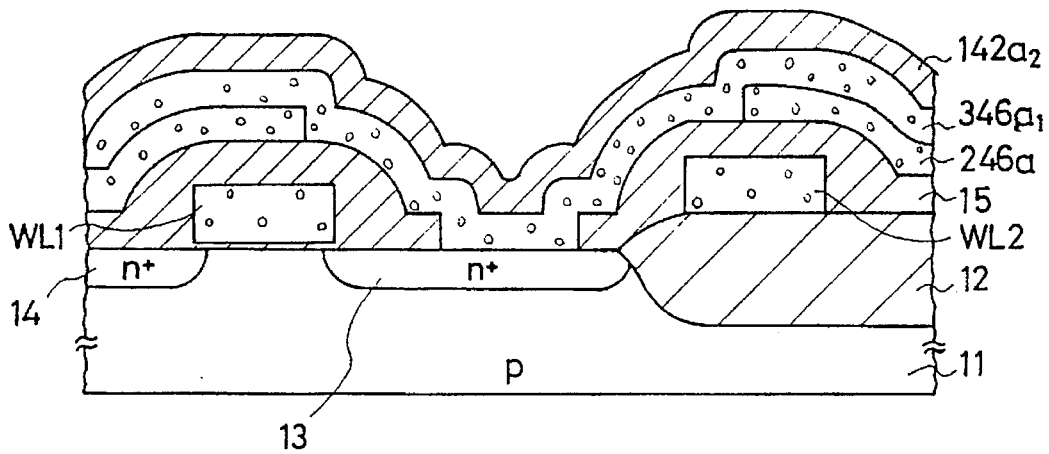
Figure 23F:
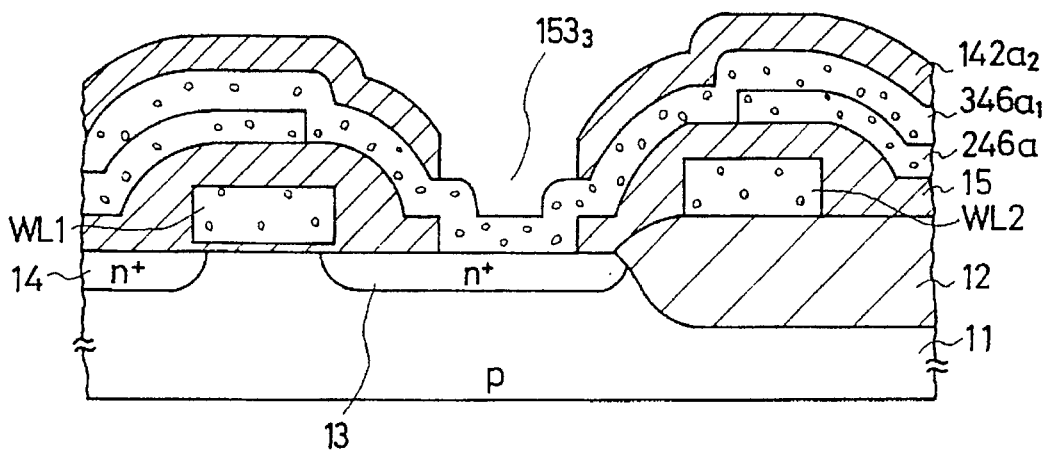
Figure 23G:
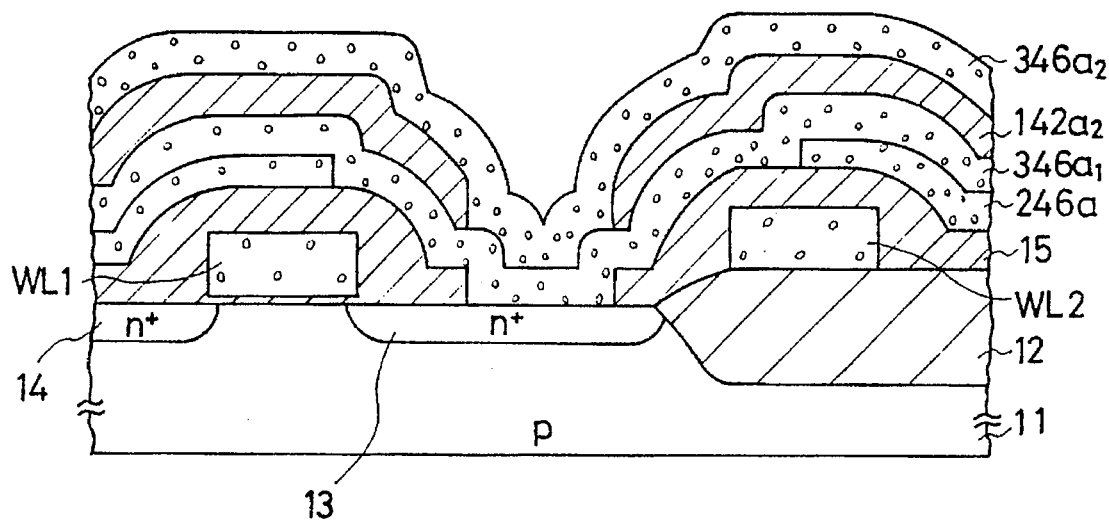
Figure 23H:
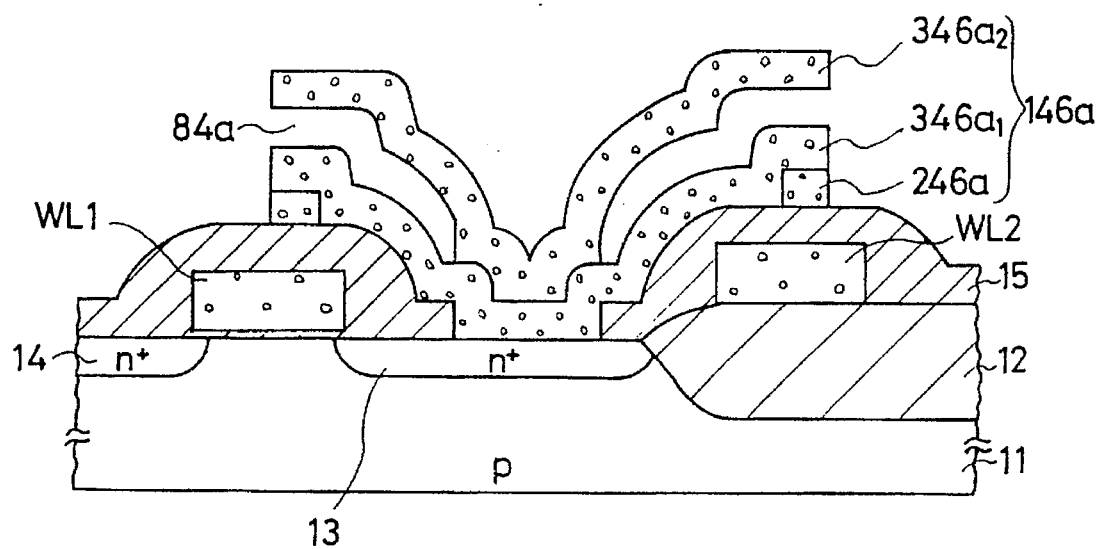
Figure 23I:
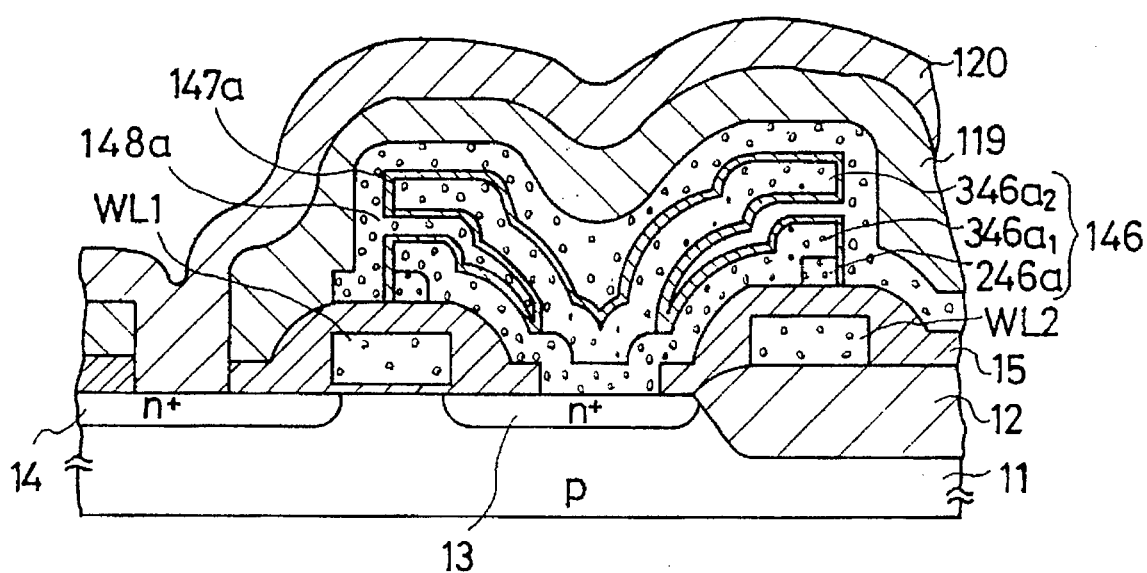

Then, as shown in FIG. 23D, an impurity-doped polysilicon film $346a_1$ having a thickness of approximately 1,000 [Å] is deposited on the entire surface of the Si substrate shown in FIG. 23C by CVD or LPCVD. Subsequently, as shown in FIG. 23E, a $SiO_2$ film $142a_2$ having a thickness of approximately 1,000 [Å] is deposited on the entire surface of the polysilicon film $346a_1$ by CVD or LPCVD. Next, as shown in FIG. 23F, an opening $153_3$ is formed in the $SiO_2$ film $142a_2$ by RIE in which etching gas containing $CF_4/H_2$ is used. Thereafter, an impurity-doped polysilicon film $346a_2$ having a thickness of approximately 1,000 [Å] is deposited on the entire surface of the $SiO_2$ film $142a_2$ having the opening $153_3$ by CVD or LPCVD. The deposition of the $SiO_2$ film $142a_2$ and the polysilicon film $346a_2$ and the formation of the opening $153_3$ may be repetitively performed if desired. Then, the polysilicon film $346a_2$, the $SiO_2$ film $142a_2$, and the polysilicon film $346a_1$ and 246a are subjected to the patterning step by RIE. Subsequently, a remaining portion of the $SiO_2$ film $142_2$ is completely removed by isotropic etching in which a liquid containing HF is used. The gate electrodes WL1 and WL2 are not etched by the HF liquid. Thereby, there is formed the storage electrode 146a which has the elevational cross section shown in FIG. 23H having convex portions and recess portions thereon. As illustrated, a gap 84a is formed between the adjacent polysilicon films so as to surround the storage electrode 146a. Thereafter, as shown in FIG. 23I, the exposed surface of the storage electrode 146 is subjected to the heat treatment, and thereby a dielectric film 147a is formed around the storage electrode 146. Then an opposed electrode 148a made of an impurity-doped polysilicon film is formed so as to cover the storage electrode 146 around which the dielectric film 147a is formed. Finally, the insulating film 119 and the bit line 120 are sequentially formed.

FIG. 24 is a graph for explaining advantages of the present invention, compared with the conventional DRAM cell. The horizontal axis of FIG. 24 indicates three different DRAM cells of the conventional type, the second embodiment of FIG. 6A, and the fourth embodiment of FIG. 13A. As described before, the storage capacitor of the second embodiment has one polysilicon film, and the storage capacitor of the fourth embodiment has two polysilicon films. The horizontal axis of the graph represents a relative value of the capacitance C of each storage capacitor, wherein the value of the capacitance of the conventional type is set to 1 as a reference value. A symbol "o" denotes a relative value obtained by the experiment, and a symbol "x" denotes a relative value obtained by theoritical calculation. The DRAM cells which were used in the experiments are of a 4-Mbit type. As can be seen from the graph, the capacitance of the embodiments are sufficiently increased, compared with the conventional storage capacitance of the storage capacitor. That is, an approximately double or triple capacitance can be obtained according to the present invention without reducing the integration density.

The second through seventh embodiments described before has an additional advantage which is not provided by the first embodiment. FIGS. 25A and 25B are views for explaining the additional advantage. A symbol X1 denotes one film of the storage capacitor, and a symbol X2 denotes a central portion thereof. FIG. 25A is with respect to the first embodiment, and FIG. 25B is with respect to the second through seventh embodiments. In the first embodiment, the grooves 16c are formed by etching the $n^+$-type polysilicon films. Therefore, distances $\underline{a}$, $\underline{b}$, $\underline{c}$ and $\underline{d}$ between ends of the film and ends of the central portion are necessarily equal to each other. That is, $\underline{a}=\underline{b}=\underline{c}=\underline{d}$. On the other hand, the shape of the film of the storage electrode of the present invention may be changed, depending on the patterning process and a position of the opening for establishing the connections between the films of the storage electrode. Therefore, arbitrary distances a, b, c and d are obtainable. That is, a≠b≠ c≠d. This advantage can also be provided by an eighth embodiment which is described below. Additionally, the value of X2 of FIG. 25B may be made smaller than that of X2 for the case of FIG. 25A. That is, a larger capacitance of the storage capacitor can be obtained. Moreover, the gap can be formed by completely removing the $SiO_2$ films and therefore the depths of the gaps can be controlled with a high accuracy.

A description is given of an eighth embodiment of the present invention by referring to FIG. 26, 27 and 28A through 28G. One of the essential features of the eighth embodiment is that storage capacitors of adjacent DRAM cells partially overlap with each other. This structure has an advantageous effect of preventing the bit line from being disconnected between adjacent word lines. As described before, the polysilicon film of the storage capacitor extends above the word lines which are surrounded by the insulating film. Therefore, a stepped portion between the adjacent word lines would be formed in a layer structure containing an insulating film, and a bit line. The stepped portion becomes greater as the storage capacitor is formed by an increased number of polysilicon films. Such a stepped portion may cause the disconnection of the bit line. The eighth embodiment can effectively prevent the occurrence of the undesirable stepped portion.

FIG. 26 is a plan view of an essential part of the eighth embodiment of the present invention, and FIG. 27 is an elevational cross sectional view taken along a line XXVII—XXVII shown in FIG. 26. As shown in these figures, a polysilicon film 356a extending above the word line WL2 of a storage electrode consisting of the polysilicon film 356a and another polysilicon film 366a, overlaps, through an opposed electrode 158, with a polysilicon film 366b extending above a word line WL3 of a storage electrode which is adjacent to the former storage capacitor and consists of the polysilicon film 366b and another polysilicon film 356b. With this structure, the occurrence of a stepped portion of a bit line 120 extending above the two cells can be prevented.

The structure of FIGS. 26 and 27 can be produced by the following process described below with reference to FIGS. 28A through 28G.

Figure 28A:
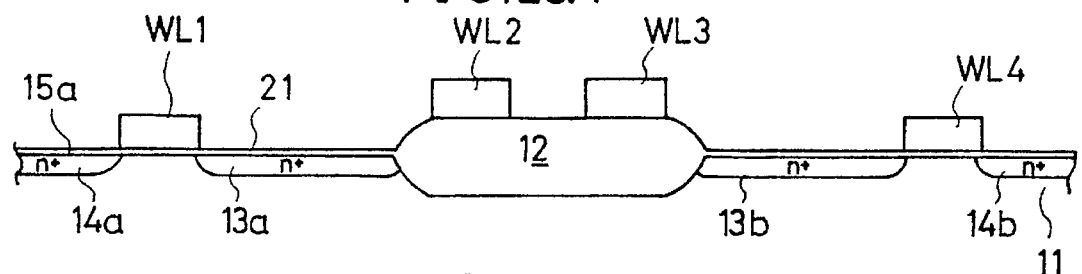

Referring to FIG. 28A, a surface of the Si substrate 11 is subjected to the thermal oxidation process by the local oxidation technique, and thereby the field oxidation film 21 having a thickness of approximately 5,000 [Å] is formed. Next, a gate oxidation film 21 having a thickness of approximately 200 [Å] is formed by subjecting the Si substrate 11 by the thermal oxidation process. Then a polysilicon film having a thickness of approximately 3,000 [Å] is grown on the entire surface of the Si substrate 11 by CVD or LPCVD. In order to obtain the polysilicon film of low resistance, a phosphorus ion is diffused into the polysilicon film. Thereafter, the polysilicon film of low resistance is subjected to the patterning process, and thereby gate electrodes (word lines) WL1 through WL4 are formed as shown in FIG. 28A. Then, an $As^+$ ion is injected into the Si substrate 11 with an impurity concentration of approximately $1 \times 10^{15}$ [cm$^{-2}$] and an energy of 70 [keV]. In this step, the word lines WL1 through WL4 are used as mask films. Thereby, drain regions 13a and 13b and source regions 14a and 14b are formed in the Si substrate 11.

Figure 28B:
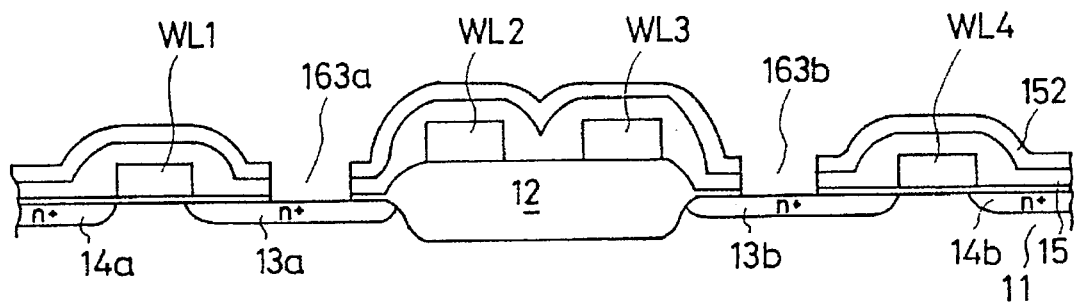

Next, as shown in FIG. 28B, a $Si_3N_4$ film 15 and a $SiO_2$ film 152 are successively grown in this order by CVD or LPCVD. The $Si_3N_4$ film 15 may have a thickness of approximately 1,000 [Å], and the $SiO_2$ film 152 may have a thickness of approximately 1,000 [Å]. Then, as shown in FIG. 28B, contact holes 163a and 163b are formed by the conventional photolithography technique so that the drain regions 13a and 13b become exposed. Thereafter, a polysilicon film having a thickness of approximately 1,000 [Å] is deposited on the entire surface of the Si substrate of FIG. 28B by CVD or LPCVD. Then an $As^+$ ion is injected into the polysilicon film with an impurity concentration of $1 \times 10^{15}$ [cm$^{-2}$] and an energy of 50 [keV] to obtain the polysilicon film of low resistance. Then the polysilicon film is subjected to the patterning process, and thereby a lower storage electrode film 356a and 356b are formed as shown in FIG. 28C.

Figure 28C:
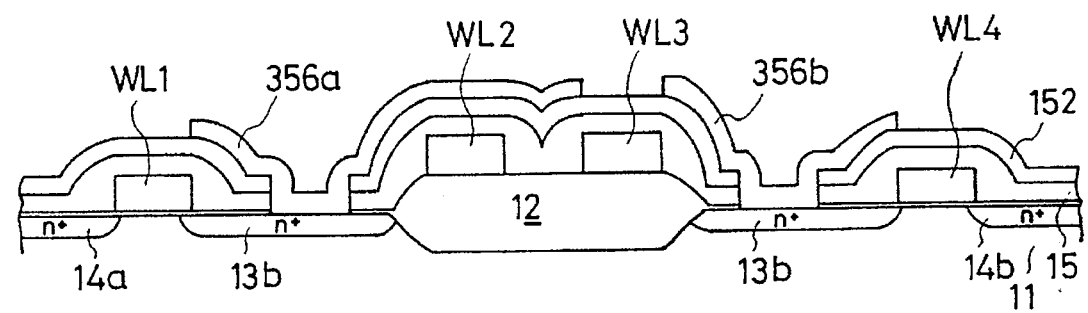
Figure 28D:
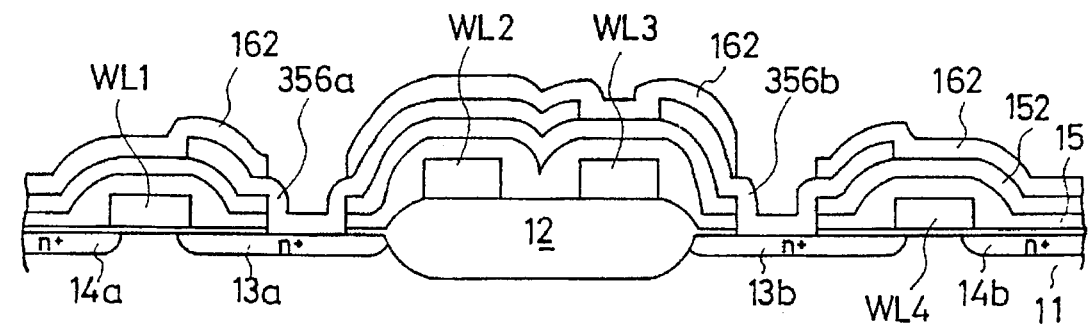

Then, a $SiO_2$ film having a thickness of approximately 1,000 [Å] is deposited on the entire surface of the Si substrate 11 of FIG. 28C by CVD or LPCVD. Although a material of the film is not limited to the $SiO_2$ film, it is necessary to use a material which can be selectively removed so that the polysilicon film can remain without being etched, because it is to be selectively removed at the later step. Then, the $SiO_2$ film is subjected to the patterning process so that there can be formed contact holes through which the lower storage electrode films 356a and 356b are exposed. Subsequently, a polysilicon film of a thickness of approximately 1,000 [Å] is deposed on the entire surface of FIG. 28D by CVD or LPCVD. Then, an $As^+$ ion having is injected into the polysilicon film with an impurity concentration of $1 \times 10^{15}$ [cm$^{-2}$] and an energy of 50 [keV] by CVD or LPCVD. Thereafter, the polysilicon film is subjected to the patterning process and thereby upper storage electrode films 366a and 366b are formed as shown in FIG. 28E.

Figure 28E:
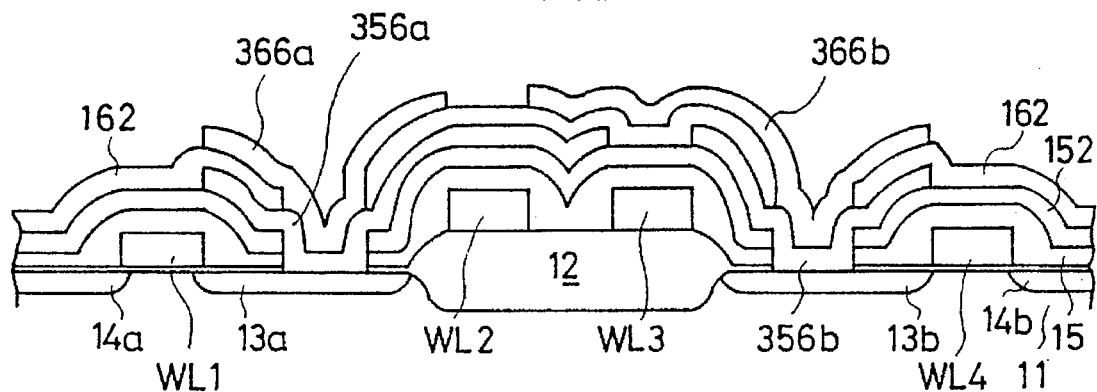
Figure 28F:
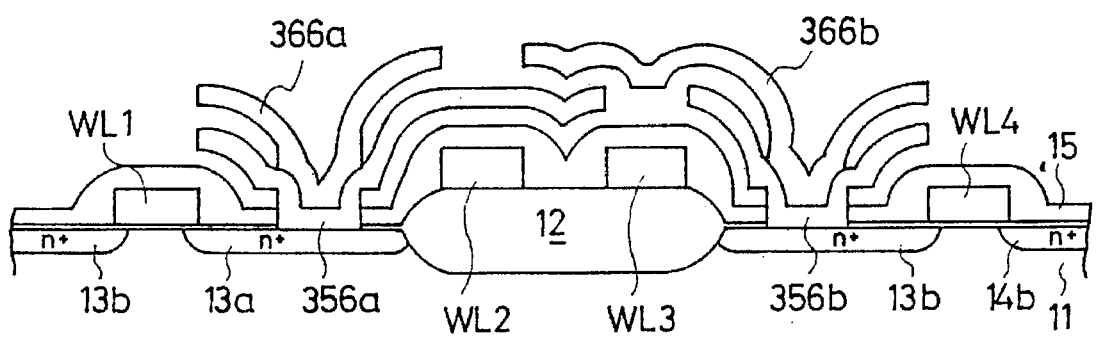
Figure 28G:
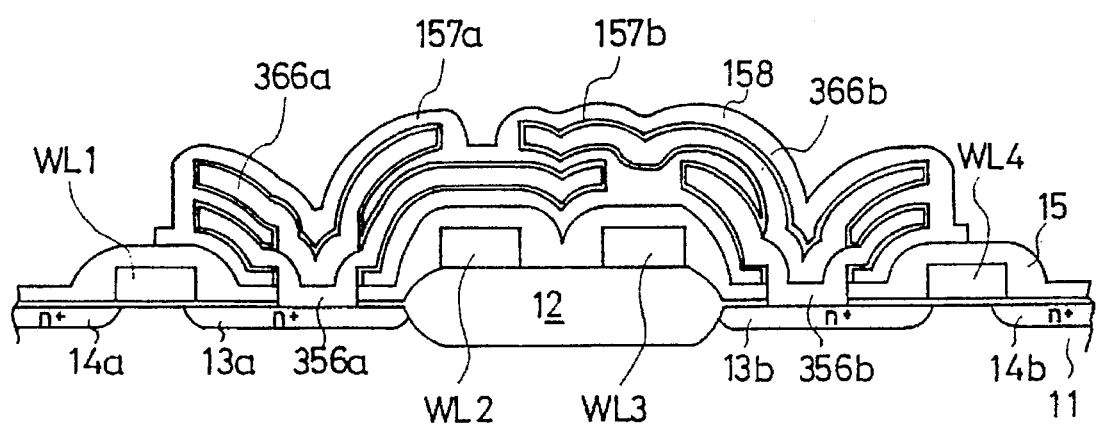

Then, as shown in FIG. 28F, the Si substrate 11 of FIG. 28E is placed into an etching liquid capable of selectively etching a $SiO_2$ film, a HF liquid, for example, so that the $SiO_2$ films 152 and 162 are completely removed by isotropic etching. At this step, the word lines WL1 through WL4 are not etched because they are covered with the $Si_3N_4$ film 15. Thereafter, a dielectric film consisting of a $SiO_2$ film having a thickness of approximately 100 [Å] is formed on the surface of each of the polysilicon films 356a, 356b, 366a and 366b of the storage electrodes. The formation of the $SiO_2$ film is performed by the thermal oxidation process. In the thermal oxidation process, an uniform $SiO_2$ film can be formed even on opposing surfaces of the storage electrode films 356a and 366a; 356b and 366b around each of the storage electrodes, with an oxidation atmosphere kept at a low pressure equal to or lower than 10 [torr]. In place of use of the $SiO_2$ film, it is possible to grow a $Si_3N_4$ film serving as the dielectric film formed on the surface of the storage electrode by CVD or LPCVD. Next, in order to form an opposed electrode 158, a polysilicon film of a thickness of approximately 2,000 [Å] is grown on the entire surface of the Si substrate 11 shown in FIG. 28F by CVD or LPCVD so as to enclose the entire of the storage electrodes films 356a, 356b, 366a and 366b. In the step, it is preferable to carry out the growth of the polysilicon film in a low-pressure atmosphere at a pressure equal to or lower than 10 [torr]. Under this pressure condition, the polysilicon can be grown even on the surfaces of the storage electrode films opposite to each other through the gaps formed therebetween, so that the gaps can be completely filled with the polysilicon film. In order to obtain the opposed electrode 158 of low resistance, phosphorus is doped into the polysilicon film used for forming the opposed electrode 158 by gas diffusion in which $POCl_3$ is used as a gate. Then the polysilicon film of low resistance is subjected to the patterning process, and thereby the opposed electrode 158 having the elevational cross section shown in FIG. 28G can be obtained. Thereafter, the SiO₂ film 119 having a thickness of approximately 2,000 [Å] is grown on the entire surface of the Si substrate 11 of FIG. 28G by CVD or LPCVD. Then contact holes through which the source regions 14a and 14b are exposed, and then a polysilicon film having a thickness of approximately 1,000 [Å] is grown on the SiO₂ film 119 having the contact holes. Subsequently, an As⁺ ion is injected into the grown polysilicon film with an impurity concentration of 1×10¹⁶ [cm⁻²] and an energy of 50 [keV]. Thereafter, a tungsten silicide (WSi) having a thickness of approximately 2,000 [Å] is grown on the polysilicon film 119 by CVD or LPCVD and is then subjected to the patterning process. Thereby, the bit line 120 is formed. Thereafter, a PSG film 121 of a thickness of approximately 0.5 [μm] is grown on the entire surface of the Si substrate 11, and then Al wiring lines 200a through 200d each having a thickness of approximately 1 [μm] are formed on the PSG film 121. The Al wiring lines 200a through 200d are connected to the corresponding wiring lines WL1 through WL4 at portions (not shown). These connections contribute to low resistances of the word lines. The eight embodiment can be applied to the second through seventh embodiments.

With respect to the third, fourth, sixth and seventh embodiments, the elevationally adjacent polysilicon films of the storage electrode are formed by the same resist film. On the other hand, it is possible that the lower electrode out of the adjacent polysilicon film is first patterned, and then the film is deposited on the patterned polysilicon film, and thereafter the upper polysilicon film formed on the film is patterned. In this case, it is unnecessary to use the same resist film for the adjacent polysilicon films.

The present invention is not limited to the embodiments described above, and variations and modifications may be made without departing from the scope of the present invention.

What is claimed is:
1. A dynamic random access memory cell, comprising:
   a) a semiconductor substrate;
   b) a transfer transistor having a gate and a pair of impurity diffused regions formed in the semiconductor substrate;
   c) an insulating film formed over said semiconductor substrate and having a first opening;
   d) a storage electrode formed of a conductive material, said storage electrode connected to one of the pairs of impurity diffused regions through said first opening,
   said storage electrode integrally formed as a hollow cup-shaped electrode, said hollow cup-shaped electrode having a bottom and an upwardly extending cylindrical wall connected to said bottom, a plurality of fin films each extending outward at different elevation levels from an outside surface of said upwardly extending cylindrical wall wherein at least one of said fin films formed with an opening extending therethrough and the upwardly extending cylindrical wall located in and extending upwardly thorough the opening,
   one of said fin films located at a lowest elevation level of said storage electrode,
   another one of said fin films, located at a highest elevation level of said storage electrode, being electrically connected to the one of the pair of impurity diffused regions by connection through said upwardly extending cylindrical wall, said upwardly extending cylindrical wall connected to said fin films at said different elevation levels, a top surface of said bottom being located at a lower elevation level than a point where said one of said fin films located at the lowest elevation level extends from said outside surface of said upwardly extending cylindrical wall;
   e) an opposite electrode surrounding said storage electrode and located inside said hollow cup-shaped electrode and extending to said top surface of said bottom; and
   f) an intervening dielectric film located between said opposite electrode and said storage electrode.

2. A fin-shaped capacitor structure as claimed in claim 1, wherein
   said one of the fin films located at a lowest elevation level is separated from said insulating layer; and
   said opposite electrode has a portion located between said one of the fin films located at the lowest elevation and said insulating layer.

3. A dynamic random access memory cell, comprising:
   a) a semiconductor substrate;
   b) a transfer transistor having a gate and a pair of impurity diffused regions formed in the semiconductor substrate;
   c) an insulating film formed over said semiconductor substrate and having a first opening;
   d) a storage electrode formed of a conductive material, said storage electrode connected to one of the pairs of impurity diffused regions through said first opening,
   said storage electrode integrally formed as a hollow cup-shaped electrode, said hollow cup-shaped electrode having a bottom and an upwardly extending cylindrical wall connected to said bottom, said upwardly extending cylindrical wall having a plurality of fin films each located at different elevation levels extending outwardly from an outside surface of the upwardly extending cylindrical wall wherein at least one of said fin films formed with an opening extending therethrough and the upwardly extending cylindrical wall located in and extending upwardly thorough the opening, each fin film having a thickness,
   one of said fin films located at a highest elevation level of said storage electrode being electrically connected to the one of the pair of impurity diffused regions by connecting through said upwardly extending cylindrical wall, another one of said fin films located at a lower elevation level connected to said upwardly extending cylindrical wall, and a top surface of said bottom being located at a lower elevational level than a point where the fin film located at the lowest elevation level extends from said outside surface of said upwardly extending cylindrical wall, and a width of said hollow cup-shaped electrode being greater than twice said thickness of said fin films located at the highest elevation level;
   e) an opposite electrode surrounding said storage electrode; and
   f) a dielectric film intervening between said storage electrode and said opposite electrode.

4. A fin-shaped capacitor structure as claimed in claim 3 wherein
   one of the fin films located at a lowest elevation level of said storage electrode is separated from said insulating layer; and
   said opposite electrode has a portion located between said one of the fin films located at the lowest elevation level and said insulating layer.

5. A dynamic random access memory cell, comprising:
   a semiconductor substrate;

a transfer transistor having a gate and a pair of impurity diffused regions formed in the semiconductor substrate;

an insulating film formed over said semiconductor substrate and having a first opening;

a storage electrode formed of a conductive material, said storage electrode connected to one of the pairs of impurity diffused regions through said first opening, said storage electrode integrally formed as a hollow cup-shaped electrode, said hollow cup-shaped electrode having a bottom and an upwardly extending cylindrical wall connected to said bottom, said hollow cup-shaped electrode having a plurality of fin films extending outwardly from an outside surface of said upwardly extending cylindrical wall at different elevation levels wherein at least one of said fin films formed with an opening extending therethrough and the upwardly extending cylindrical wall located in and extending upwardly thorough the opening, one of said fin films located at a highest elevation level of said storage electrode having a portion which is in electrical contact with said one of the pair of impurity diffused regions through contact with said upwardly extending cylindrical wall, another one of said fin films located at a lower elevation level connected to said upwardly extending cylindrical wall, a top surface of said bottom located at a lower elevation level than a point where said fin film located at the lowest elevation level extends from said outside surface of said upwardly extending cylindrical wall, and said portion of said one of said fin films located at the highest elevation level having a substantially U-shaped cross section; and an opposite electrode surrounding said storage electrode through an intervening dielectric film.

6. A fin-shaped capacitor structure as claimed in claim 5 wherein one of the fin films located at a lowest elevation level of said storage electrode is separated from said insulating layer; and said opposite electrode has a portion located between said one of the fin films located at the lowest elevation level and said insulating layer.

7. A dynamic memory cell comprising:

a transfer gate transistor; and a capacitor having a first electrode, a second electrode, and a dielectric film covering a storage electrode, wherein said storage electrode comprises an integrally formed hollow cup-shaped electrode having a) an upwardly extending cylindrical wall and b) a bottom, at one end of said hollow cup-shaped electrode, which is electrically connected to said transfer gate transistor; and fin portions each extending from an outside surface of the upwardly extending cylindrical wall wherein at least one of said fin films formed with an opening extending therethrough and the upwardly extending cylindrical wall located in and extending upwardly thorough the opening, a top surface of said bottom being located at a lower elevation level than a point where one of said fin films located at a lowest elevation level extends from said outside surface of said upwardly extending cylindrical wall.

8. A fin-shaped capacitor structure as claimed in claim 7, wherein one of the fin portions located at a lowest elevation level of said storage electrode is separated from said transfer gate transistor; and said opposite electrode has a portion located between said one of the fin portions located at the lowest elevation level and said transfer gate transistor through an intervening insulating film.

9. A dynamic memory cell comprising:

a transfer gate transistor; and a capacitor having a first electrode, a second electrode, and a dielectric film covering a storage electrode, wherein said storage electrode comprises an integrally formed hollow cup-shaped electrode having a) an upwardly extending cylindrical wall and b) a bottom, at one end of said hollow cup-shaped electrode, which is electrically connected to said transfer gate transistor; and fin portions each extending from an outside surface of the upwardly extending cylindrical wall, fin films located at a lowest elevation level being separated from said transfer gate transistor by a gap, wherein at least one of said fin films formed with an opening extending therethrough and the upwardly extending cylindrical wall located in and extending upwardly thorough the opening, a top surface of said bottom being located at a lower elevation level than a point where one of said fin films located at a lowest elevation level extends from said outside surface of said upwardly extending cylindrical wall, and a thickness of each fin film being approximately equal to a thickness of said bottom.

10. A dynamic memory cell comprising:

a transfer gate transistor;

a capacitor having a first and second electrodes, and a dielectric film covering a storage electrode, said storage electrode extending over a gate of the transfer gate transistor and electrically connected to said transfer gate transistor, said storage electrode including a plurality of stacked layers, at least one of said layers forming a lateral groove with adjacent stacked layers, said groove being small relative to a length of said at least one layer.

* * * * *